(12) United States Patent
Masuo et al.

(10) Patent No.: US 7,486,113 B2
(45) Date of Patent: Feb. 3, 2009

(54) DECODER CIRCUIT

(75) Inventors: Akira Masuo, Osaka (JP); Norihiko Sumitani, Osaka (JP); Shigeo Houmura, Kyoto (JP)

(73) Assignee: Panasonic Corporation, Osaka (JP)

( * ) Notice: Subject to any disclaimer, the term of this patent is extended or adjusted under 35 U.S.C. 154(b) by 13 days.

(21) Appl. No.: 11/638,370

(22) Filed: Dec. 14, 2006

(65) Prior Publication Data

US 2007/0139230 A1  Jun. 21, 2007

(30) Foreign Application Priority Data

Dec. 15, 2005  (JP) ............................. 2005-362322

(51) Int. Cl.
  *G11C 8/00*  (2006.01)
  *H03K 19/084*  (2006.01)
(52) U.S. Cl. ........................ 326/106; 326/105; 326/108
(58) Field of Classification Search ......... 326/105–106, 326/108; 365/230.06
  See application file for complete search history.

(56) References Cited

U.S. PATENT DOCUMENTS

| | | | |
|---|---|---|---|
| 5,138,579 A | 8/1992 | Tatsumi et al. | |
| 5,936,910 A * | 8/1999 | Hashimoto | ............ 365/230.06 |
| 5,936,911 A | 8/1999 | Inaba | |
| 5,970,018 A * | 10/1999 | Iwata et al. | ............ 365/230.06 |

FOREIGN PATENT DOCUMENTS

JP  8-236718  9/1996

* cited by examiner

*Primary Examiner*—Anh Q Tran
(74) *Attorney, Agent, or Firm*—McDermott Will & Emery LLP

(57) ABSTRACT

The decoder circuit includes: a power supply control circuit for supplying a first voltage; first and second transistors connected in series between the power supply control circuit and a first reference node; and third and fourth transistors connected between a connection node between the first and second transistors and a second reference node. The first transistor receives a first signal at its gate, and the second transistor receives a second signal corresponding to the first signal at its gate. The third transistor receives a third signal at its gate, and the fourth transistor receives a fourth signal corresponding to the third signal at its gate. The potential difference between the first voltage and the first reference node is smaller than the potential difference between the first reference node and the second reference node.

5 Claims, 42 Drawing Sheets

DECODER CIRCUIT

BACKGROUND OF THE INVENTION

1. Field of the Invention

The present invention relates to a decoder circuit, and more particularly to a decoder circuit for driving word lines of a semiconductor memory device.

2. Description of the Related Art

Conventionally, a semiconductor memory device is provided with a decoder circuit (row decoder) for driving word lines. As disclosed in Japanese Laid-Open Patent Publication No. 8-236718, a decoder circuit (row decoder) includes a first decoder (decoder circuit) and a second decoder (word line driver). The first decoder operates according to a first address signal, and the second decoder operates according to an output of the first decoder and a second address signal. The second decoder has a PMOS transistor and an NMOS transistor connected in series between a node for receiving the output of the first decoder and a ground node for receiving a ground voltage. The gates of the PMOS transistor and the NMOS transistor receive the second address signal different from the first address signal input into the first decoder. The voltage generated at a connection node between these transistors is outputted as a word line drive voltage.

Conventionally, to drive the decoder circuit, not only the output of the second decoder but also the output of the first decoder oscillate between the power supply potential Vdd and the ground potential VSS. In this relation, to increase the drive speed of the decoder circuit and reduce the charge amount consumed by the decoder circuit, the peak to peak amplitude of the output of the first decoder should desirably be smaller than the peak to peak amplitude from the power supply potential Vdd to the ground potential VSS.

SUMMARY OF THE INVENTION

An object of the present invention is providing a decoder circuit capable of increasing the processing speed and reducing the charge consumption amount.

According to one aspect of the present invention, the decoder circuit includes a power supply control circuit and first to fourth transistor. The power supply control circuit supplies a first voltage. The first and second transistors are connected in series between the power supply control circuit and a first reference node. The third and fourth transistors are connected between a connection node between the first and second transistors and a second reference node. The first transistor is connected between the power supply control circuit and the second transistor and receives a first signal at its gate. The second transistor is connected between the first transistor and the first reference node and receives a second signal corresponding to the first signal at its gate. The third transistor is connected between the second reference node and the fourth transistor and receives a third signal at its gate. The fourth transistor is connected between the third transistor and the connection node and receives a fourth signal corresponding to the third signal at its gate. The potential difference between the first voltage and the first reference node is smaller than the potential difference between the first reference node and the second reference node.

In the decoder circuit described above, the amplitude of the potential of the connection node (first connection node) between the first and second transistors can be reduced. Hence, the charge amount stored in or released from the first connection node can be reduced. Also, the time required to charge/discharge the first connection node can be shortened. In this way, high-speed operation and low power consumption can be attained.

According to another aspect of the present invention, the decoder circuit includes first to fourth transistors. The first and second transistors are connected in series between a first reference node and a second reference node. The third and fourth transistors are connected in series between a connection node between the first and second transistors and the second reference node. The first transistor is connected between the second reference node and the second transistor and receives a first signal at its gate. The second transistor is connected between the first transistor and the first reference node and receives a second signal corresponding to the first signal at its gate. The third transistor is connected between the second reference node and the fourth transistor and receives a third signal at its gate. The fourth transistor is connected between the third transistor and the connection node and receives a fourth signal corresponding to the third signal at its gate. The first, second and fourth transistors are of the same conductivity type.

In the decoder circuit described above, by allowing the first and second transistors to have the same conductivity type as the fourth transistor, the amplitude of the potential of the connection node between the first and second transistors can be reduced. Hence, the charge amount stored in or released from the connection node can be reduced. Also, the time required to charge/discharge the connection node can be shortened. In this way, high-speed operation and low power consumption can be attained.

According to yet another aspect of the present invention, the decoder circuit includes first to fourth transistors. The first and second transistors are connected in series between a first reference node and a second reference node. The third and fourth transistors are connected between a connection node between the first and second transistors and the second reference node. The first transistor is connected between the second reference node and the second transistor and receives a first signal at its gate. The second transistor is connected between the first transistor and the first reference node and receives a second signal corresponding to the first signal at its gate. The third transistor is connected between the second reference node and the fourth transistor and receives a third signal at its gate. The fourth transistor is connected between the third transistor and the connection node and receives a fourth signal corresponding to the third signal at its gate. After being turned ON, the first transistor is turned OFF before the potential of the connection node reaches the potential of the second reference node.

In the decoder circuit described above, by turning OFF the first transistor before the potential of the connection node between the first and second transistors reaches the potential of the second reference node, the charge amount stored in or released from the connection node can be reduced. Also, the time required to charge/discharge the connection node can be shortened. In this way, high-speed operation and low power consumption can be attained.

According to yet another aspect of the present invention, the decoder circuit includes first, second and third transistors connected in series between a first reference node and a second reference node. The first transistor is connected between the first reference node and the second transistor and receives a first signal at its gate. The second transistor is connected between the first transistor and the third transistor and receives a second signal at its gate. The third transistor is connected between the second transistor and the second reference node and receives a third signal at its gate. The first transistor is of the same conductivity type as the second transistor.

In the decoder circuit described above, charge is shared between the connection node (first connection node) between the first and second transistors and the connection node (second connection node) between the second and third transistors. By this sharing, the potentials of the connection nodes can be adjusted. Also, the amplitude of the potential of the first connection node can be reduced. Hence, the charge amount stored in or released from the connection node can be reduced. Also, the time required to charge/discharge the first connection node can be shortened. In this way, high-speed operation and low power consumption can be attained.

According to yet another aspect of the present invention, the decoder circuit has first to third modes. The third mode is executed during a shift from the first mode to the second mode or a shift from the second mode to the first mode. The decoder circuit includes first to fourth transistors, a switch circuit, a storage node and an equalizer circuit. The first transistor is connected between a first reference node receiving a first potential and a connection node, and receives a first signal at its gate. The second transistor is connected between a second reference node receiving a second potential and the connection node, and receives a second signal corresponding to the first signal at its gate. The third and fourth transistors are connected in series between the connection node and the second reference node. The switch circuit connects the first and second transistors with the connection node if the potential of the connection node is somewhere between the second potential and a predetermined potential, and disconnects the first and second transistors from the connection node if the potential of the connection node is somewhere between the first potential and the predetermined potential. The storage node stores therein charge corresponding to the first or second potential. The equalizer circuit connects or disconnects the connection node with or from the storage node. The predetermined potential is a potential somewhere between the first potential and the second potential. The third transistor is connected between the second reference node and the fourth transistor and receives a third signal at its gate. The fourth transistor is connected between the third transistor and the connection node and receives a fourth signal corresponding to the third signal at its gate. In the first mode, the equalizer circuit is in the disconnecting state, the first transistor is ON while the second transistor is OFF, and charge corresponding to the first potential is stored in the storage node. In the second mode, the equalizer circuit is in the disconnecting state, the first transistor is OFF while the second transistor is ON, and charge corresponding to the second potential is stored in the storage node. In the third mode, the equalizer circuit is in the connecting state.

In the decoder circuit described above, in the first mode, charge corresponding to the second potential is stored in the connection node. In the second mode, charge corresponding to the first potential is stored in the connection node. In the third mode, in which the connection node and the storage node are connected, the potential of the connection node can be made to be a value between the first potential and the second potential. Thus, the amplitude of the potential of the connection node can be reduced. Hence, the charge amount stored in or released from the connection node can be reduced. Also, the time required to charge/discharge the first connection node can be shortened. In this way, high-speed operation and low power consumption can be attained.

DESCRIPTION OF THE PREFERRED EMBODIMENTS

Figure 1:
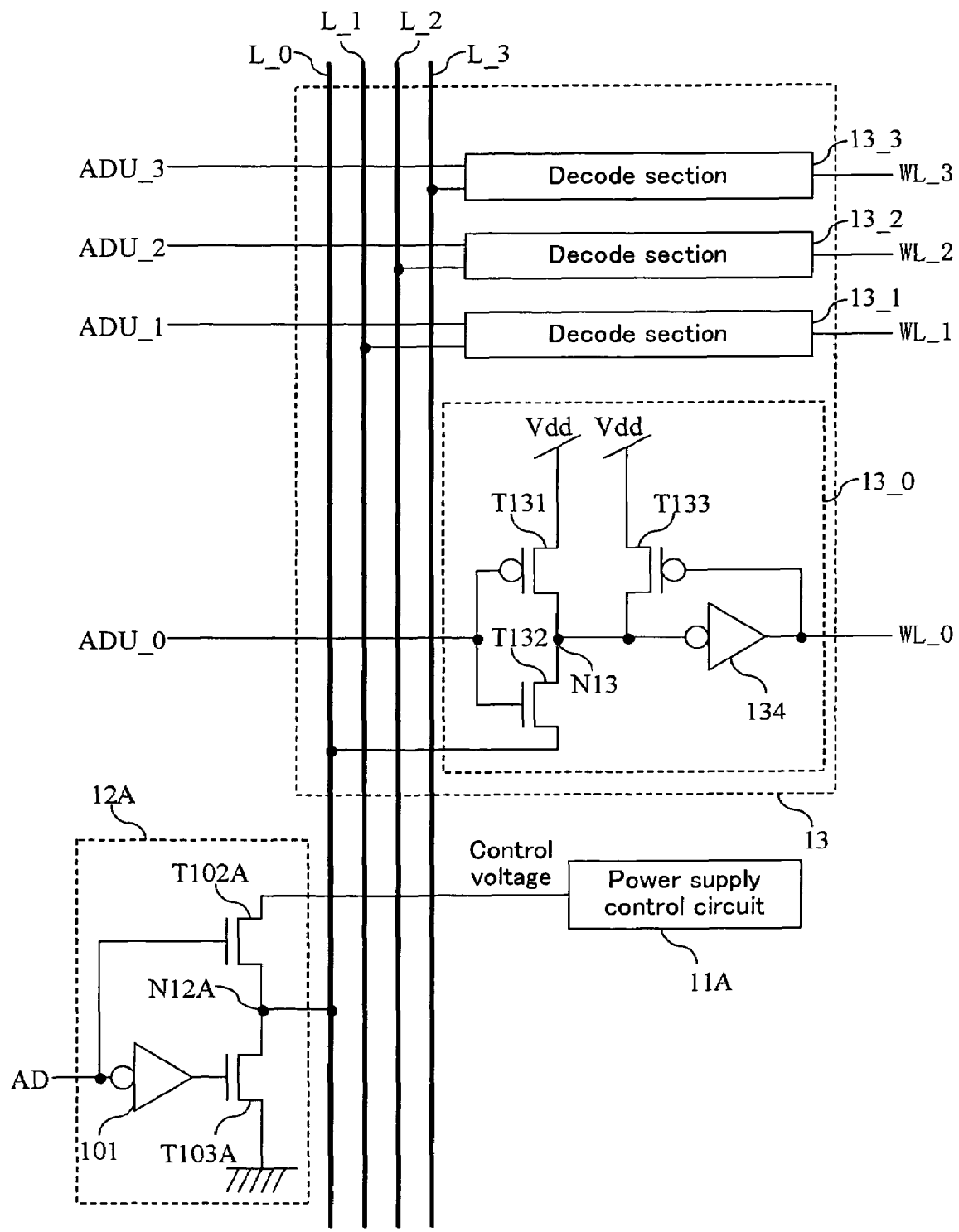
FIG. 1 is a circuit diagram showing a configuration of a decoder circuit of Embodiment 1 of the present invention.

Hereinafter, preferred embodiments of the present invention will be described with reference to the accompanying drawings. Note that like components are denoted by the same reference numerals throughout the drawings, and the description thereof is not repeated.

Embodiment 1

<Configuration>

FIG. 1 shows a configuration of a decoder circuit of Embodiment 1 of the present invention. The decoder circuit includes a power supply control circuit 11A, a predecoder 12A and a row decoder 13. The decoder circuit outputs drive signals WL_0, WL_1, WL_2 and WL_3 according to external address signals ADU_0; ADU_1, ADU_2 and ADU_3 and an external address signal AD. For example, the address signals ADU_0 to ADU_3 represent a higher-bit address, and the address signal AD represents a lower-bit address. The drive signals WL_0 to WL_3 are used as signals for driving word lines of a memory array, for example.

The power supply control circuit 11A outputs a control voltage of which value "Vdd1" is lower than the potential "Vdd" of a power supply node.

The predecoder 12, which is connected to a line L_0 and operates according to the external address signal AD, includes an inverter 101, a transistor T102A and a transistor T103A. The inverter 101 inverts the address signal AD and outputs the inverted signal. The transistors T102A and T103A are connected in series between the power supply control circuit 11A and a ground node: the transistor T102A is connected between the power supply control circuit 11A and the transistor T103A and receives the address signal AD at its gate, and the transistor T103A is connected between the transistor T102A and the ground node and receives the output of the inverter 101 at its gate. A connection node N12A between the transistors T102A and T103A is connected to the line L_0.

The row decoder 13 includes decode sections 13_0, 13_1, 13_2 and 13_3 of the number corresponding to the number of lines (four in the illustrated example). The decode sections 13_0 to 13_3 are respectively connected to lines L_0 to L_3, and output drive signals WL_0 to WL_3 according to the external address signals ADU_0 to ADU_3. Since the decode sections 13_0 to 13_3 have substantially the same internal configuration, the decode section 13_0 will be described herein representatively.

The decode section 13_0 includes transistors T131, T132 and T133 and an inverter 134. The transistors T131 and T132 are connected in series between a power supply node and the line L_0 that corresponds to the decode section 13_0: the transistor T131 is connected between the power supply node and the transistor T132 and receives the external address signal ADU_0 at its gate, and the transistor T132 is connected between the transistor 131 and the line L_0 and receives the external address signal ADU_0 at its gate. The transistor T133 and the inverter 134 are provided to amplify the voltage generated at a connection node N13 between the transistors T131 and T132 and output the amplified voltage as the drive signal WL_0.

<Operation>

The operation of the decoder circuit of FIG. 1 will be described. Note that in the following description, no consideration is given to the threshold voltages of the transistors.

[Decode Section]

When the address signal ADU_0 is in "L" level, the transistor T131 is ON while the transistor T132 is OFF The potential of the connection node N13 is therefore equal to the potential "Vdd" of the power supply node. On the contrary, when the address signal ADU_0 is in an "H" level, the transistor T131 is OFF while the transistor T132 is ON. The potential of the connection node N13 is therefore equal to the potential of the connection node N12A.

[Predecoder]

Figure 2:
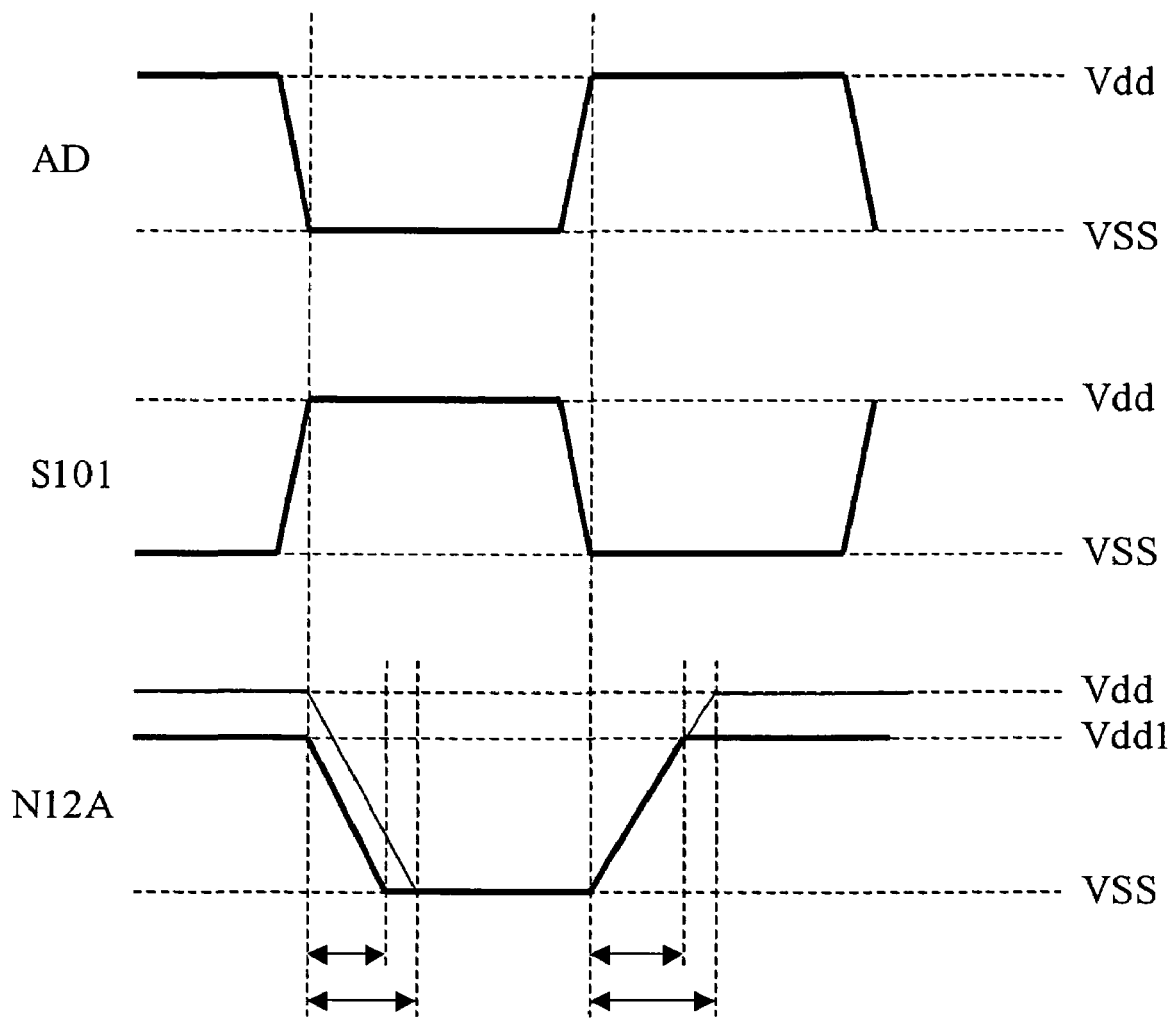
FIG. 2 is a timing chart for illustrating the operation of the decoder circuit of FIG. 1.

As shown in FIG. 2, when the address signal AD is in "H" level, an output S101 of the inverter 101 is in "L" level. In this state, therefore, the transistor T102A is ON while the transistor T103A is OFF. The potential of the connection node N12A is therefore equal to the voltage value "Vdd1" of the control voltage from the power supply control circuit 11. During this time, the potential of the connection node N13 is "Vdd1", which is higher than the potential "VSS" of the ground node, if the address signal ADU_0 is in "H" level.

When the address signal AD is in "L" level, the output S101 of the inverter 101 is in "H" level. In this state, therefore, the transistor T102A is OFF while the transistor T103A is ON. The potential of the connection node N12A is therefore equal to the potential "VSS" of the ground node. During this time, the potential of the connection node N13 is "VSS", the potential of the ground node, if the address signal ADU_0 is in "H" level.

Assume a case that the transistor T102A is connected between the power supply node and the transistor T103 (case 1). In this embodiment, compared with case 1, the charge amount stored in the connection node N12A is small, and this shortens the discharge time and the charge time.

<Effect>

As described above, by setting the voltage supplied to one terminal of the transistor T102A to be lower than the potential "Vdd" of the power supply node, the amplitude of the potential of the connection node N12A can be reduced. Hence, the charge amount stored in the connection node N12A can be reduced, and also the time required to charge/discharge the connection node N12A can be shortened. In this way, high-speed operation and low power consumption can be attained.

Although this embodiment was described taking the case of connecting the predecoder to the line L_0 as an example, one predecoder may also be connected to each of the other lines L_1, L_2 and L_3. In this case, also, substantially the same effect can be obtained for each line.

Although this embodiment shown in FIG. 1 includes one decoder circuit, it may have two or more decoder circuits. That is, although one decode section is connected to one line in this embodiment, two or more decode sections may be connected to one line.

Although the transistors T102A and T132 are n-type transistors in FIG. 1, they may be p-type transistors.

Embodiment 2

<Configuration>

Figure 3:
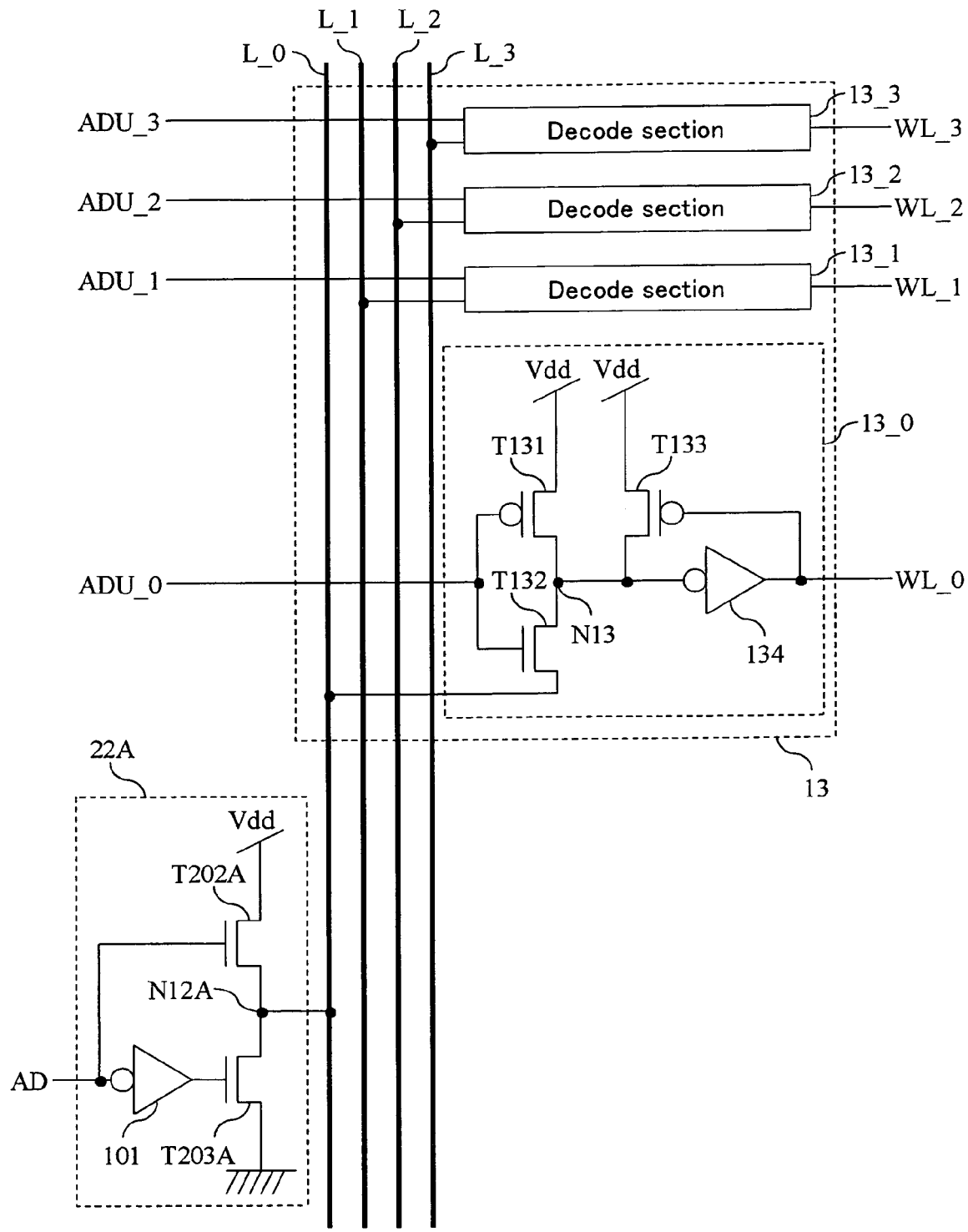
FIG. 3 is a circuit diagram showing a configuration of a decoder circuit of Embodiment 2 of the present invention.

FIG. 3 shows a configuration of a decoder circuit of Embodiment 2 of the present invention. This circuit is the same in configuration as the decoder circuit of FIG. 1 except that a predecoder 22A is provided in place of the power supply control circuit 11A and the predecoder 12A shown in FIG. 1. The predecoder 22A is the same in configuration as the predecoder in FIG. 1, except that transistors T202A and T203A are provided in place of the transistors T102A and T103A shown in FIG. 1. The transistors T202A and T203A are of the same conductivity type as the transistor T132. For example, when the transistor T132 is of n-type, the transistors T202A and T203A are also of n-type.

<Operation>

The operation of the predecoder 22A shown in FIG. 3 will be described. Note that in the following description, the threshold voltage of the transistor T202A is assumed to be "Vt21" and no consideration is given to the threshold voltages of the transistors T203A and T132.

Figure 4:
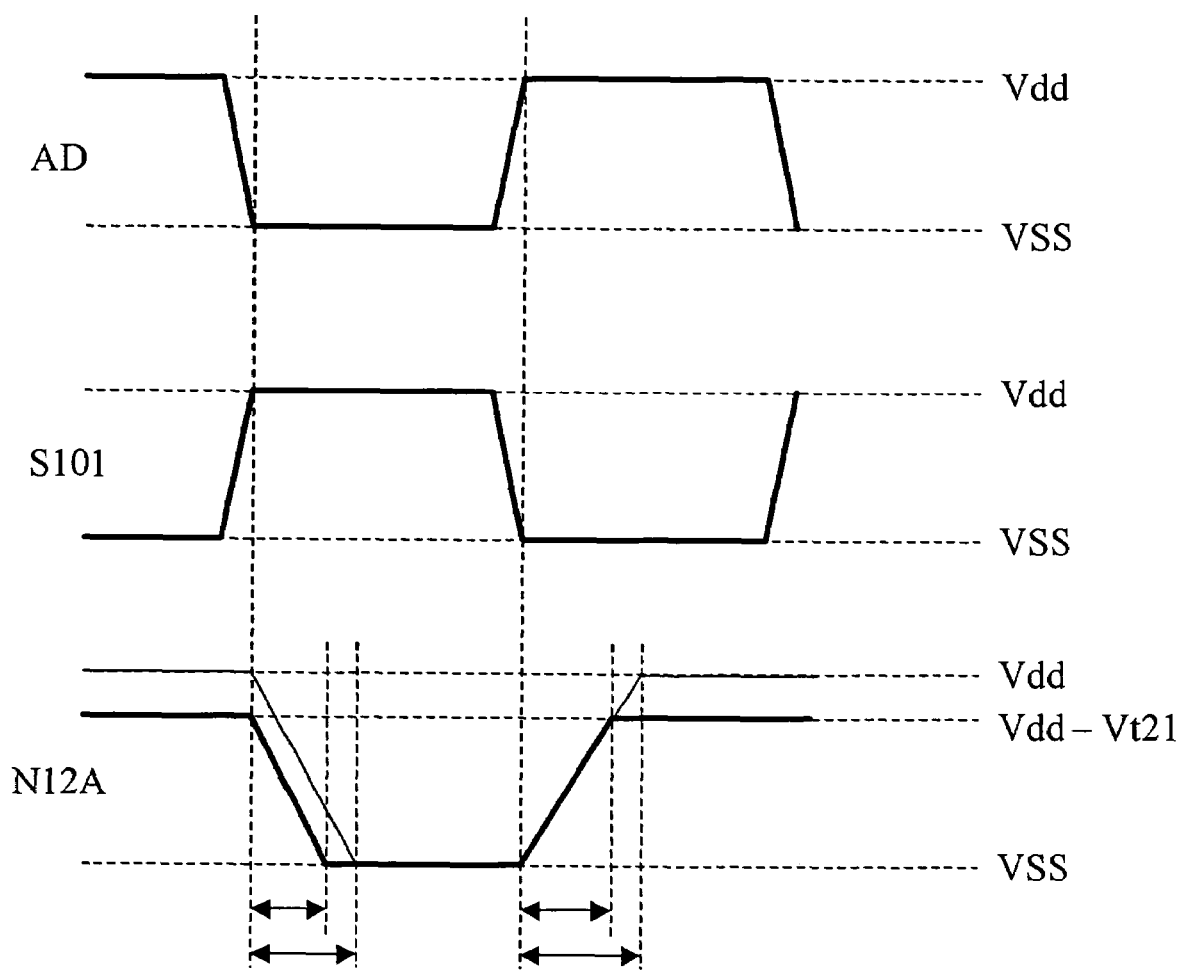
FIG. 4 is a timing chart for illustrating the operation of the decoder circuit of FIG. 3.

As shown in FIG. 4, when the address signal AD is in "H" level, the output S101 of the inverter 101 is in "L" level. In this state, therefore, the transistor T202A is ON while the transistor T203A is OFF. The potential of the connection node N12A is therefore a value obtained by subtracting the threshold voltage of the transistor T202A from the potential of the power supply node, "Vdd–Vt21". During this time, the potential of the connection node N13 is "Vdd–Vt21", which is higher than the potential "VSS" of the ground node, if the address signal ADU_0 is in "H" level.

When the address signal AD is in "L" level, the output S101 of the inverter 101 is in "H" level. In this state, therefore, the transistor T202A is OFF while the transistor T203A is ON. The potential of the connection node N12A is therefore equal to the potential "VSS" of the ground node. During this time, the potential of the connection node N13 is "VSS", the potential of the ground node, if the address signal ADU_0 is in "H" level.

Assume a case that the transistor T132 and the transistor T203A are of the same conductivity type while the transistor T132 and the transistor T202A are of different conductivity types (case 2). In this embodiment, compared with case 2, the charge amount stored in the connection node N12A is small, and this shortens the discharge time and the charge time.

<Effect>

As described above, by setting the transistors T202A and T203A of the predecoder to have the same conductivity type as the transistor T132 of the decode section, the amplitude of the potential of the connection node N12A can be reduced. Hence, the charge amount stored in the connection node N12A can be reduced, and also the time required to charge/discharge the connection node N12A can be shortened. In this way, high-speed operation and low power consumption can be attained.

[Alteration 1]

Figure 5:
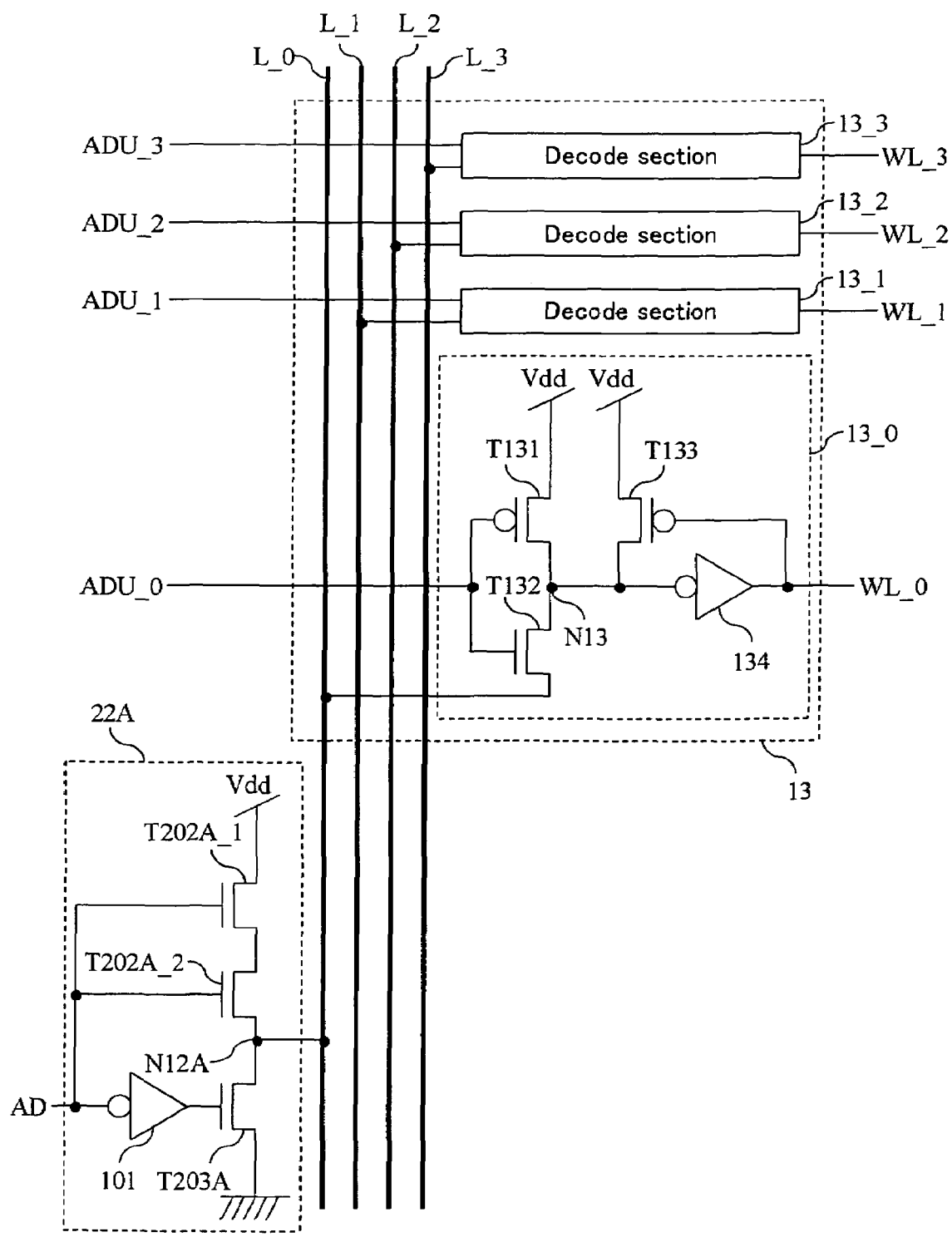
FIG. 5 is a circuit diagram showing a configuration of an alteration to the decoder circuit of FIG. 3.

As shown in FIG. 5, the predecoder 22A may include transistors T202A_1 and T202A_2 in place of the transistor T202A shown in FIG. 3. In this case, also, substantially the same effect can be obtained. The transistors T202A_1 and T202A_2 are connected in series between the power supply node and the connection node N12A and receive the address signal AD at their gates. The conductivity type of the transistors T202A_1 and T202A_2 is the same as that of the transistor T132.

Assuming herein that the threshold voltages of the transistors T202A_1 and T202A_2 are respectively "Vt211" and "Vt212" and the voltage drop caused by a back bias effect is "β", the potential of the connection node N12A will be "Vdd–(Vt211+Vt212+β)" when the address signal AD is in "H" level. That is, the charged potential (potential of the charged connection node N12A) can be made lower than the potential "Vdd" of the power supply node.

[Alteration 2]

Figure 6:
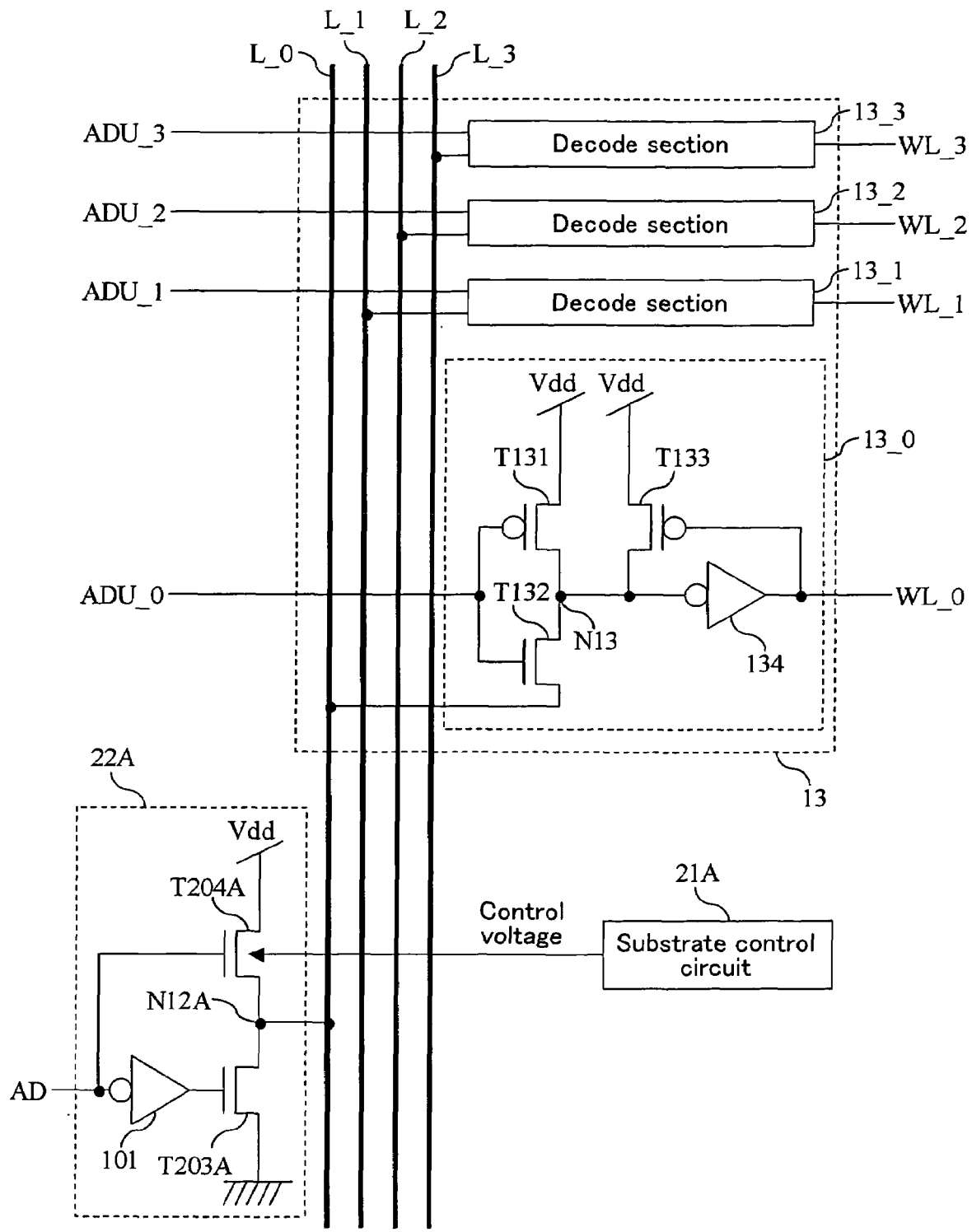
FIG. 6 is a circuit diagram showing a configuration of another alteration to the decoder circuit of FIG. 3.

As shown in FIG. 6, the decoder circuit may further be provided with a substrate control circuit 21A that outputs a control voltage. In this case, the predecoder 22A includes a transistor T204A in place of the transistor T202A shown in FIG. 3. The transistor T204A receives the control voltage from the substrate control circuit 21A at the substrate, and has the same conductivity type as the transistor T132. Assuming herein that the threshold voltage of the transistor T204A is "Vt22" when the control voltage is equal to the potential "VSS" of the ground node, the threshold voltage of the transistor T204A will be "Vt22α" that is higher than "Vt22" when the control voltage is a reverse bias (–Vbb).

Figure 7:
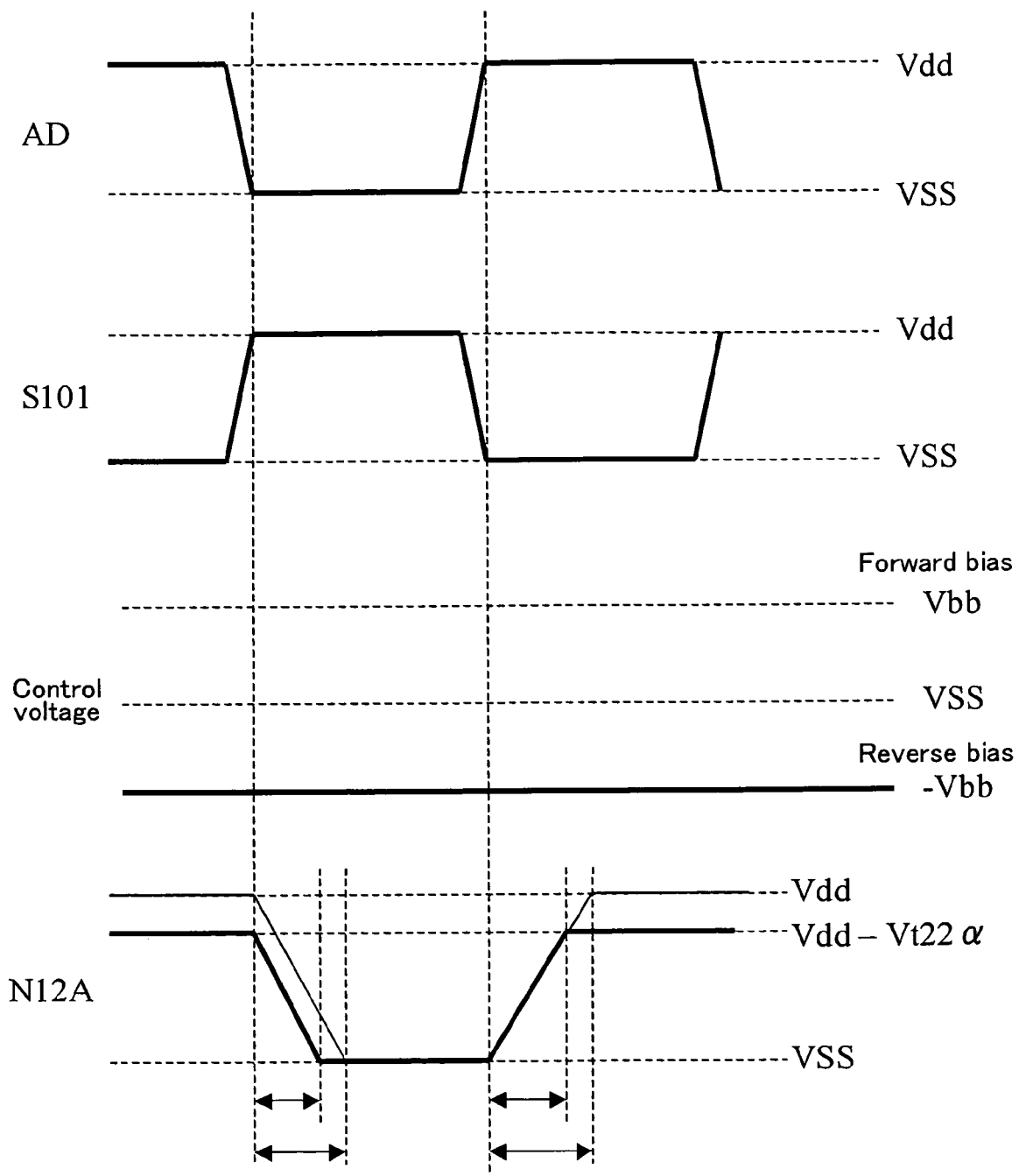
FIG. 7 is a timing chart for illustrating the operation of the decoder circuit of FIG. 6.

As shown in FIG. 7, the transistor T204A receives the reverse bias (–Vbb) from the substrate control circuit 21A at the substrate. When the address signal AD is in "H" level, the potential of the connection node N12A is a value obtained by subtracting the threshold voltage of the transistor T204A from the potential of the power supply node, "Vdd–Vt22α". That is, the charged voltage can be made lower than the potential "Vdd" of the power supply node.

[Alteration 3]

Figure 8:
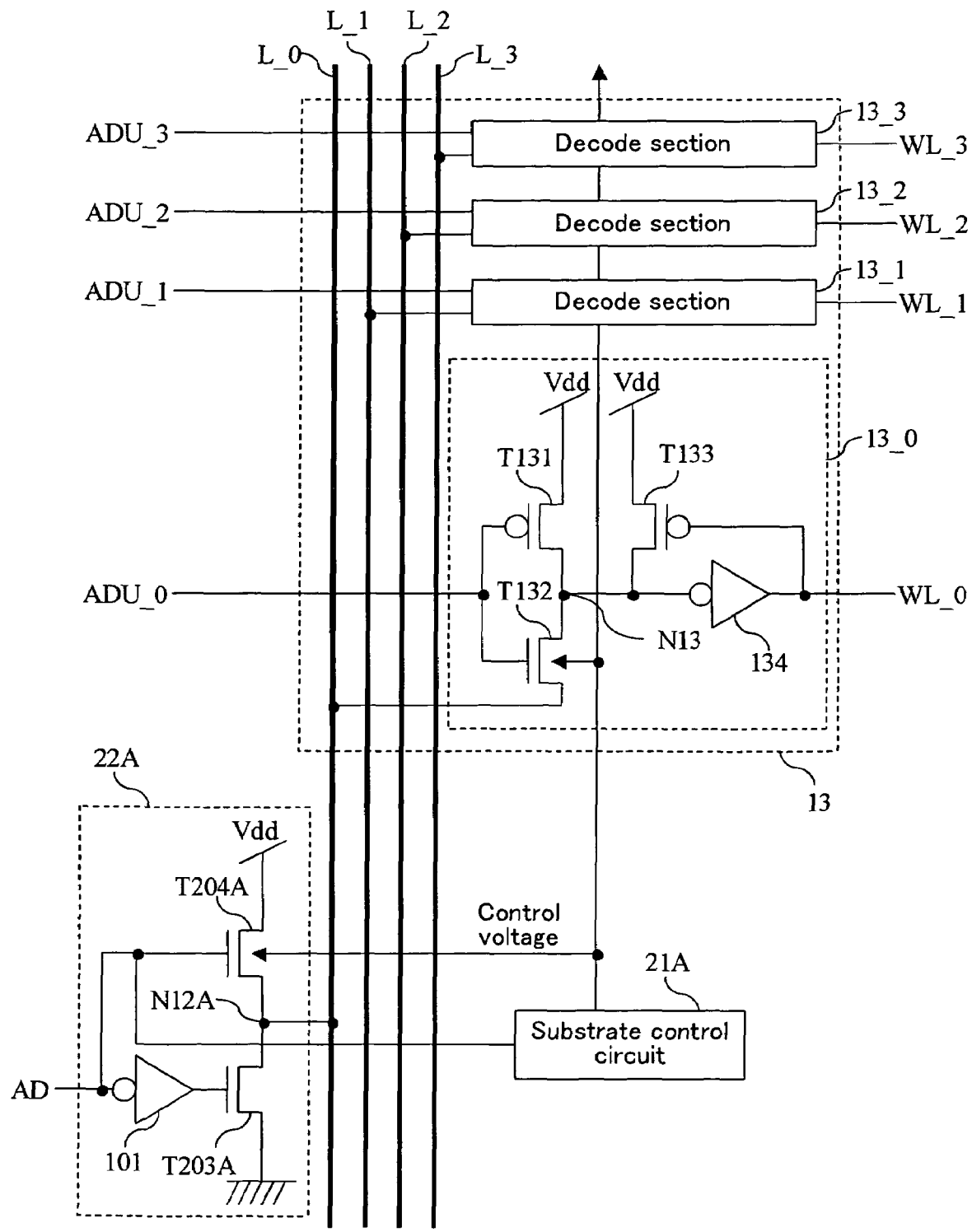
FIG. 8 is a circuit diagram showing a configuration of yet another alteration to the decoder circuit of FIG. 3.

As shown in FIG. 8, the substrate control circuit 21A may output the control voltage according to the address signal AD. The transistor T204A of the predecoder 22A and the transistor T132 of the decode section 13_0 receive the control voltage from the substrate control circuit 21A at the substrate. The threshold voltages of the transistors T204A and T132 will be lower when the control voltage is a forward bias (Vdd) than when it is equal to the potential "VSS" of the ground node.

Figure 9:
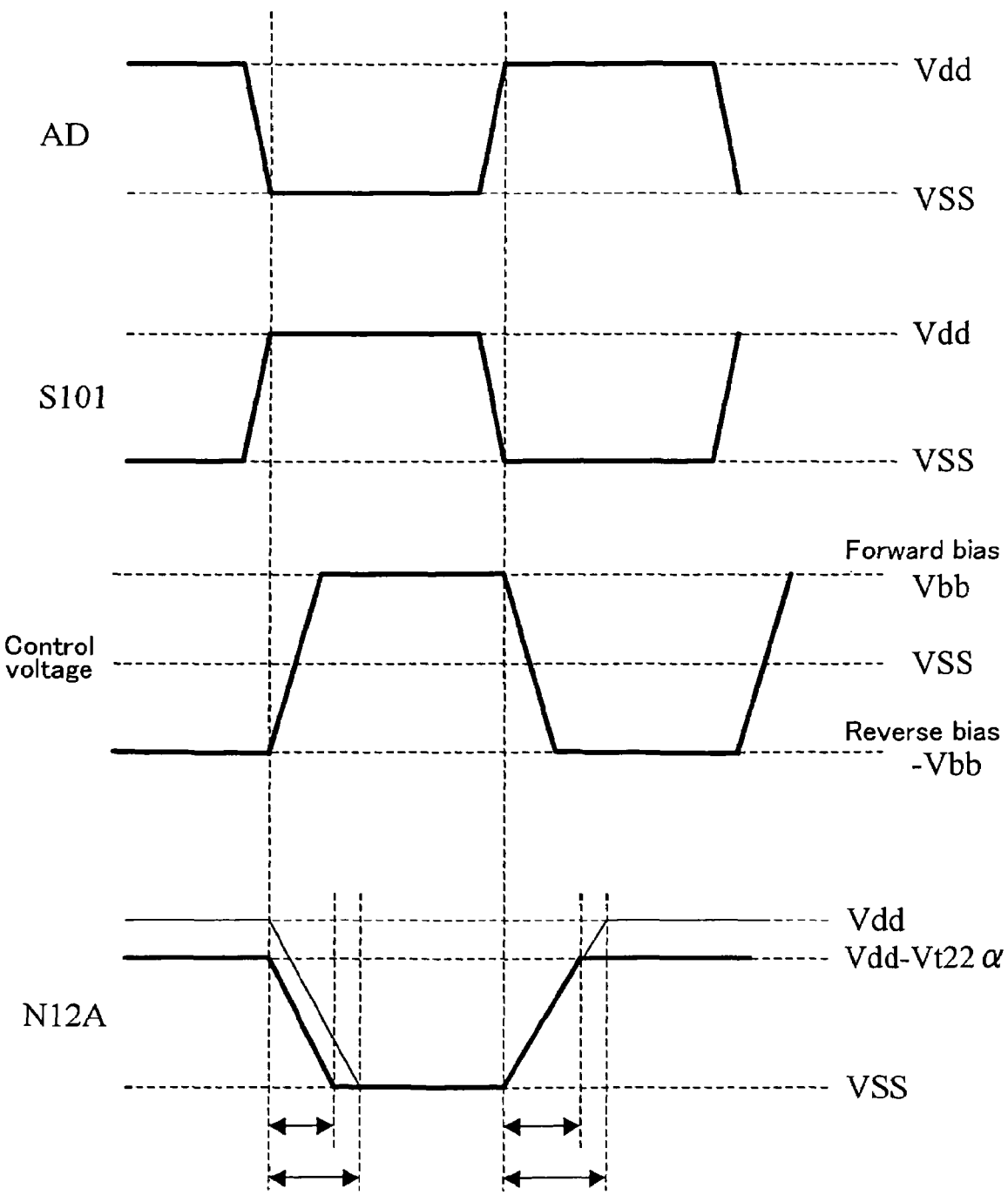
FIG. 9 is a timing chart for illustrating the operation of the decoder circuit of FIG. 8.

As shown in FIG. 9, when the address signal AD is in "H" level, the substrate control circuit 21A outputs the reverse-bias control voltage (–Vbb). With this control voltage, the threshold voltage of the transistor T204A is "Vt22α" that is higher than "Vt22". Therefore, the potential of the connection node N12A won't be higher than "Vdd–Vt22α". Also, since the charging speed is lower as the threshold voltage is higher, the charge amount stored in the connection node N12A can be reduced. When the address signal AD is in "L" level, the substrate control circuit 21A outputs the forward-bias control voltage (Vbb). With this control voltage, the threshold voltage of the transistor T132 decreases, and thus the time required for discharging the connection node N12A can be shortened.

Embodiment 3

<Configuration>

Figure 10:
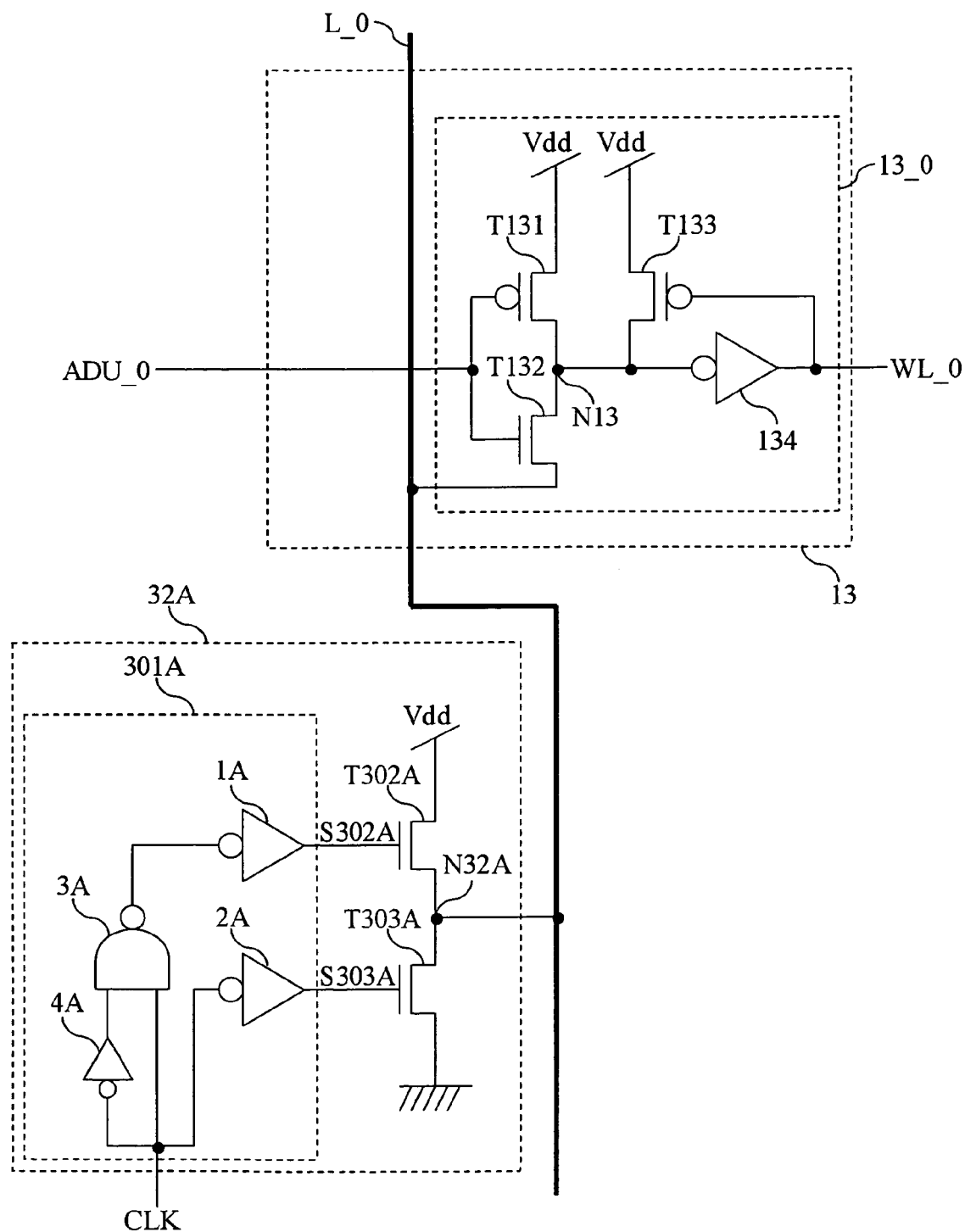
FIG. 10 is a circuit diagram showing a configuration of a decoder circuit of Embodiment 3 of the present invention.

FIG. 10 shows a configuration of a decoder circuit of Embodiment 3 of the present invention. The decoder circuit is the same in configuration as that of FIG. 3, except that a predecoder 32A is provided in place of the predecoder 22A shown in FIG. 3. Note that in FIG. 10, only the predecoder 32A, the line L_0 and the decode section 13_0 of the row decoder 13 are shown. This decoder circuit outputs a drive signal WL_0 according to an external address signal ADU_0 and a clock CLK. The clock CLK is a source signal, for example. The predecoder 32A includes a timing control circuit 301A and transistors T302A and T303A. The timing control circuit 301A is composed of a plurality of logic elements (inverters 1A and 2A, a NAND circuit 3A and a delay circuit 4A in the illustrated example). The timing control circuit 301A outputs control signals S302A and S303A according to the external clock CLK. The transistors T302A and T303A are connected in series between the power supply node and the ground node: the transistor T302A is connected between the power supply node and the transistor T303A and receives the output of the inverter 1A (control signal S302A) at its gate, and the transistor T303A is connected between the transistor T302A and the ground node and receives the output of the inverter 2A (control signal S303A) at its gate. A connection node N32A between the transistors T302A and T303A is connected to the line L_0. The output of the predecoder 32A is used as an enable signal, for example.

<Operation>

Figure 11:
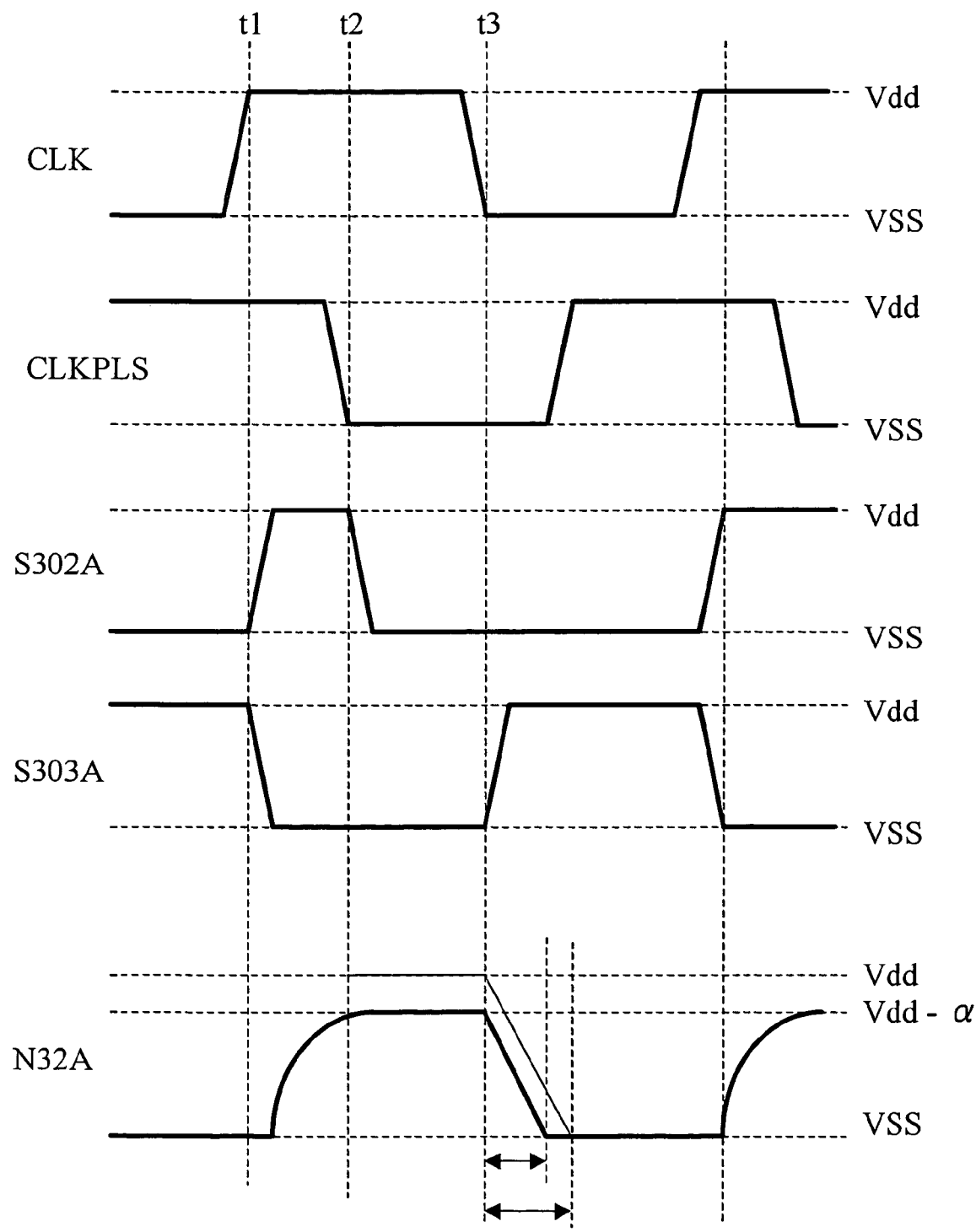
FIG. 11 is a timing chart for illustrating the operation of the decoder circuit of FIG. 10.

The operation of the decoder circuit of FIG. 10 will be described with reference to FIG. 11. Note that in the following description, no consideration is given to the threshold voltages of the transistors.

At time t1, the clock CLK shifts from "L" level to "H" level. With this level shift, the control signal S302A shifts from "L" level to "H" level, turning the transistor T302A from OFF to ON. The control signal S303A shifts from "H" level to "L" level, turning the transistor T303A from ON to OFF. Hence, the potential of the connection node N32A rises from the potential "VSS" of the ground node.

At time t2, the output CLKPLS of the delay circuit 4A shifts from "H" level to "L" level. With this shift, the control signal S302A shifts from "H" level to "L" level, turning the transistor T302A from ON to OFF. The control signal S303A remains at "L" level, keeping the transistor T303A in the OFF state. Hence, since the connection node N32A is no more charged, the potential of the connection node N32A stays at "Vdd−α" that is lower than the potential "Vdd" of the power supply node.

At time t3, the clock CLK shifts from "H" level to "L" level. With this shift, the control signal S303A shifts from "L" level to "H" level, turning the transistor T303A from OFF to ON. The control signal S302A remains at "L" level, keeping the transistor T302A in the OFF state. Hence, the potential of the connection node N32A drops toward the potential "VSS" of the ground node.

<Effect>

As described above, by turning OFF the transistor T302A before the potential of the connection node N32A reaches the potential "Vdd" of the power supply node, the amplitude of the potential of the connection node N32A can be reduced. Therefore, the charge amount stored in the connection node N32A can be reduced, and also the time required to charge/discharge the connection node N32A can be shortened. In this way, high-speed operation and low power consumption can be attained.

Note that although the transistors T302A and T132 are of n-type in FIG. 10, they may be of p-type.

Embodiment 4

<Configuration>

Figure 12:
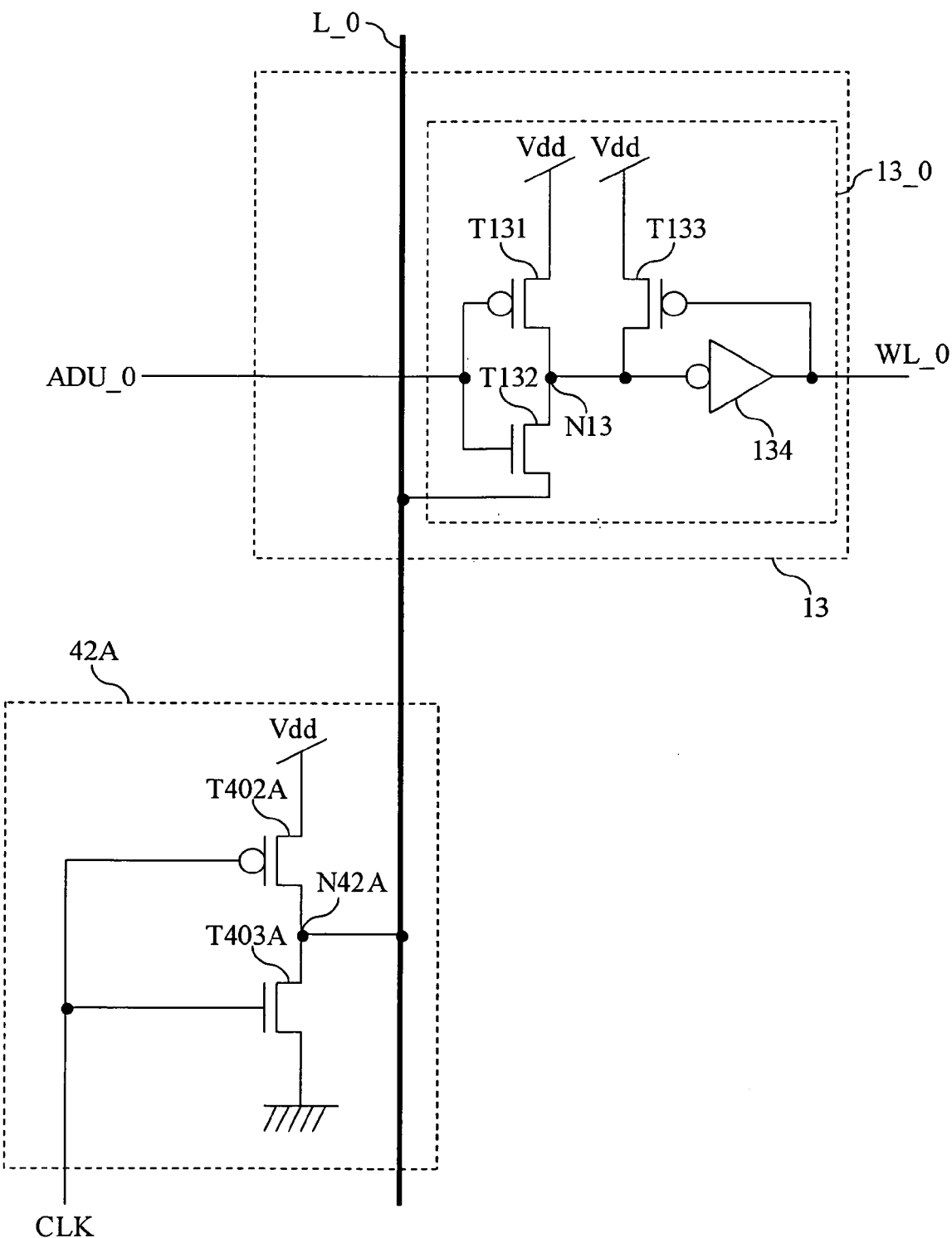
FIG. 12 is a circuit diagram showing a configuration of a decoder circuit of Embodiment 4 of the present invention.

FIG. 12 shows a configuration of a decoder circuit of Embodiment 4 of the present invention. This circuit is the same in configuration as the decoder circuit of FIG. 10, except that a predecoder 42A is provided in place of the predecoder 32A shown in FIG. 10. The predecoder 42A includes transistors T402A and T403A, which are connected in series between the power supply node and the ground node: the transistor T402A is connected between the power supply node and the transistor T403A and receives the external clock CLK at its gate, and the transistor T403A is connected between the transistor T402A and the ground node and receives the external clock CLK at its gate. A connection node N42A between the transistors T402A and T403A is connected to the line L_0.

The W/L ratio of the transistor T402A is equal to or less than twice the W/L ratio of the transistor T403A. For example, assuming that the gate lengths of the transistors T402A and T403A are equal to each other, the gate width of the transistor T402A is equal to or less than twice the gate width of the transistor T403A. Alternatively, assuming that the gate widths of the transistors T402A and T403A are equal to each other, the gate length of the transistor T402A is equal to or more than a half of the gate length of the transistor T403A. With the configuration described above, the current amount flowing through the transistor T402A per unit time can be made smaller than the current amount flowing through the transistor T403A per unit time. In other words, the current capability of the transistor T402A is weaker than that of the transistor T403A. The current capability of the transistor T403A may be of a conventional level.

<Operation>

Figure 13:
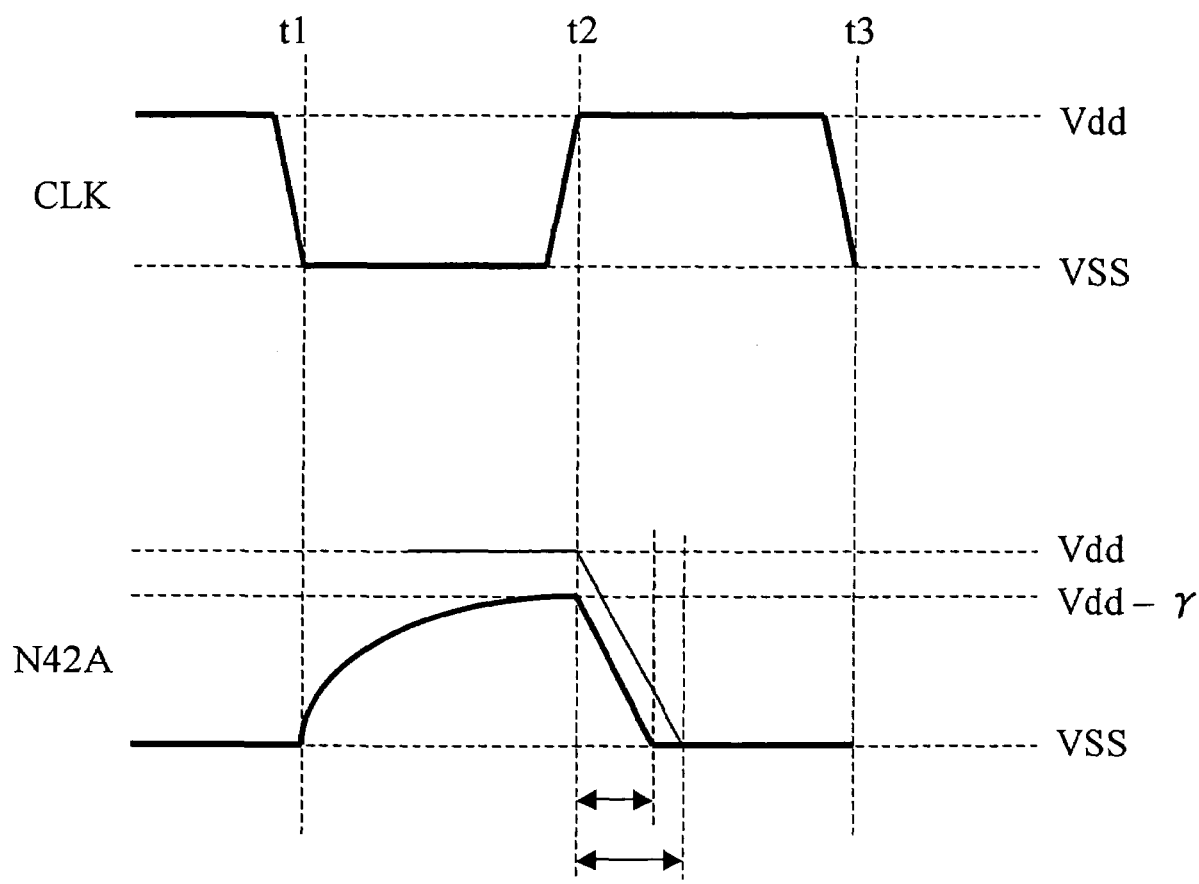
FIG. 13 is a timing chart for illustrating the operation of the decoder circuit of FIG. 12.

The operation of the decoder circuit of FIG. 12 will be described with reference to FIG. 13.

At time t1, the clock CLK shifts from "H" level to "L" level. With this level shift, the transistor T402A is turned from OFF to ON while the transistor T403A is turned from ON to OFF. Therefore, the potential of the connection node N42A rises from the potential "VSS" of the ground node.

At time t2, the clock CLK shifts from "L" level to "H" level. With this level shift, the transistor T402A is turned from ON to OFF. At this time, since the current capability of the transistor T402A is comparatively weak, the potential of the connection node N42A has not reached the potential Vdd of the power supply node (but is "Vdd−γ"). Meanwhile, the transistor T403A is turned from OFF to ON. Therefore, potential of the connection node N42A drops from "Vdd−γ".

At time t3, the clock CLK shifts from "H" level to "L" level. With this level shift, the transistor T402A is turned from OFF to ON while the transistor T403A is turned from ON to OFF. At this time, since the current capability of the transistor T403A is comparatively strong, the potential of the connection node N42A has reached the potential VSS of the ground node.

<Effect>

As described above, by turning OFF the transistor T402A before the potential of the connection node N42A reaches the potential "Vdd" of the power supply node, the amplitude of the potential of the connection node N42A can be reduced. Therefore, the charge amount stored in the connection node N42A can be reduced, and also the time required to charge/discharge the connection node N42A can be shortened. In this way, high-speed operation and low power consumption can be attained.

Embodiment 5

<Configuration>

Figure 14:
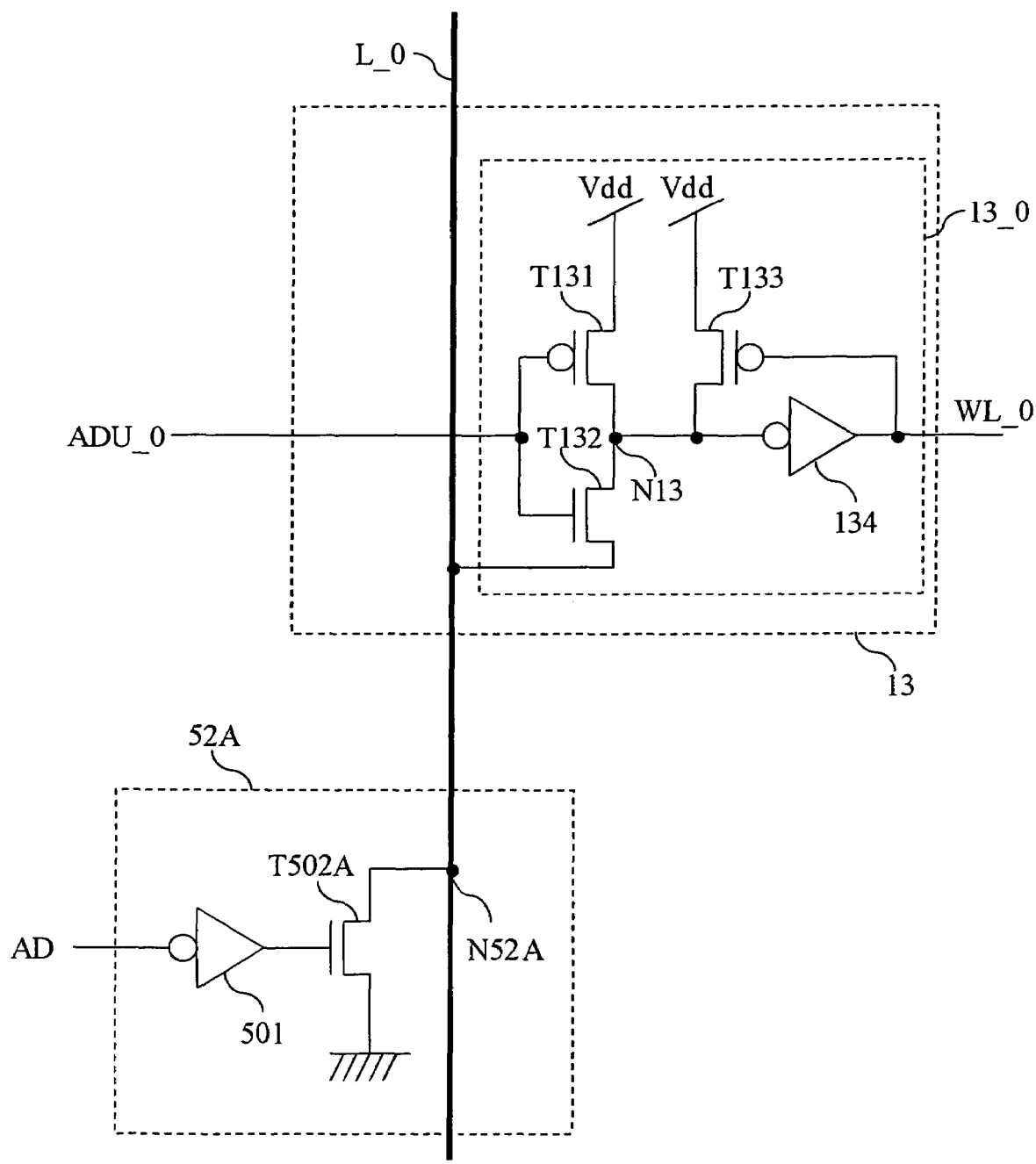
FIG. 14 is a circuit diagram showing a configuration of a decoder circuit of Embodiment 5 of the present invention.

FIG. 14 shows a configuration of a decoder circuit of Embodiment 5 of the present invention. This circuit is the same in configuration as the decoder circuit of FIG. 10, except that a predecoder 52A is provided in place of the predecoder 32A shown in FIG. 10. The predecoder 52A includes an inverter 501 and a transistor T502A. The transistor T502A is connected between the line L_0 and the ground node and receives the output of the inverter 501 at its gate. The transistor T502A has the same conductivity type as the transistor T132.

<Operation>

Figure 15:
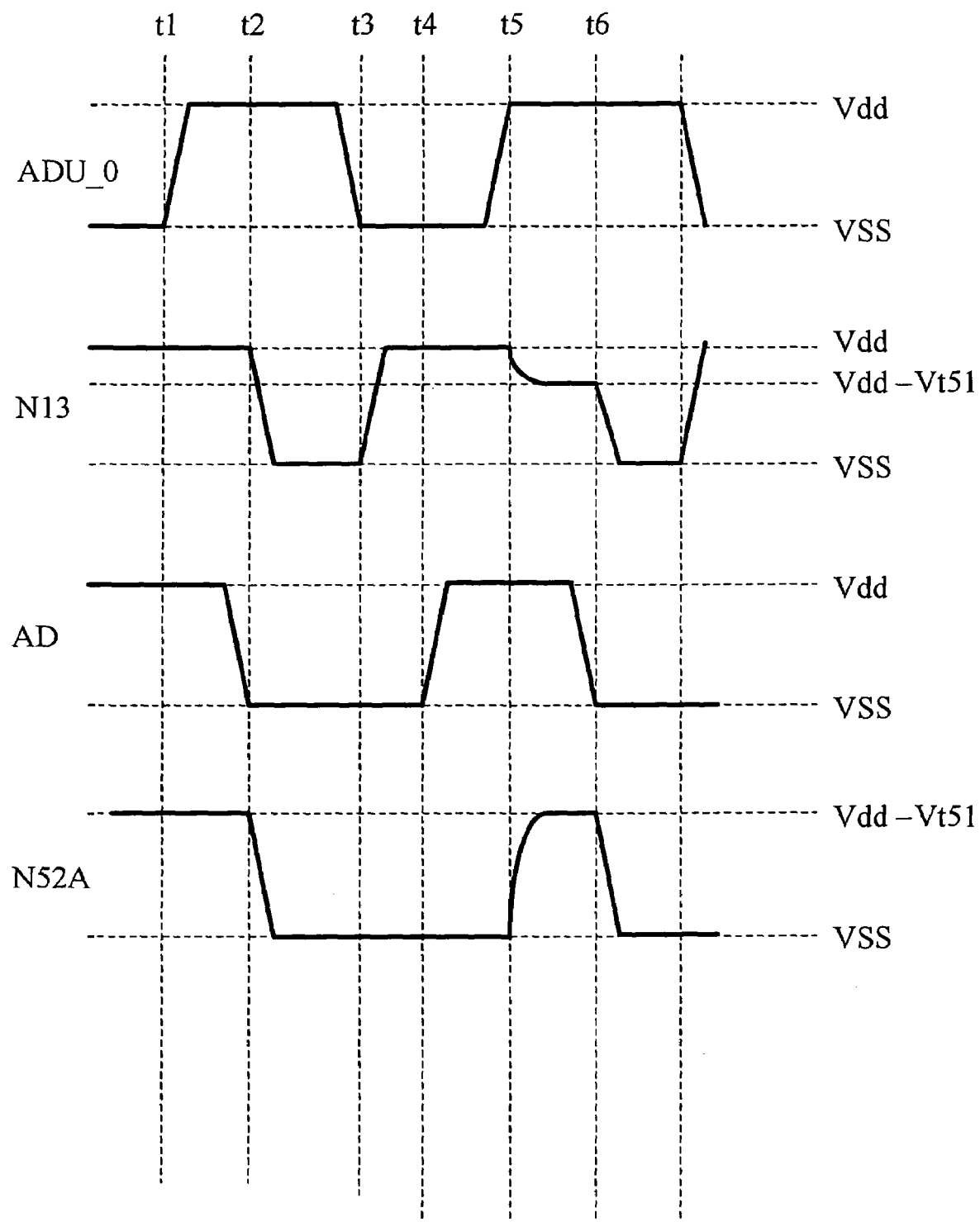
FIG. 15 is a timing chart for illustrating the operation of the decoder circuit of FIG. 14.

The operation of the decoder circuit of FIG. 14 will be described with reference to FIG. 15. Note that in the following description, the threshold voltage of the transistor T502A is assumed to be "Vt51".

At time t1, the transistor T131 is turned from ON to OFF while the transistor T132 is turned from OFF to ON. The connection node N13 is therefore disconnected from the power supply node and connected to the line L_0 (to the connection node N52A). At this time, the potential of the connection node N52A is "Vdd−Vt51". Therefore, the potential of the connection node N13 is kept at the potential "Vdd" of the power supply node.

At time t2, the transistor T502A is turned from OFF to ON. The connection node N52A is therefore connected to the ground node, causing the potential of the connection node N52A to drop from "Vdd−Vt51" toward the potential "VSS" of the ground node. Hence, the potential of the connection node N13 also drops from "Vdd" toward the potential "VSS" of the ground node.

At time t3, the transistor T131 is turned from OFF to ON while the transistor T132 is turned from ON to OFF. The connection node N13 is therefore disconnected from the connection node N52A and connected to the power supply node. Hence, the potential of the connection node N13 rises from the potential "VSS" of the ground node toward the potential "Vdd" of the power supply node.

At time t4, the transistor T502A is turned from ON to OFF, disconnecting the connection node N52A from the ground node.

At time t5, the transistor T131 is turned from ON to OFF while the transistor T132 is turned from OFF to ON. The connection node N13 is therefore disconnected from the power supply node and connected to the connection node N52A. At this time, the potential of the connection node N13 is "Vdd" and the potential of the connection node N52A is "VSS". Therefore, the charge stored in the connection node N13 is shared with the connection node N52A, so that the potentials of both the connection nodes N13 and N52A become "Vdd−Vt51".

At time t6, the transistor T502A is turned from OFF to ON. The connection node N52A is therefore connected to the ground node, causing the potential of the connection node N52A to drop from "Vdd−Vt51" toward the potential "VSS" of the ground node. Also, the potential of the connection node N13 drops from "Vdd−Vt51" toward the potential "VSS" of the ground node.

Note that the potential of the shared charge is not limited to "Vdd−Vt51".

<Effect>

As described above, by sharing the charge stored in the connection node N13 with the connection node N52A, the potential of the connection node N13 can be adjusted. Also, the potential of the connection node N52A can be kept from exceeding "Vdd−Vt51". Therefore, the amplitude of the potential of the connection node N52A can be reduced, and thus the charge amount stored in the connection node N52A can be reduced. Also, the time required to charge/discharge the connection node N52A can be shortened. In this way, high-speed operation and low power consumption can be attained.

Embodiment 6

<Configuration>

Figure 16:
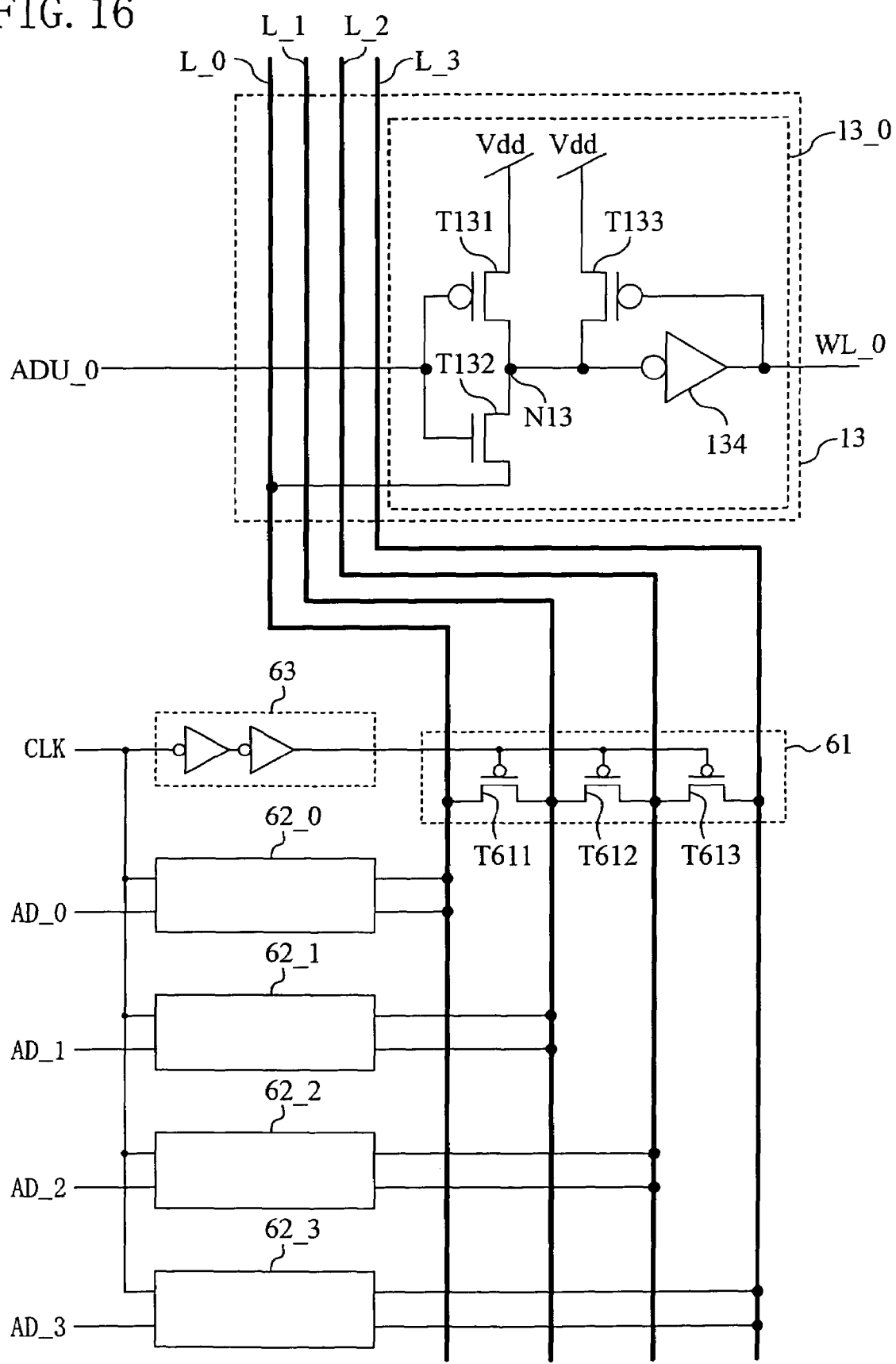
FIG. 16 is a circuit diagram showing a configuration of a decoder circuit of Embodiment 6 of the present invention.

FIG. 16 shows a configuration of a decoder circuit of Embodiment 6 of the present invention. This circuit is the same in configuration as the decoder circuit of FIG. 1, except that an equalizer circuit 61 and predecoders 62_0, 62_1, 62_2 and 62_3 and a delay circuit 63 are provided in place of the predecoder 12A shown in FIG. 1. Note that in FIG. 16, only the decode section 13_0 connected to the line L_0, among the decoder sections of the row decoder 13, is shown.

The equalizer circuit 61 receives the output of the delay circuit 63, and connects the lines L_0 to L_3 to one another when the clock CLK is in "L" level but disconnects the lines L_0 to L_3 from one another when it is in "H" level. The equalizer circuit 61 includes transistors T611, T612 and T613 that are ON when the clock CLK is in "L" level and OFF when it is in "H" level.

The predecoders 62_0 to 62_3 are the same in configuration. Herein, therefore, the predecoder 62_0 will be described representatively. The predecoder 62_0 executes discharging operation for the corresponding line L_0 if the corresponding address signal AD_0 is in "H" level, the clock CLK is in "H" level and the corresponding line is in "H" level. Also, the predecoder 62_0 executes charging operation for the corresponding line L_0 if the corresponding address signal AD_0 is in "L" level and the corresponding line L_0 is in "H" level.

<Internal Configuration of Predecoder>

Figure 17:
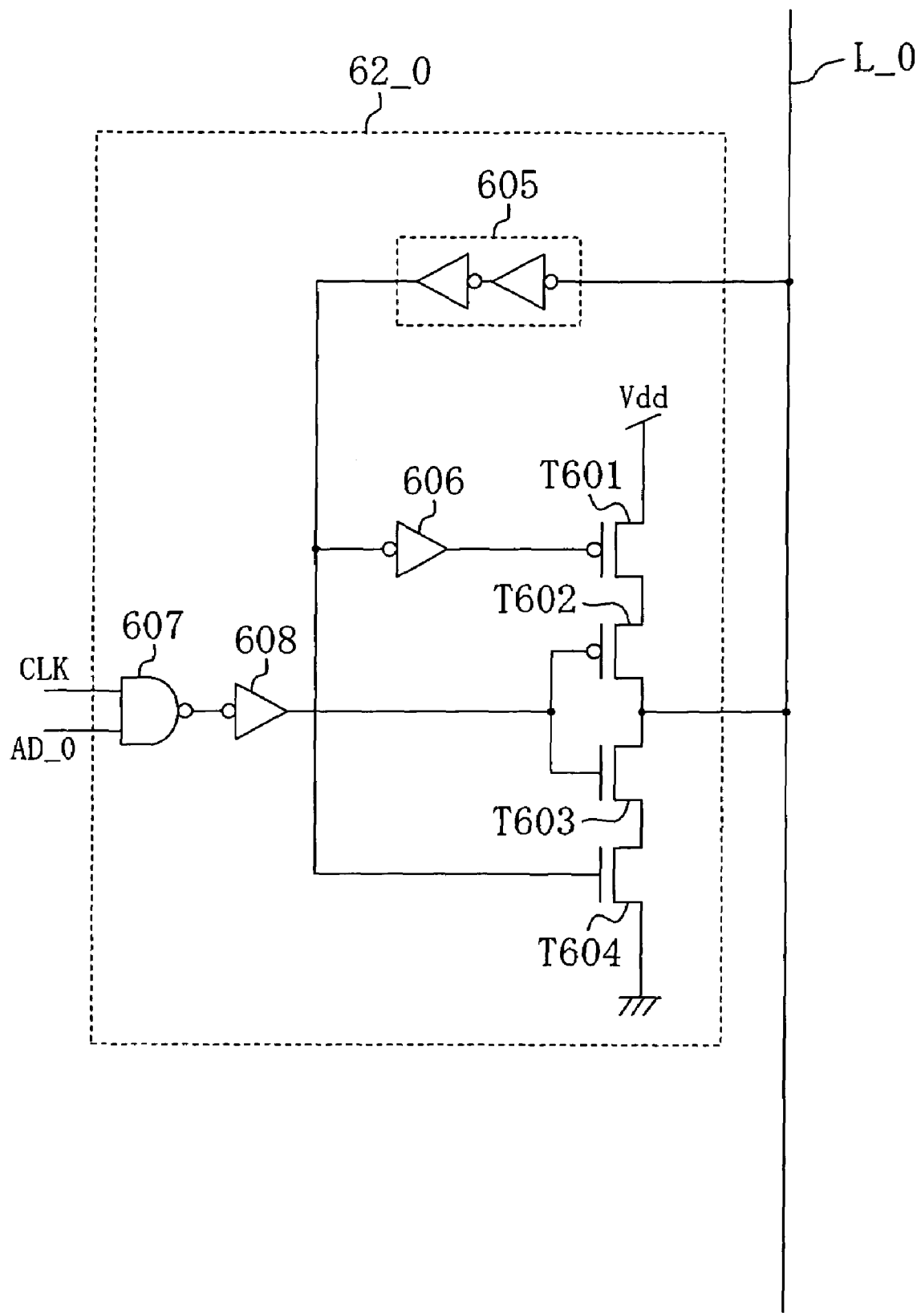
FIG. 17 is a circuit diagram showing an internal configuration of a predecoder shown in FIG. 16.

FIG. 17 shows an internal configuration of the predecoder 62_0 shown in FIG. 16. The predecoder 62_0 includes transistors T601, T602, T603 and T604, a delay circuit 605, an inverter 606, a NAND circuit 607 and an inverter 608. The transistors T601 to T604 are connected in series between the power supply node and the ground node. The delay circuit 605 receives the potential of the line L_0. The inverter 606 inverts the output of the delay circuit 605 and outputs the inverted signal. The transistor T601 receives the output of the inverter 606 at its gate. The transistors T602 and T603 receive the output of the inverter 608 at their gates. The transistor T604 receives the output of the delay circuit 605 at its gate.

When the potential of the line L_0 is in "H" level (when the potential of the line is "(¾)×Vdd" or more), the transistors T601 and T604 are ON. During this time, if the address signal AD_0 in "H" level and the clock CLK is in "H" level, the transistor T602 is OFF while the transistor T603 is ON. This connects the line L_0 with the ground node, allowing discharging for the line L_0.

If at least one of the address signal AD_0 and the clock CLK is in "L" level when the potential of the line L_0 is in "H" level, the transistor T602 is ON while the transistor T603 is OFF This connects the line L_0 with the power supply node, allowing charging for the line L_0.

When the potential of the line L_0 is in "L" level (when the potential of the line is "VSS"), the transistors T601 and T604 are OFF. During this time, therefore, neither discharging nor charging is executed even if both the address signal AD_0 and the clock CLK are in "H" level.

<Operation>

Figure 18:
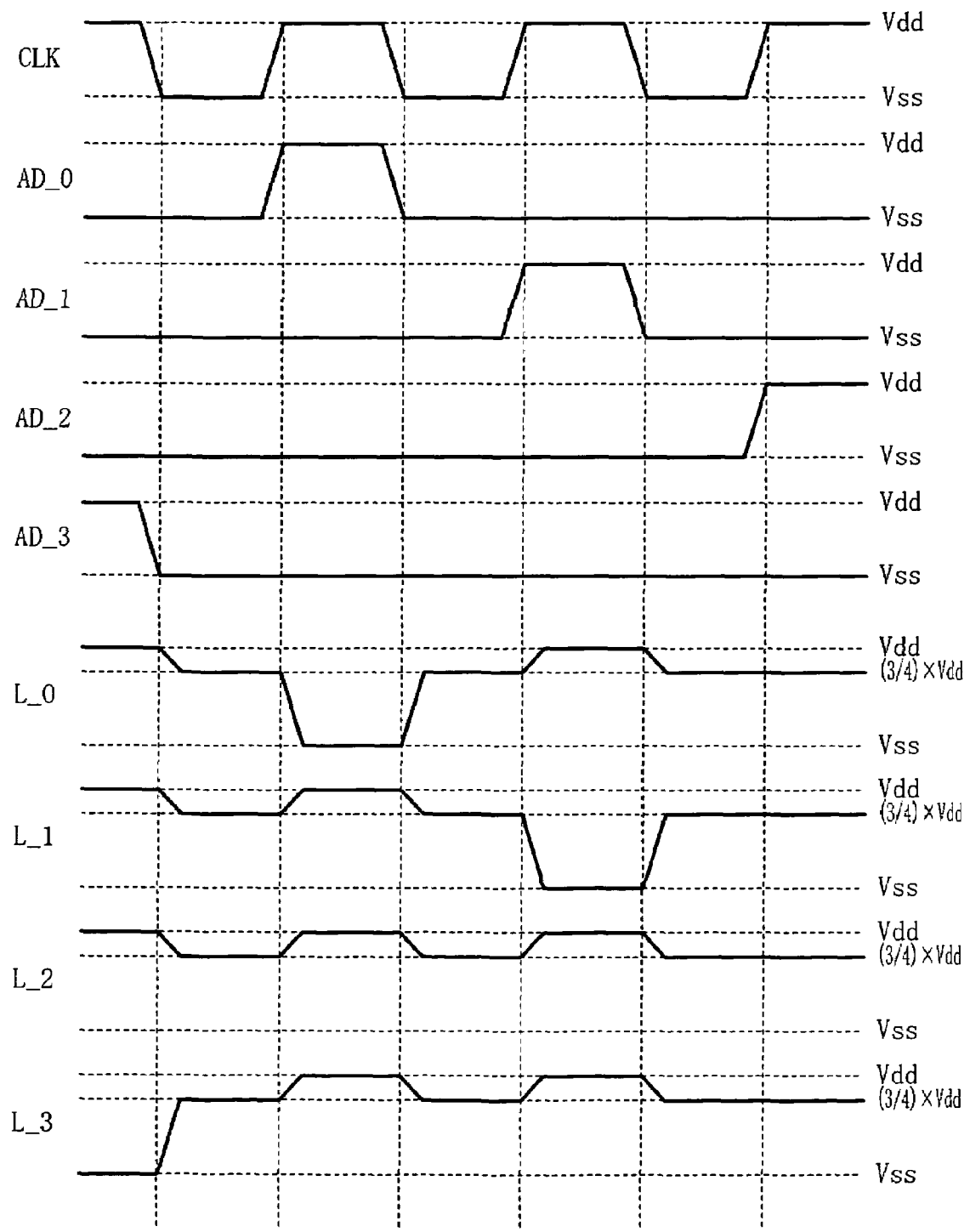
FIG. 18 is a timing chart for illustrating the operation of the decoder circuit of FIG. 16.

The operation of the decoder circuit of FIG. 16 will be described with reference to FIG. 18.

Assume that the clock CLK is in "H" level. In this state, the transistors T611 to T613 of the equalizer circuit 61 are OFF Assume also that the address signals AD_0 to AD_2 are in "L" level while the address signal AD_3 is in "H" level. In this state, the predecoders 62_0 to 62_2 connect their corresponding lines with the power supply node, allowing the potentials of the lines L_0 to L_2 to be "Vdd". Meanwhile, the potential of the line L_3 is "VSS", and thus in the predecoder 62_3, the transistors T601 and T604 are turned OFF.

The address signal AD_3 then becomes "L" level, and in the predecoder 62_3, the transistor T602 is turned ON while the transistor T603 is turned OFF. Also, the clock CLK becomes "L" level, and in the equalizer circuit 61, the transistors T611 to T613 are turned ON. This causes the potentials of the lines L_0 to L_2 to drop from "Vdd" and the potential of the line L_3 to rise from "VSS".

The clock CLK then becomes "H" level, and in the equalizer circuit 61, the transistors T611 to T613 are turned OFF. At this time, the potentials of the lines L_0 to L_3 are "(¾)× Vdd". The address signals AD_1 o AD_3 remain at "L" level. Therefore, in the predecoders 62_1 to 62_3, the transistor T602 is ON while the transistor T603 is OFF, causing the potentials of the lines L_1 to L_3 to rise from "(¾)×Vdd" to "Vdd". On the contrary, the address signal AD_0 rises to "H" level, and thus, in the predecoder 62_0, the transistor T602 is OFF while the transistor T603 is ON, causing the potential of the line L_0 to drop from "(¾)×Vdd" to "VSS".

The address signal AD_0 then becomes "L" level. In the predecoder 62_0, the transistor T602 is turned ON while the transistor T603 is turned OFF. Also, the clock CLK becomes "L" level, and in the equalizer circuit 61, the transistors T611 to T613 are turned ON. This causes the potentials of the lines L_1 to L_3 to drop from "Vdd" and the potential of the line L_0 to rise from "VSS".

As described above, during the time when the clock CLK is in "H" level, discharging is executed for either one of the lines L_0 to L_3. During the time when the clock CLK is in "L" level, the lines L_0 to L_3 are equalized. In other words, the lines L_0 to L_3 are equalized before execution of charging or discharging.

<Effect>

As described above, in charging, the line from which charge has been drawn (line L_0) is equalized with the lines in which charge has been stored to the potential "Vdd" of the power supply node (lines L_1, L_2 and L_3). By this equalization, the potential of the line L_0 can be set at "(¾)×Vdd". In other words, the charged potential can be suppressed to "(¾)×Vdd" that is lower than the potential "Vdd" of the power supply node, and thus the charge amount to the lines can be reduced. Also, the time required to charge/discharge the lines can be shortened. In this way, both high-speed operation and low power consumption can be attained.

Embodiment 7

<Configuration>

Figure 19:
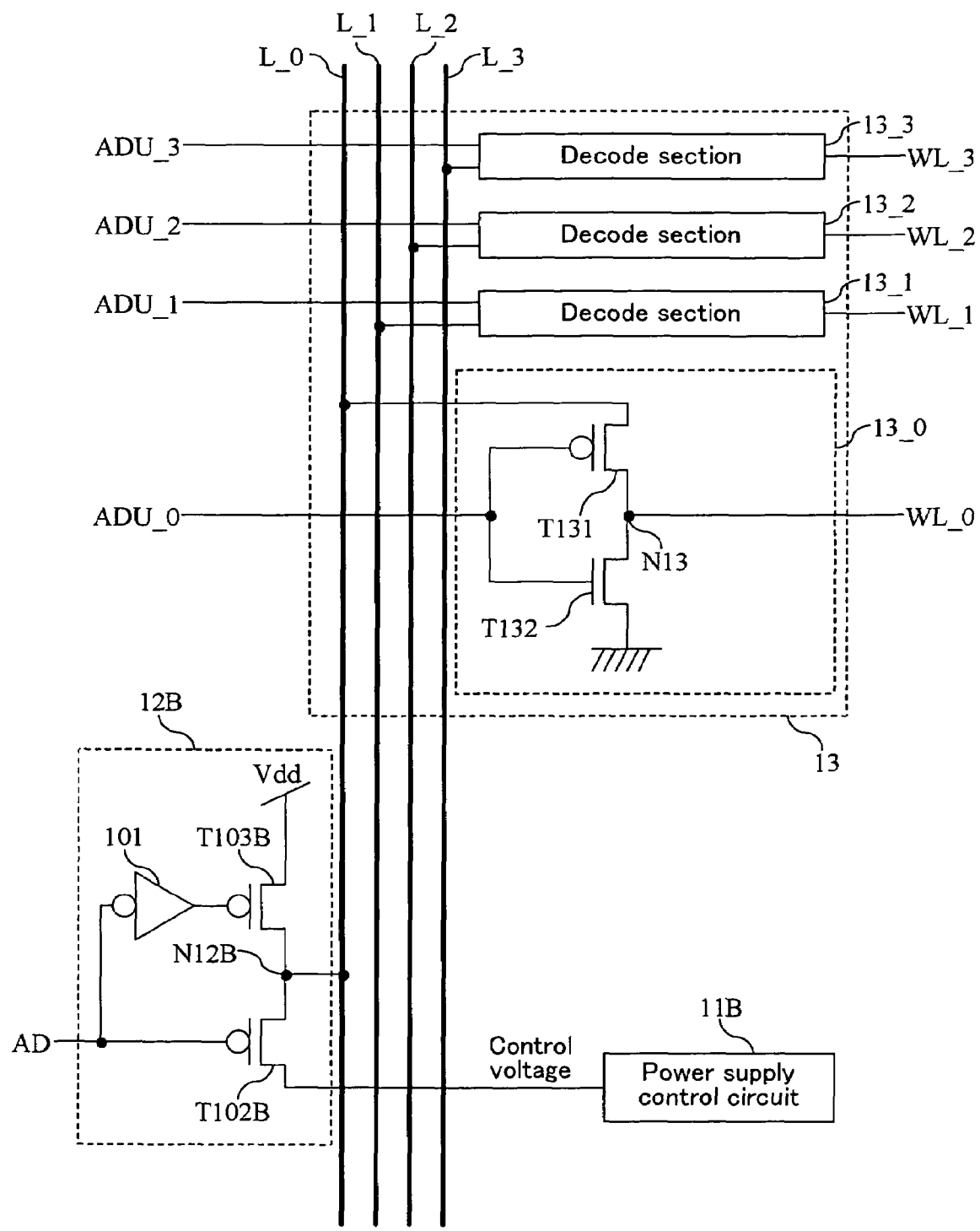
FIG. 19 is a circuit diagram showing a configuration of a decoder circuit of Embodiment 7 of the present invention.

FIG. 19 shows a configuration of a decoder circuit of Embodiment 7 of the present invention. This circuit includes a power supply control circuit 11B, a predecoder 12B and a row decoder 13.

The power supply control circuit 11B outputs a control voltage to the predecoder 12B. The voltage value "VSS1" of the control voltage is higher than the potential "VSS" of the ground node.

The predecoder 12B, which is connected to a line L_0 and operates according to the address signal AD, includes an inverter 101, a transistor T102B and a transistor T103B. The transistors T102B and T103B are connected in series between the power supply control circuit 11B and the power supply node: the transistor T102B is connected between the power supply control circuit 11B and the transistor T103B and receives the address signal AD at its gate, and the transistor T103B is connected between the transistor T102B and the power supply node and receives the output of the inverter 101 at its gate. A connection node N12B between the transistors T102B and T103B is connected to the line L_0.

The row decoder 13 is the same in configuration as that shown in FIG. 1, except for the configuration of the decode sections 13_0 to 13_3. Herein, the decode section 13_0 will be described representatively.

The decode section 13_0 includes transistors T131 and T132 that are connected in series between the ground node and the line L_0: the transistor T131 is connected between the line L_0 and the transistor T132 and receives the external address signal ADU_0 at its gate, and the transistor T132 is connected between the transistor T131 and the ground node and receives the external address signal ADU_0 at its gate. The voltage generated at a connection node N13 between the transistors T131 and T132 is outputted as the drive signal WL_0.

<Operation>

The operation of the decoder circuit of FIG. 19 will be described. Note that in the following description, no consideration is given to the threshold voltages of the transistors.

[Decode Section]

When the address signal ADU_0 is in "L" level, the transistor T131 is ON while the transistor T132 is OFF. The potential of the connection node N13 is therefore equal to the potential of the connection node N12B. When the address signal ADU_0 is in "H" level, the transistor T131 is OFF while the transistor T132 is ON. The potential of the connection node N13 is therefore equal to the potential of the ground node.

[Predecoder]

Figure 20:
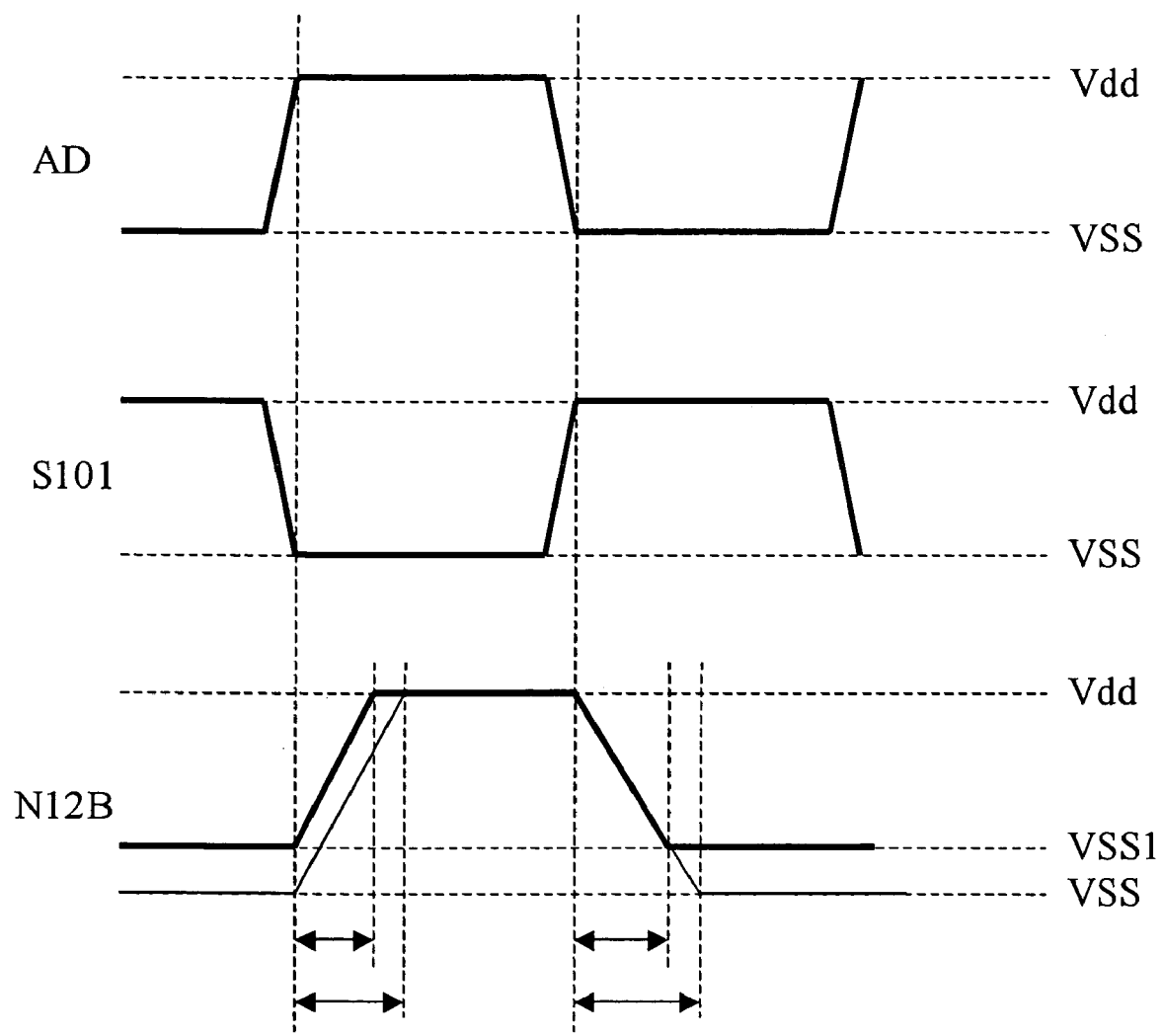
FIG. 20 is a timing chart for illustrating the operation of the decoder circuit of FIG. 19.

As shown in FIG. 20, when the address signal AD is in "L" level, the output S101 of the inverter 101 is in "H" level. In this state, therefore, the transistor T102B is ON while the transistor T103B is OFF. The potential of the connection node N12B is therefore equal to the voltage value "VSS1" of the control voltage from the power supply control circuit 11B. During this time, the potential of the connection node N13 is "VSS1", which is lower than the potential "Vdd" of the power supply node, if the address signal ADU_0 is in "L" level.

When the address signal AD is in "H" level, the output S101 of the inverter 101 is in "L" level. In this state, therefore, the transistor T102B is OFF while the transistor T103B is ON. The potential of the connection node N12B is therefore equal to the potential "Vdd" of the power supply node. During this time, the potential of the connection node N13 is "Vdd", the potential of the power supply node, if the address signal ADU_0 is in "L" level.

<Effect>

As described above, by setting the voltage supplied to one terminal of the transistor T102B to be higher than the potential "VSS" of the ground node, the amplitude of the potential of the connection node N12B can be reduced. Hence, the charge amount released from the connection node N12B can be reduced, and also the time required to charge/discharge the connection node N12B can be shortened. In this way, high-speed operation and low power consumption can be attained.

Although the transistors T102B and T131 are p-type transistors in FIG. 19, they may be n-type transistors.

Embodiment 8

<Configuration>

Figure 21:
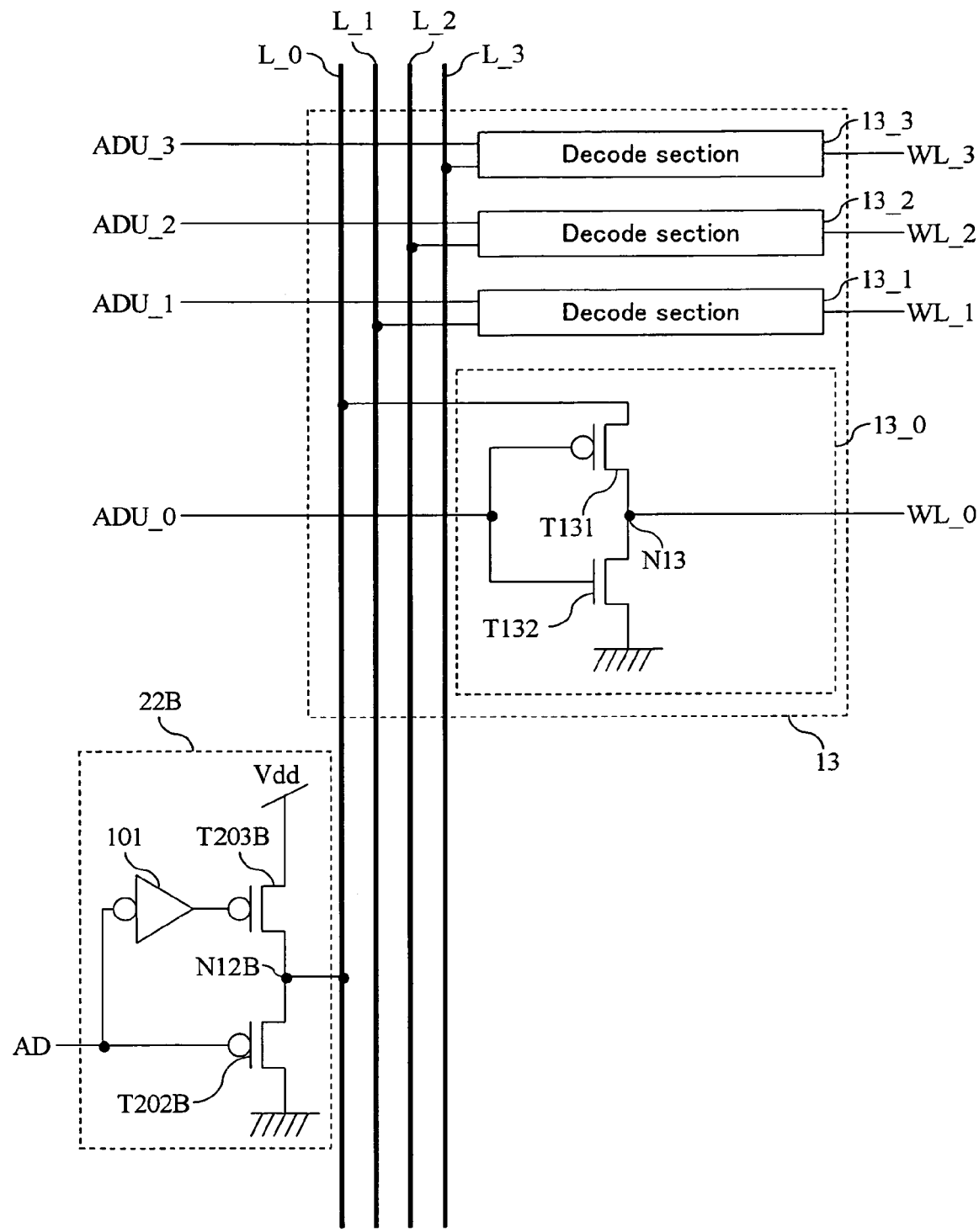
FIG. 21 is a circuit diagram showing a configuration of a decoder circuit of Embodiment 8 of the present invention.

FIG. 21 shows a configuration of a decoder circuit of Embodiment 8 of the present invention. This circuit is the same in configuration as the decoder circuit of FIG. 19, except that a predecoder 22B is provided in place of the power supply control circuit 11B and the predecoder 12B shown in FIG. 19. The predecoder 22B is the same in configuration as the predecoder in FIG. 19, except that transistors T202B and T203B are provided in place of the transistors T102B and T103B shown in FIG. 19. The transistors T202B and T203B are of the same conductivity type as the transistor T131. For example, when the transistor T131 is of p-type, the transistors T202B and T203B are also of p-type.

<Operation>

The operation of the decoder circuit of FIG. 21 will be described. Note that in the following description, the absolute value of the threshold voltage of the transistor T202B is assumed to be "|Vt81|" and no consideration is given to the threshold voltages of the transistors T203B and T131.

Figure 22:
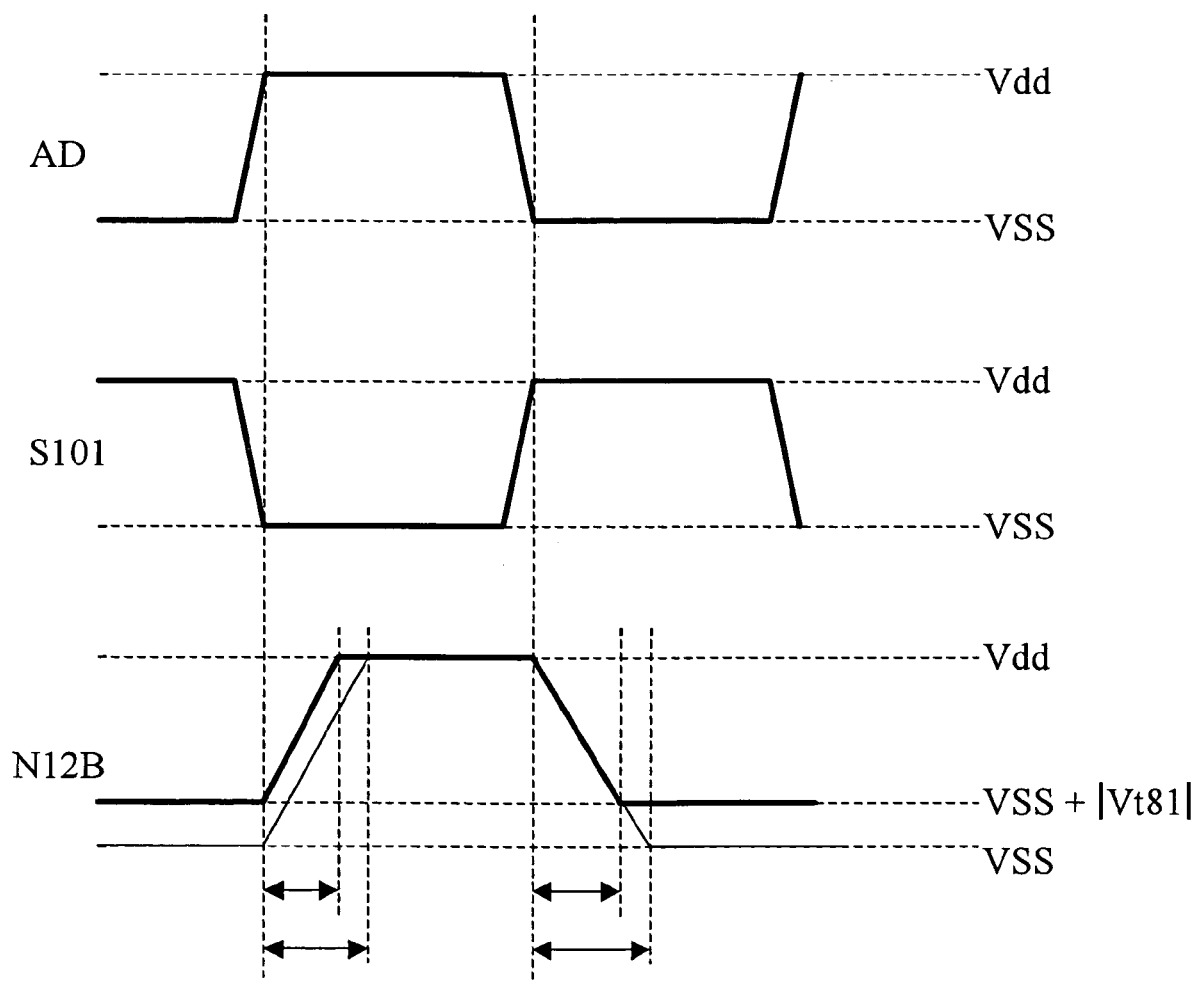
FIG. 22 is a timing chart for illustrating the operation of the decoder circuit of FIG. 21.

As shown in FIG. 22, when the address signal AD is in "L" level, the output of the inverter 101 is in "H" level. In this state, therefore, the transistor T202B is ON while the transistor T203B is OFF. The potential of the connection node N12B is therefore a value obtained by adding the threshold voltage of the transistor T202B to the potential of the ground node, "VSS+|Vt81|". During this time, the potential of the connection node N13 is, not "Vdd", but "VSS+|Vt81|" if the address signal ADU_0 is in "L" level.

When the address signal AD is in "H" level, the output S101 of the inverter 101 is in "L" level. In this state, therefore, the transistor T202B is OFF while the transistor T203B is ON. The potential of the connection node N12B is therefore equal to the potential "Vdd" of the power supply node. During this time, the potential of the connection node N13 is "Vdd" if the address signal ADU_0 is in "L" level.

<Effect>

As described above, by setting the transistors T202B and T203B of the predecoder to have the same conductivity type as the transistor T131 of the decode section, the amplitude of the potential of the connection node N12B can be reduced. Therefore, the charge amount released from the connection node N12B can be reduced, and also the time required to charge/discharge the connection node N12B can be shortened. In this way, high-speed operation and low power consumption can be attained.

[Alteration 1]

Figure 23:
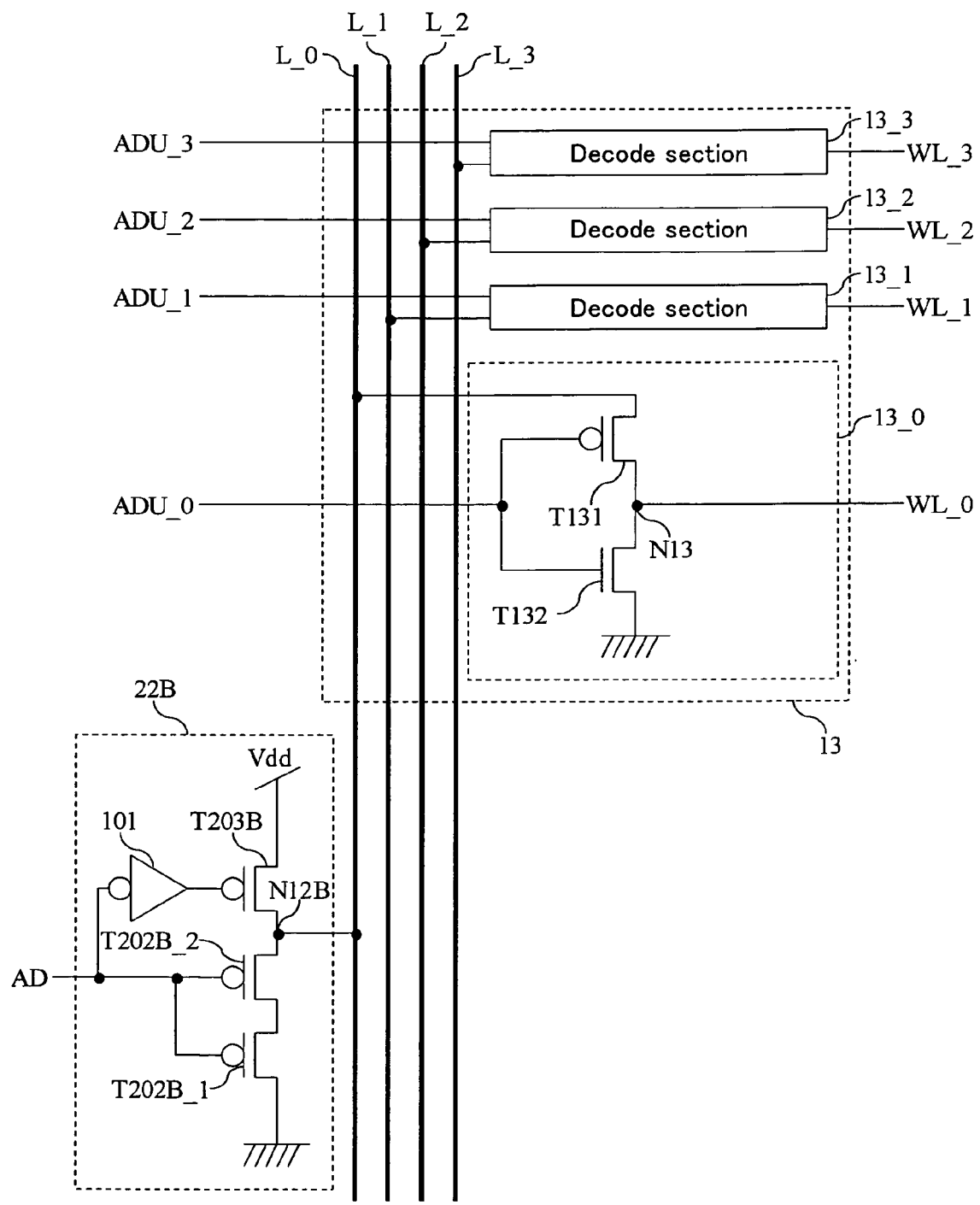
FIG. 23 is a circuit diagram showing a configuration of an alteration to the decoder circuit of FIG. 21.

As shown in FIG. 23, the predecoder 22B may include transistors T202B_1 and T202B_2 in place of the transistor T202B shown in FIG. 21. In this case, also, substantially the same effect can be obtained. The transistors T202B_1 and T202B_2 are connected in series between the transistor T203B and the ground node and receive the address signal AD at their gates. The conductivity type of the transistors T202B_1 and T202B_2 is the same as that of the transistor T131.

Assuming herein that the absolute values of the threshold voltages of the transistors T202B_1 and T202B_2 are respectively "|Vt81|" and |Vt812|" and the voltage drop caused by a back bias effect is "β", the potential of the connection node N12B will be "VSS+(|Vt811|+|Vt812|+β)" when the address signal AD is in "L" level. That is, the discharged potential ((potential of the discharged connection node N12B) can be made higher than the potential "VSS" of the ground node.

[Alteration 2]

Figure 24:
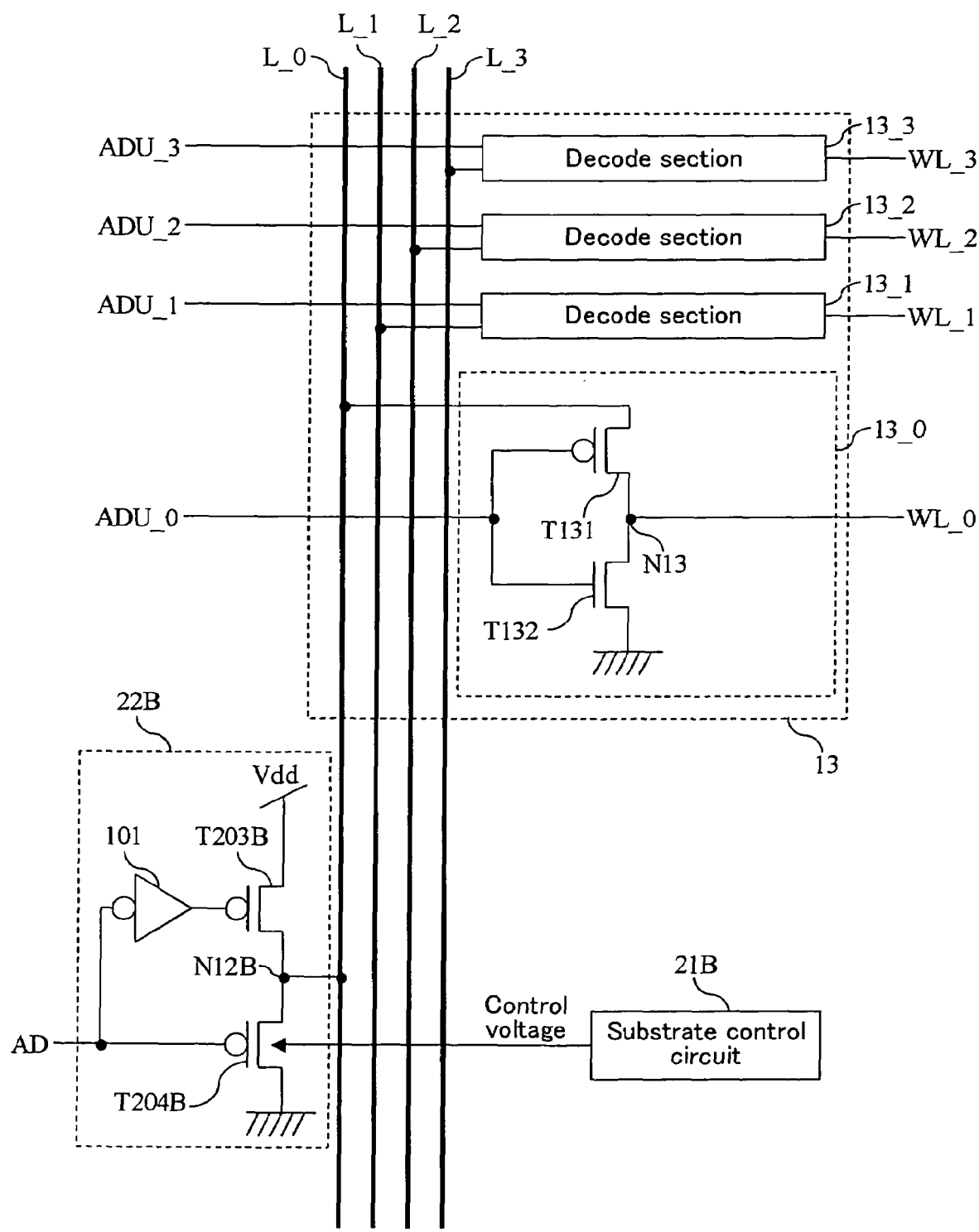
FIG. 24 is a circuit diagram showing a configuration of another alteration to the decoder circuit of FIG. 21.

As shown in FIG. 24, the decoder circuit may further be provided with a substrate control circuit 21B that outputs a control voltage. In this case, the predecoder 22B includes a transistor T204B in place of the transistor T202B shown in FIG. 21. The transistor T204B receives the control voltage from the substrate control circuit 21B at the substrate. Assuming herein that the absolute value of the threshold voltage of the transistor T204B is "|Vt82|" when the control voltage is equal to the potential "VSS" of the ground node, the absolute value of the threshold voltage of the transistor T204B will be "|Vt82α|" that is larger than "|Vt82|" when the control voltage is a reverse bias (Vbb).

Figure 25:
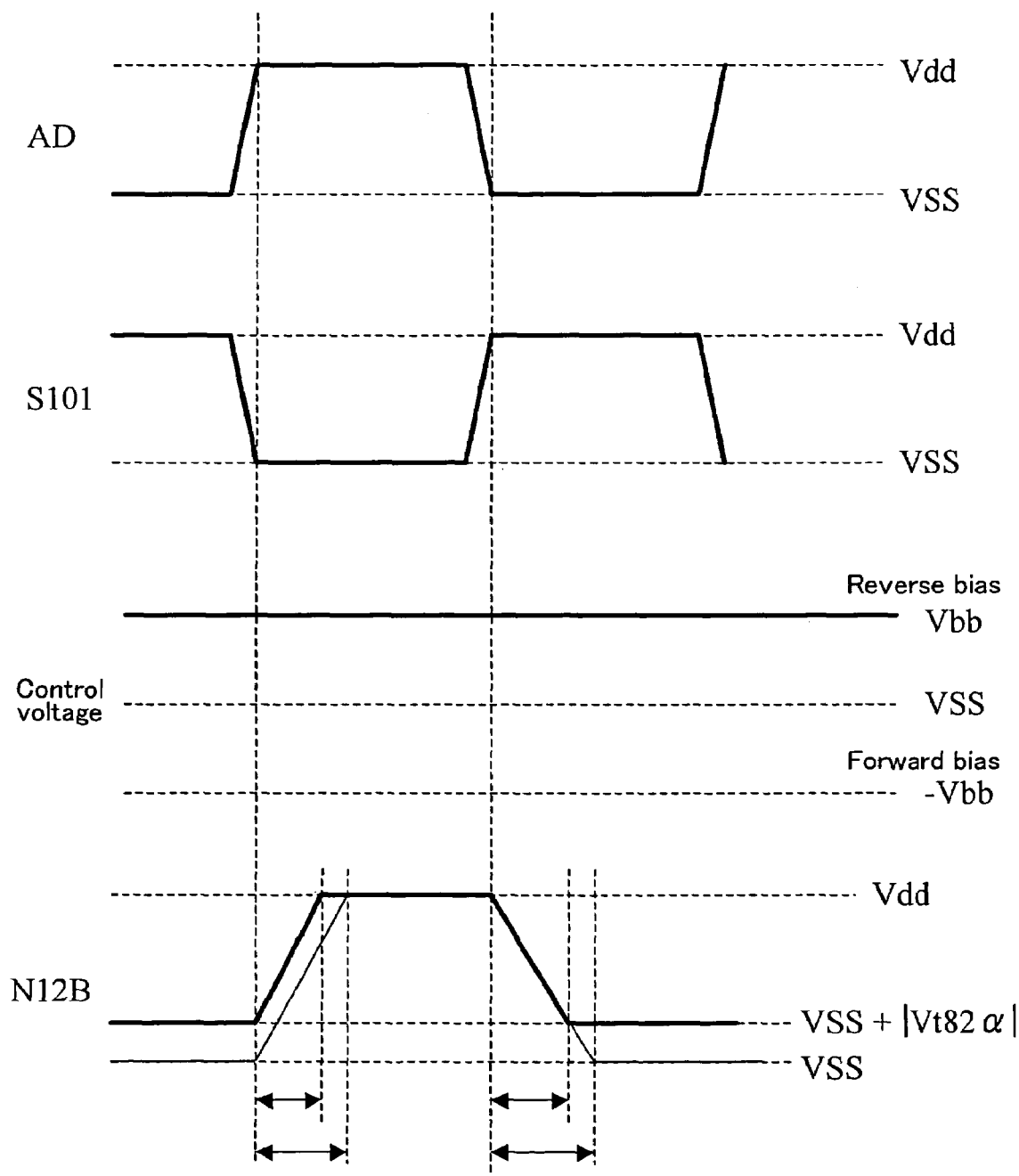
FIG. 25 is a timing chart for illustrating the operation of the decoder circuit of FIG. 24.

As shown in FIG. 25, when the address signal AD is in "L" level, the potential of the connection node N12B is a value obtained by adding the threshold voltage of the transistor T204B to the potential of the ground node, "VSS+|Vt82α|". That is, the discharged voltage can be made higher than the potential "VSS" of the ground node.

[Alteration 3]

Figure 26:
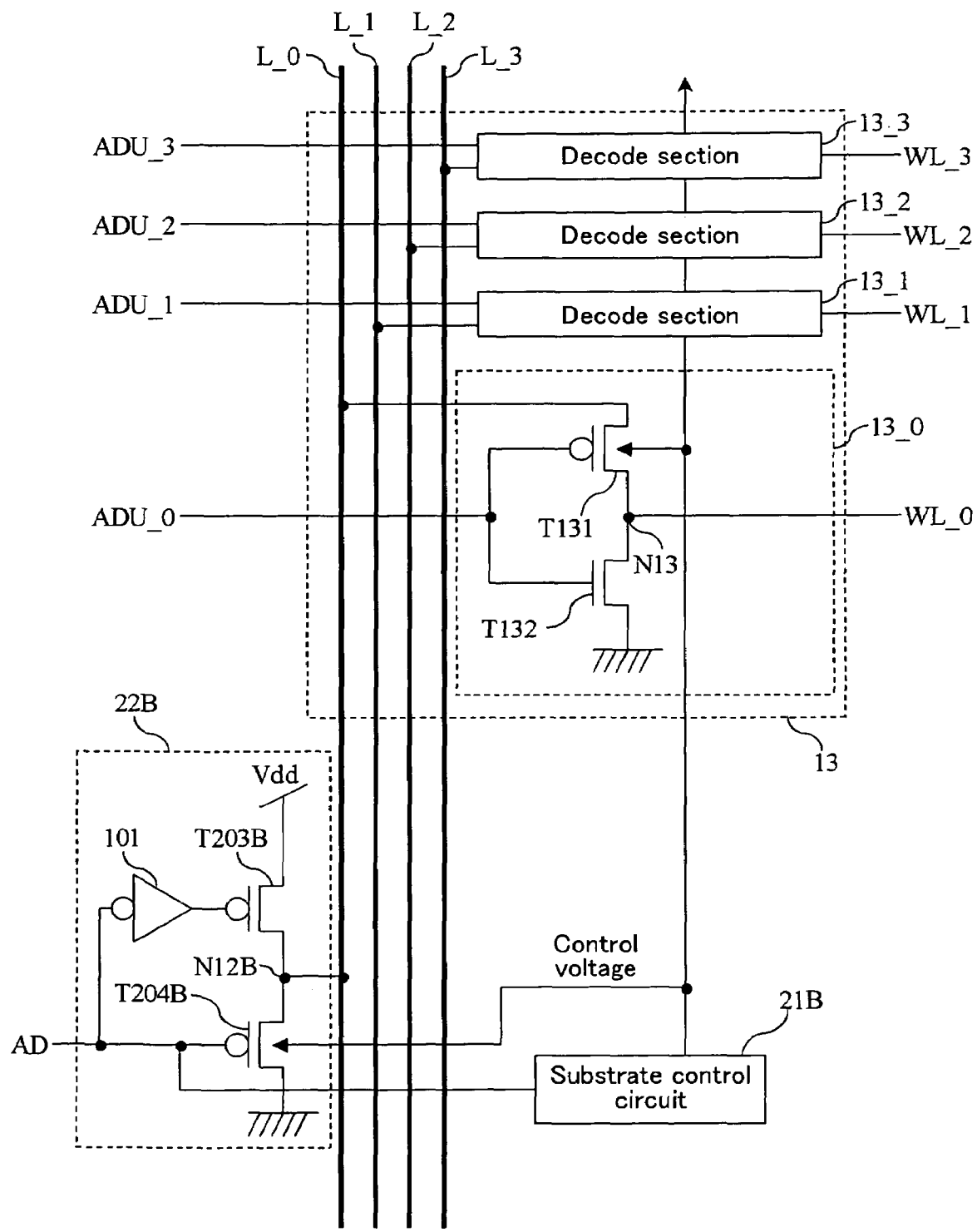
FIG. 26 is a circuit diagram showing a configuration of yet another alteration to the decoder circuit of FIG. 21.

As shown in FIG. 26, the substrate control circuit 21B may output the control voltage according to the address signal AD. The transistor T204B of the predecoder 22B and the transistor T131 of the decode section 13_0 receive the control voltage from the substrate control circuit 21B at the substrate. The absolute values of the threshold voltages of the transistors T204B and T131 will be smaller when the control voltage is a forward bias (−Vdd) than when it is equal to the potential "VSS" of the ground node.

Figure 27:
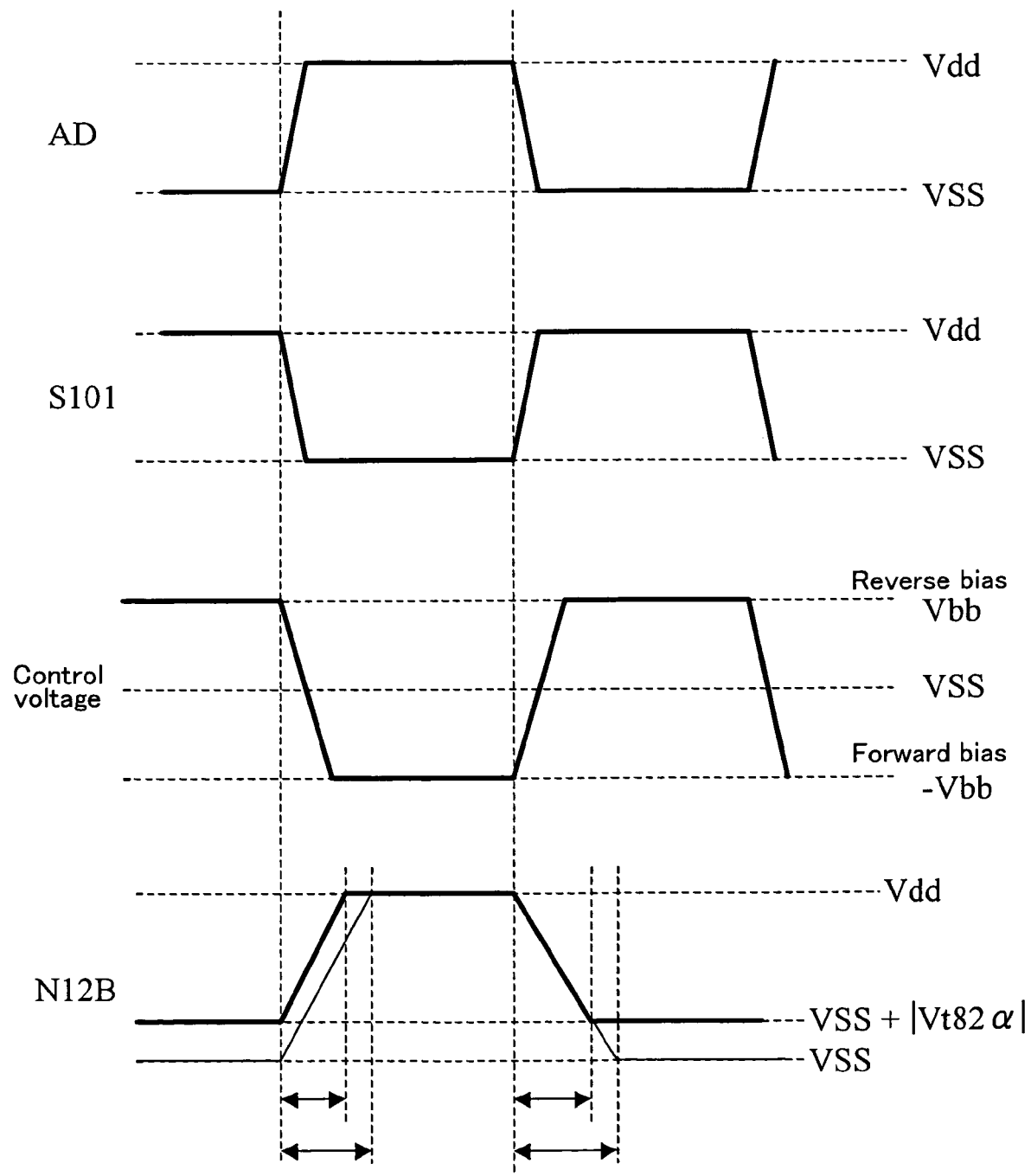
FIG. 27 is a timing chart for illustrating the operation of the decoder circuit of FIG. 26.

As shown in FIG. 27, when the address signal AD is in "L" level, the substrate control circuit 21B outputs the reverse-bias control voltage (Vbb). With this control voltage, the absolute value of the threshold voltage of the transistor T204B is "|Vt82α|" that is larger than "|Vt82|". Therefore, the potential of the connection node N12B won't be lower than "VSS+|Vt82α|". Also, since the discharging speed is lower as the absolute value of the threshold voltage is larger, the charge amount released from the connection node N12B can be reduced. When the address signal AD is in "H" level, the substrate control circuit 21B outputs the forward-bias control voltage (−Vbb). With this control voltage, the absolute value of the threshold voltage of the transistor T131 decreases, and thus the time required for charging the connection node N12B can be shortened.

Embodiment 9

<Configuration>

Figure 28:
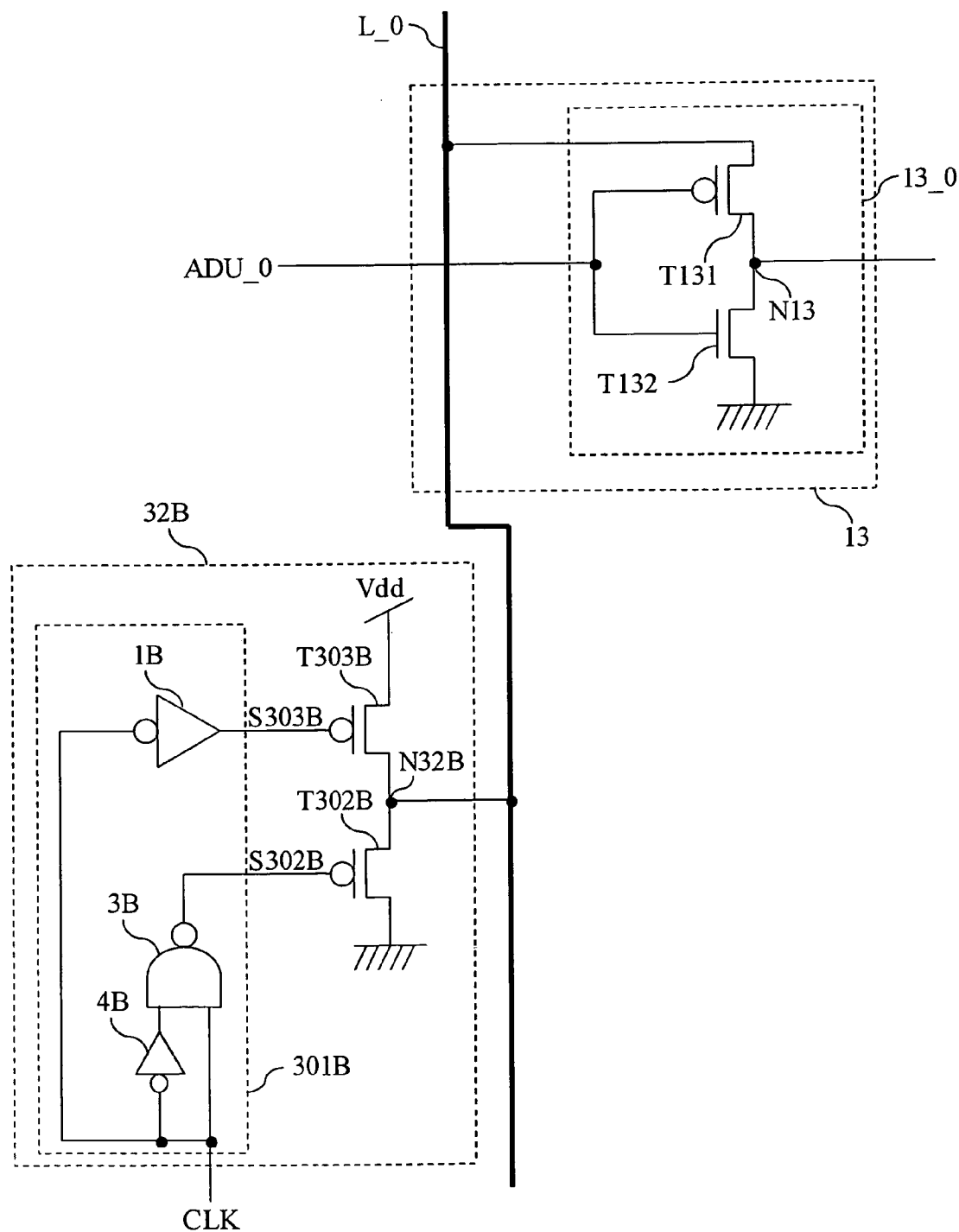
FIG. 28 is a circuit diagram showing a configuration of a decoder circuit of Embodiment 9 of the present invention.

FIG. 28 shows a configuration of a decoder circuit of Embodiment 9 of the present invention. This circuit is the same in configuration as the decoder circuit of FIG. 21, except that a predecoder 32B is provided in place of the predecoder 22B shown in FIG. 21. Note that in FIG. 28, only the predecoder 32B, the line L_0 and the decode section 13_0 of the row decoder 13 are shown. The predecoder 32B includes a timing control circuit 301B and transistors T302B and T303B. The timing control circuit 301B is composed of a plurality of logic elements (an inverter 1B, a NAND circuit 3B and a delay circuit 4B in the illustrated example). The timing control circuit 301B outputs control signals S302B and S303B according to the external clock CLK. The transistors T302B and T303B are connected in series between the power supply node and the ground node: the transistor T302B is connected between the ground node and the transistor T303B and receives the output of the NAND circuit 3B (control signal S302B) at its gate, and the transistor T303B is connected between the transistor T302B and the power supply node and receives the output of the inverter 1B (control signal S303B) at its gate. A connection node N32B between the transistors T302B and T303B is connected to the line L_0.

<Operation>

Figure 29:
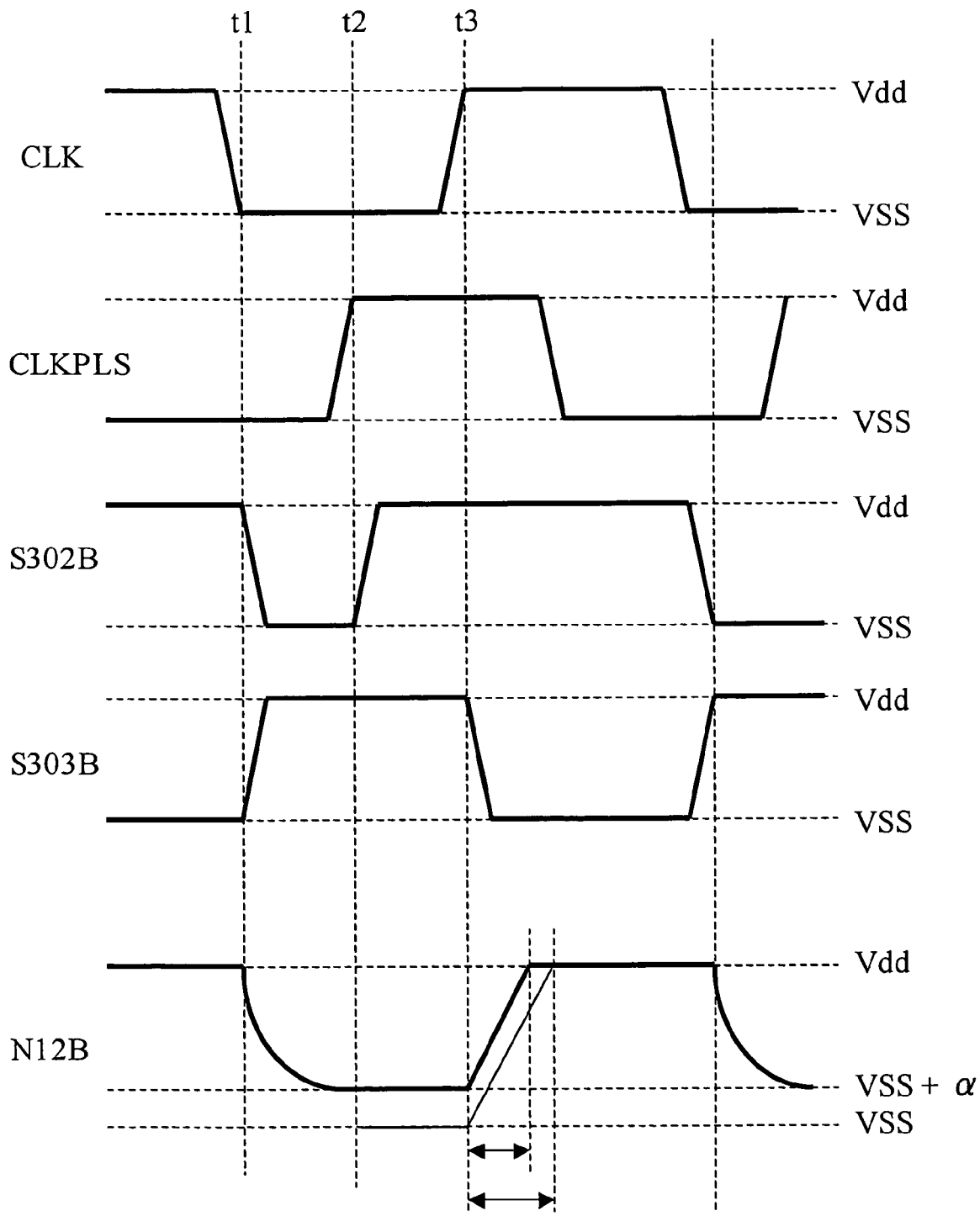
FIG. 29 is a timing chart for illustrating the operation of the decoder circuit of FIG. 28.

The operation of the decoder circuit of FIG. 28 will be described with reference to FIG. 29. Note that in the following description, no consideration is given to the threshold voltages of the transistors.

At time t1, the clock CLK shifts from "H" level to "L" level. With this level shift, the control signal S302B shifts from "H" level to "L" level, turning the transistor T302B from OFF to ON. The control signal S303B shifts from "L" level to "H" level, turning the transistor T303B from ON to OFF. Hence, the potential of the connection node N32B drops from the potential "Vdd" of the power supply node.

At time t2, the output CLKPLS of the delay circuit 4B shifts from "L" level to "H" level. With this shift, the control signal S302B changes from "L" level to "H" level, turning the transistor T302B from ON to OFF. The control signal S303B remains at "H" level, keeping the transistor T303B in the OFF state. Hence, the potential of the connection node N32B is "VSS+α" that is higher than the potential "VSS" of the ground node.

At time t3, the clock CLK shifts from "L" level to "H" level. With this shift, the control signal S303B shifts from "H" level to "L" level, turning the transistor T303B from OFF to ON. The control signal S302B remains at "H" level, keeping the transistor T302B in the OFF state. Hence, the potential of the connection node N32B rises toward the potential "Vdd" of the power supply node.

<Effect>

As described above, by turning OFF the transistor T302B before the potential of the connection node N32B reaches the potential "VSS" of the ground node, the amplitude of the potential of the connection node N32B can be reduced. Therefore, the charge amount released from the connection node N32B can be reduced, and also the time required to charge/discharge the connection node N32B can be shortened. In this way, high-speed operation and low power consumption can be attained.

Note that although the transistors T303B and T131 are p-type transistors in FIG. 28, they may be p-type transistors.

Embodiment 10

<Configuration>

Figure 30:
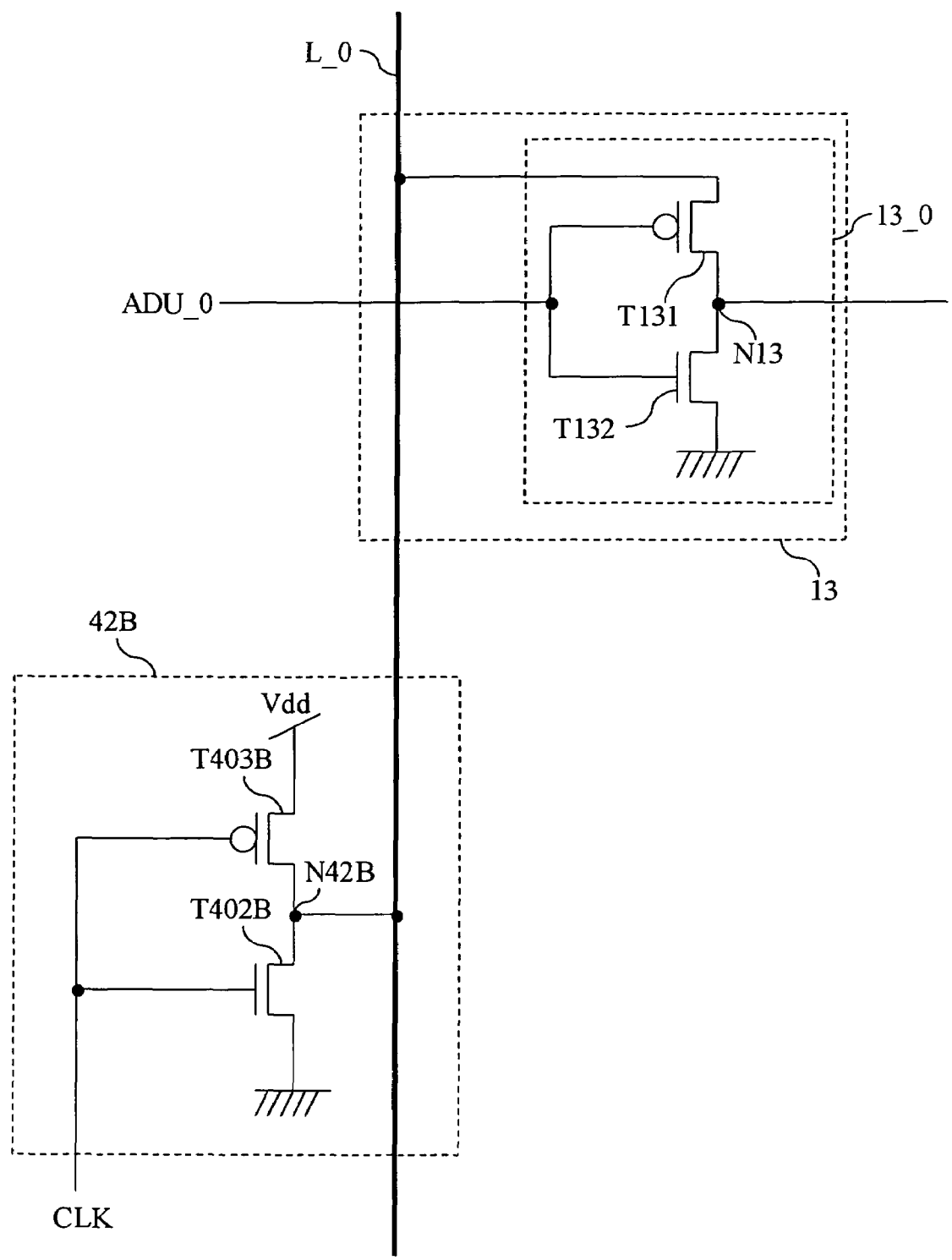
FIG. 30 is a circuit diagram showing a configuration of a decoder circuit of Embodiment 10 of the present invention.

FIG. 30 shows a configuration of a decoder circuit of Embodiment 10 of the present invention. This circuit is the same in configuration as the decoder circuit of FIG. 28, except that a predecoder 42B is provided in place of the predecoder 32B shown in FIG. 28. The predecoder 42B includes transistors T402B and T403B, which are connected in series between the power supply node and the ground node: the transistor T402B is connected between the ground node and the transistor T403B and receives the external clock CLK at its gate, and the transistor T403B is connected between the transistor T402B and the power supply node and receives the external clock CLK at its gate. A connection node N42B between the transistors T402B and T403B is connected to the line L_0.

The W/L ratio of the transistor T402B is equal to or less than twice the W/L ratio of the transistor T403B. For example, assuming that the gate lengths of the transistors T402B and T403B are equal to each other, the gate width of the transistor T402B is equal to or less than twice the gate width of the transistor T403B. Alternatively, assuming that the gate widths of the transistors T402B and T403B are equal to each other, the gate length of the transistor T402B is equal to or more than a half of the gate length of the transistor T403B. With the configuration described above, the current amount flowing through the transistor T402B per unit time can be made smaller than the current amount flowing through the transistor T403B per unit time. In other words, the current capability of the transistor T402B is weaker than that of the transistor T403B. The current capability of the transistor T403B may be of a conventional level.

<Operation>

Figure 31:
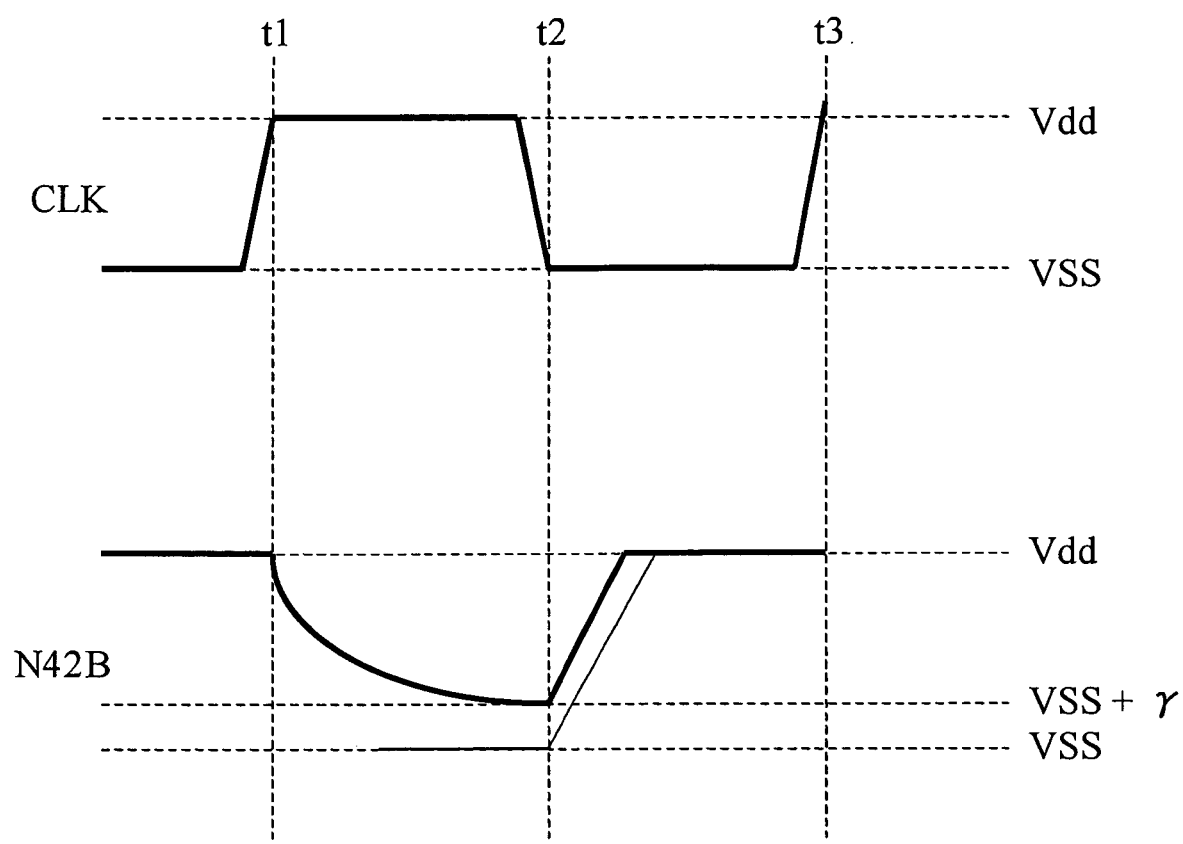
FIG. 31 is a timing chart for illustrating the operation of the decoder circuit of FIG. 30.

The operation of the decoder circuit of FIG. 30 will be described with reference to FIG. 31.

At time t1, the clock CLK shifts from "L" level to "H" level. With this shift, the transistor T402B is turned from OFF to ON while the transistor T403B is turned from ON to OFF. Hence, the potential of the connection node N42B drops from the potential "Vdd" of the power supply node.

At time t2, the clock CLK shifts from "H" level to "L" level. With this shift, the transistor T402B is turned from ON to OFF. At this time, since the current capability of the transistor T402B is comparatively weak, the potential of the connection node N42B has not reached the potential "VSS" of the ground node (but is "VSS+γ"). Meanwhile, the transistor T403B is turned from OFF to ON. Therefore, the potential of the connection node N42B rises from "VSS+γ".

At time t3, the clock CLK shifts from "L" level to "H" level. With this shift, the transistor T402B is turned from OFF to ON while the transistor T403B is turned from ON to OFF. At this time, since the current capability of the transistor T403B is comparatively strong, the potential of the connection node N42B has reached the potential "Vdd" of the power supply node.

<Effect>

As described above, by turning OFF the transistor T402B before the potential of the connection node N42B reaches the potential "VSS" of the ground node, the amplitude of the potential of the connection node N42B can be reduced. Therefore, the charge amount released from the connection node N42B can be reduced, and also the time required to charge/discharge the connection node N42B can be shortened. In this way, high-speed operation and low power consumption can be attained.

Embodiment 11

<Configuration>

Figure 32:
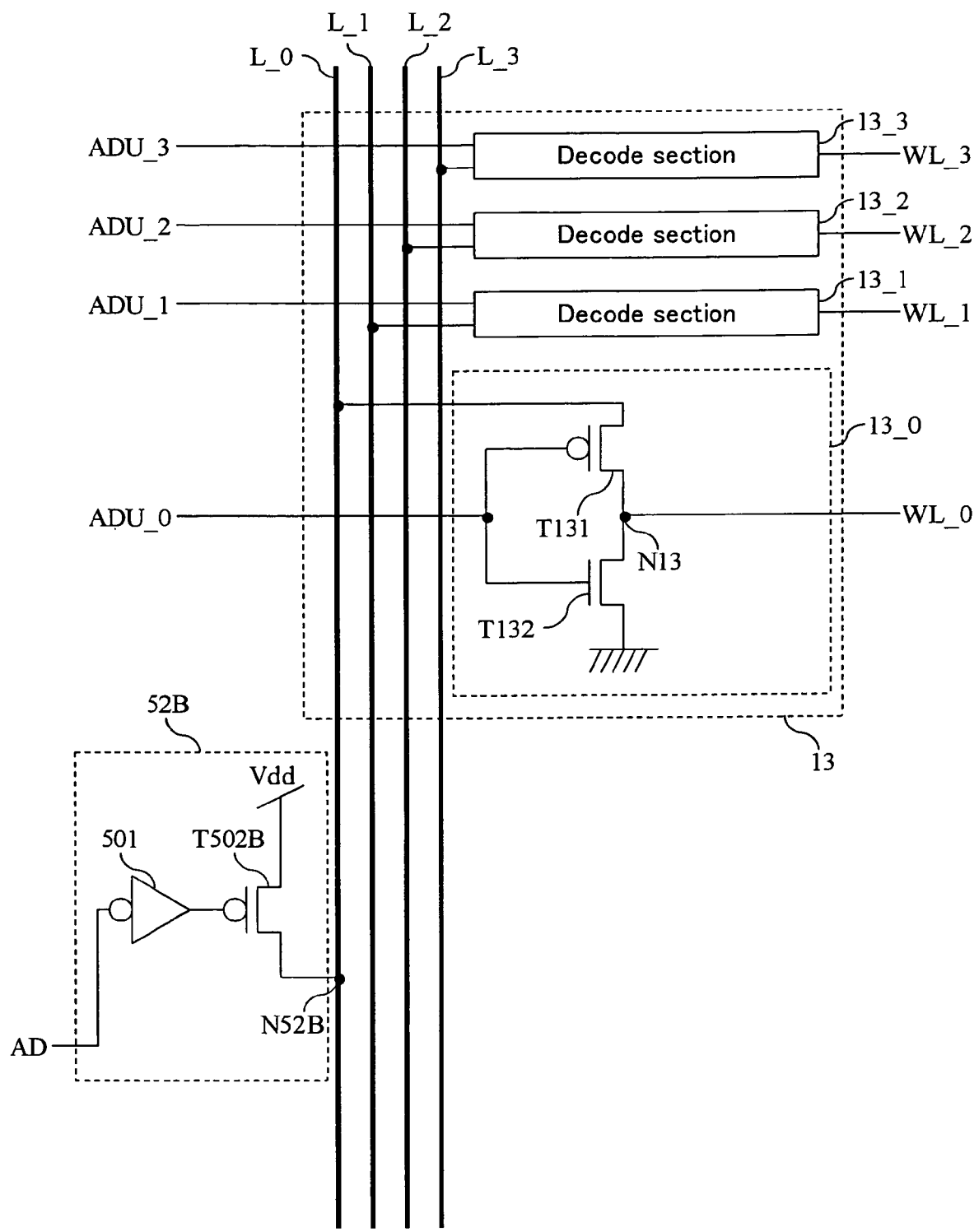
FIG. 32 is a circuit diagram showing a configuration of a decoder circuit of Embodiment 11 of the present invention.

FIG. 32 shows a configuration of a decoder circuit of Embodiment 11 of the present invention. This circuit is the same in configuration as the decoder circuit of FIG. 28, except that a predecoder 52B is provided in place of the predecoder 32B shown in FIG. 28. The predecoder 52B includes an inverter 501 and a transistor T502B. The transistor T502B is connected between the line L_0 and the power supply node and receives the output of the inverter 501 at its gate. The transistor T502B is the same in conductivity type as the transistor T131.

<Operation>

Figure 33:
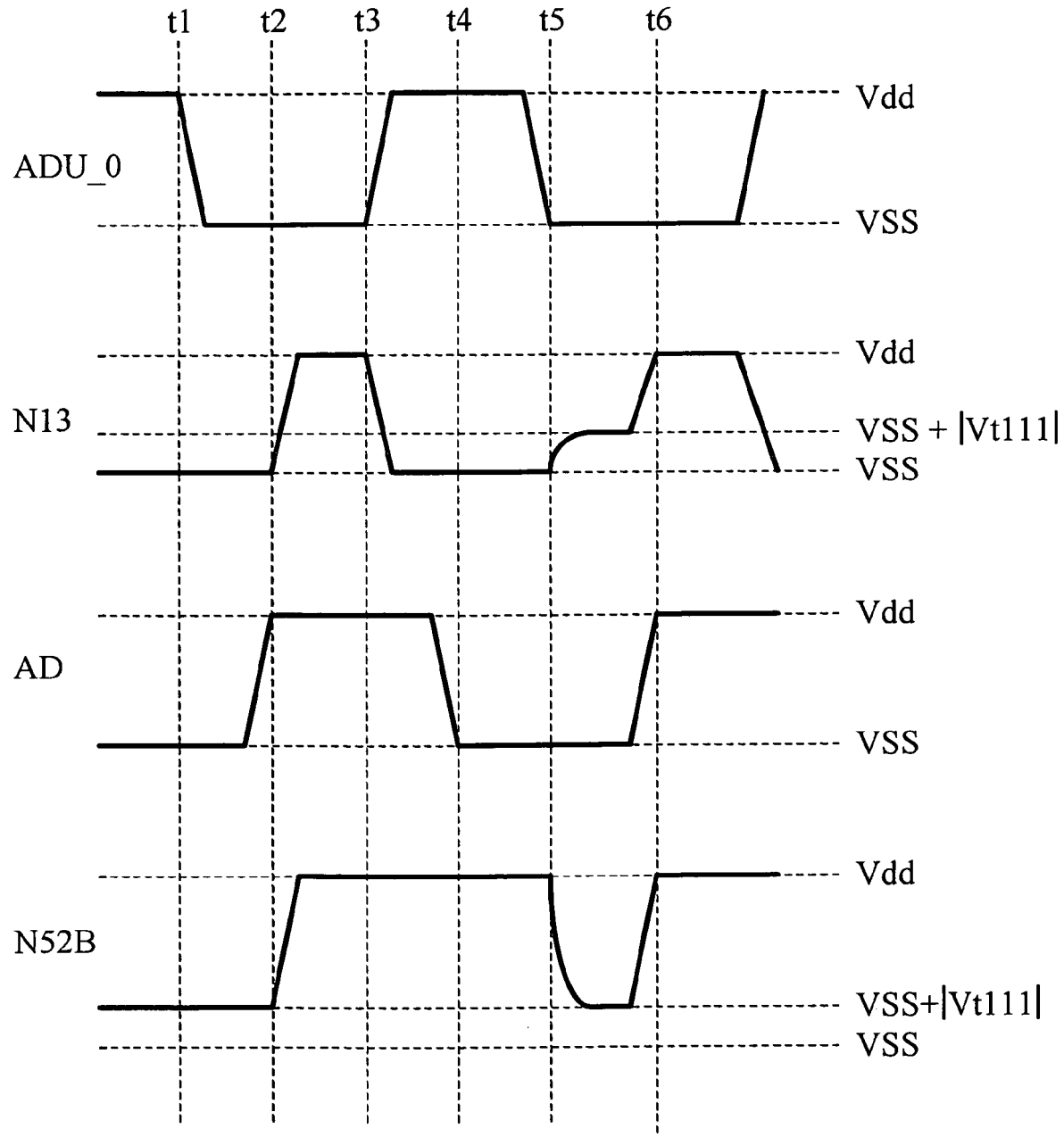
FIG. 33 is a timing chart for illustrating the operation of the decoder circuit of FIG. 32.

The operation of the decoder circuit of FIG. 32 will be described with reference to FIG. 33. Note that in the following description, the absolute value of the threshold voltage of the transistor T502B is assumed to be "|Vt111|".

At time t1, the transistor T131 is turned from OFF to ON while the transistor T132 is turned from ON to OFF. The connection node N13 is therefore disconnected from the ground node and connected to the connection node N52B. At this time, the potential of the connection node N52B is "VSS+|Vt111|". Therefore, the potential of the connection node N13 remains at the potential "VSS" of the ground node.

At time t2, the transistor T502B is turned from OFF to ON. The connection node N52B is therefore connected to the power supply node, causing the potential of the connection node N52B to rise from "VSS+|Vt111|" toward the potential "Vdd" of the power supply node. The potential of the connection node N13 also rises from "VSS" toward the potential "Vdd" of the power supply node.

At time t3, the transistor T131 is turned from ON to OFF while the transistor T132 is turned from OFF to ON. The connection node N13 is therefore disconnected from the connection node N52B and connected to the ground node. Thus, the potential of the connection node N13 drops from the potential "Vdd" of the power supply node toward the potential "VSS" of the ground node.

At time t4, the transistor T502B is turned from ON to OFF, disconnecting the connection node N52B from the power supply node.

At time t5, the transistor T131 is turned from OFF to ON while the transistor T132 is turned from ON to OFF. The connection node N13 is therefore disconnected from the ground node and connected to the connection node N52B. At this time, since the potential of the connection node N13 is "VSS" and the potential of the connection node N52B is "Vdd", the charge stored in the connection node N52B is shared with the connection node N13, so that the potentials of the connection nodes N13 and N52B become "VSS+|Vt111|".

At time t6, the transistor T502B is turned from OFF to ON. The connection node N52B is therefore connected to the power supply node, causing the potential of the connection node N52B to rise from "VSS+|Vt111|" toward the potential "Vdd" of the power supply node. Also, the potential of the connection node N13 rises from "VSS+|Vt111|" toward the potential "Vdd" of the power supply node.

<Effect>

As described above, by sharing the charge between the connection node N13 and the connection node N52B, the potential of the connection node N13 can be adjusted. Also, the potential of the connection node N52B can be kept from falling below "VSS+|Vt111|". Therefore, the amplitude of the potential of the connection node N52B can be reduced, and thus the charge amount discharged from the connection node N52B can be reduced. Also, the time required to charge/discharge the connection node N52B can be shortened. In this way, high-speed operation and low power consumption can be attained.

Embodiment 12

<Configuration>

Figure 34:
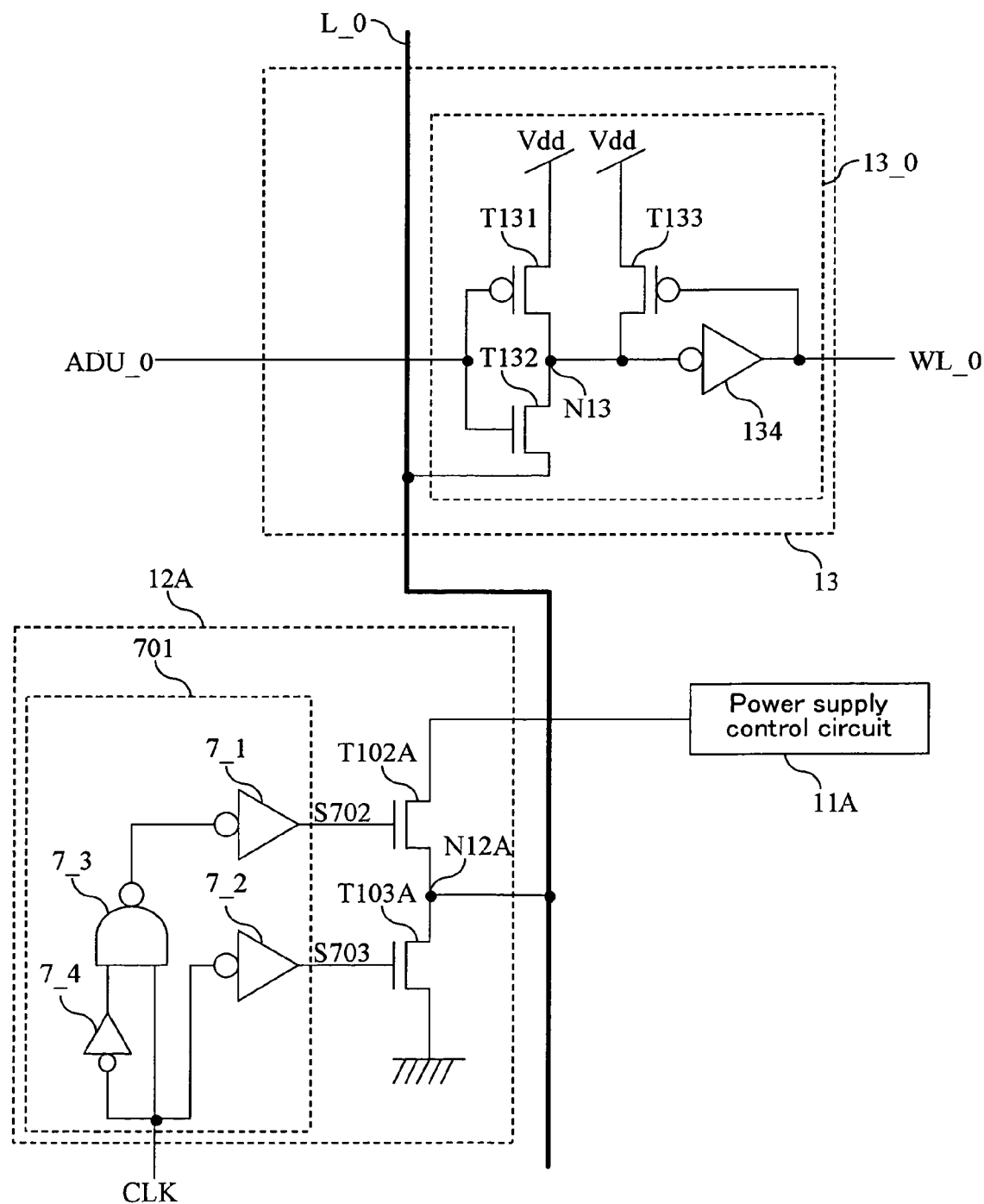
FIG. 34 is a circuit diagram of a decoder circuit of Embodiment 12 of the present invention.

FIG. 34 shows a configuration of a decoder circuit of Embodiment 12 of the present invention. This circuit is the same in configuration as the decoder circuit of FIG. 1 except for the internal configuration of the predecoder 12A. Note that only the decode section 13_0 connected to the line L_0 is shown in FIG. 34.

The predecoder 12A includes a timing control circuit 701 in place of the inverter 101 shown in FIG. 1. The timing control circuit 701 is composed of a plurality of logic elements (inverters 7_1 and 7_2, a NAND circuit 7_3 and a delay circuit 7_4 in the illustrated example). The transistor T102A receives the output of the inverter 7_1 (control signal S702) at its gate, and the transistor T103A receives the output of the inverter 7_2 (control signal S703) at its gate.

<Operation>

Figure 35:
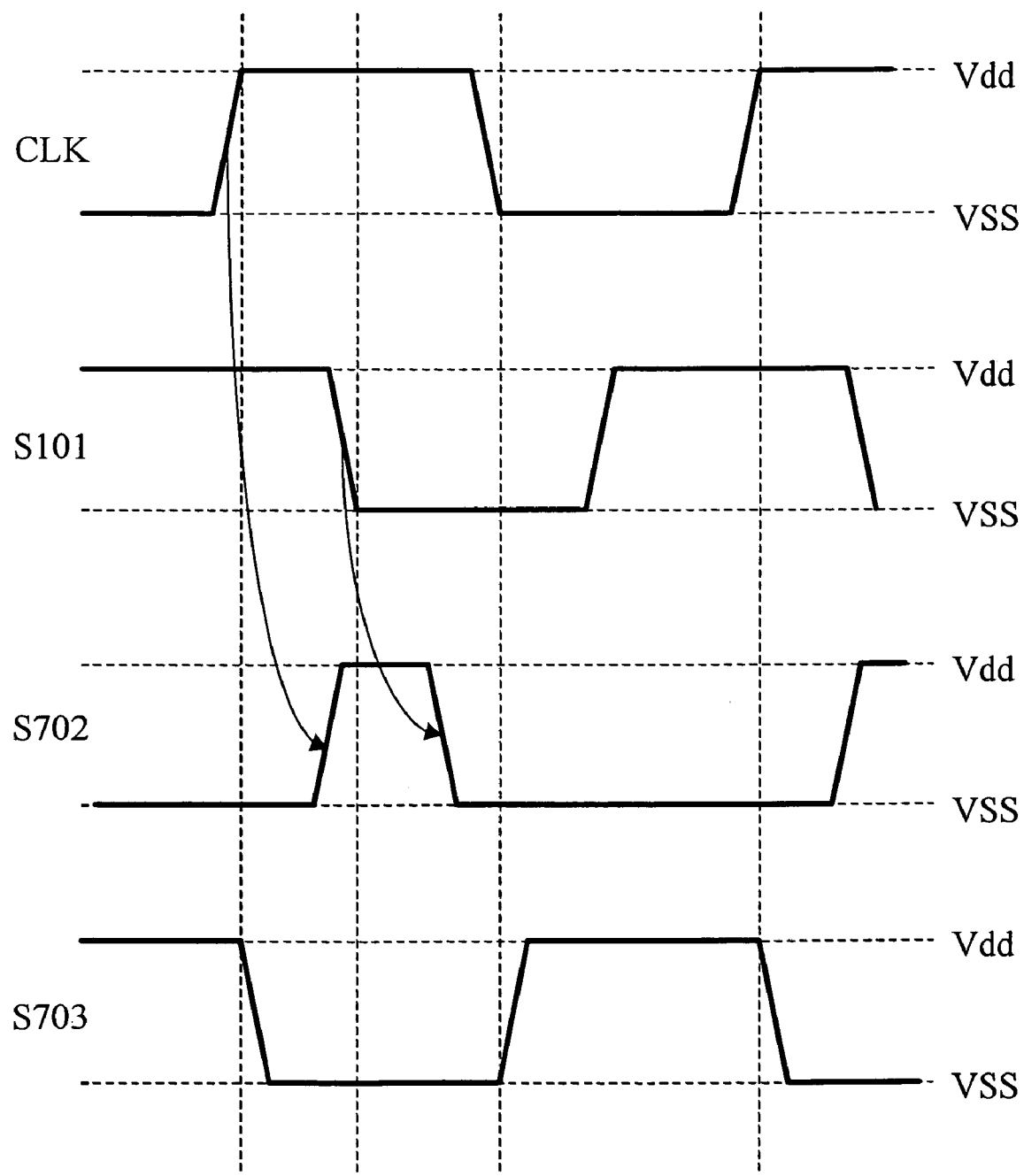
FIG. 35 is a timing chart for illustrating the operation of the decoder circuit of FIG. 34.

The operation of the decoder circuit of FIG. 34 will be described with reference to FIG. 35.

The timing control circuit 701 shifts the level of the control signal S702 from "L" to "H" after shifting the level of the control signal S703 from "H" to "L", and shifts the level of the control signal S703 from "L" to "H" after shifting the level of the control signal S702 from "H" to "L". Also, the timing control circuit 701 shifts the level of the control signal S703 from "L" to "H" after shifting the level of the control signal S702 from "H" to "L", and shifts the level of the control signal S702 from "L" to "H" after shifting the level of the control signal S703 from "H" to "L". In other words, the time period during which both the control signals S702 and S703 are in "L" level is provided.

To realize the timing described above, the delay amounts in the NAND circuit 7_3 and the inverter 7_4 may be adjusted.

<Effect>

As described above, by providing the time period during which both the transistors T102A and T103A are OFF, it is possible to prevent occurrence of a through current flowing from the power supply node to the ground node via the transistors T102A and T103A.

The above effect will also be obtainable by using the timing control circuit 701 shown in FIG. 34 in the other embodiments, to adjust ON/OFF of the transistors included in the predecoder.

Embodiment 13

<Configuration>

Figure 36:
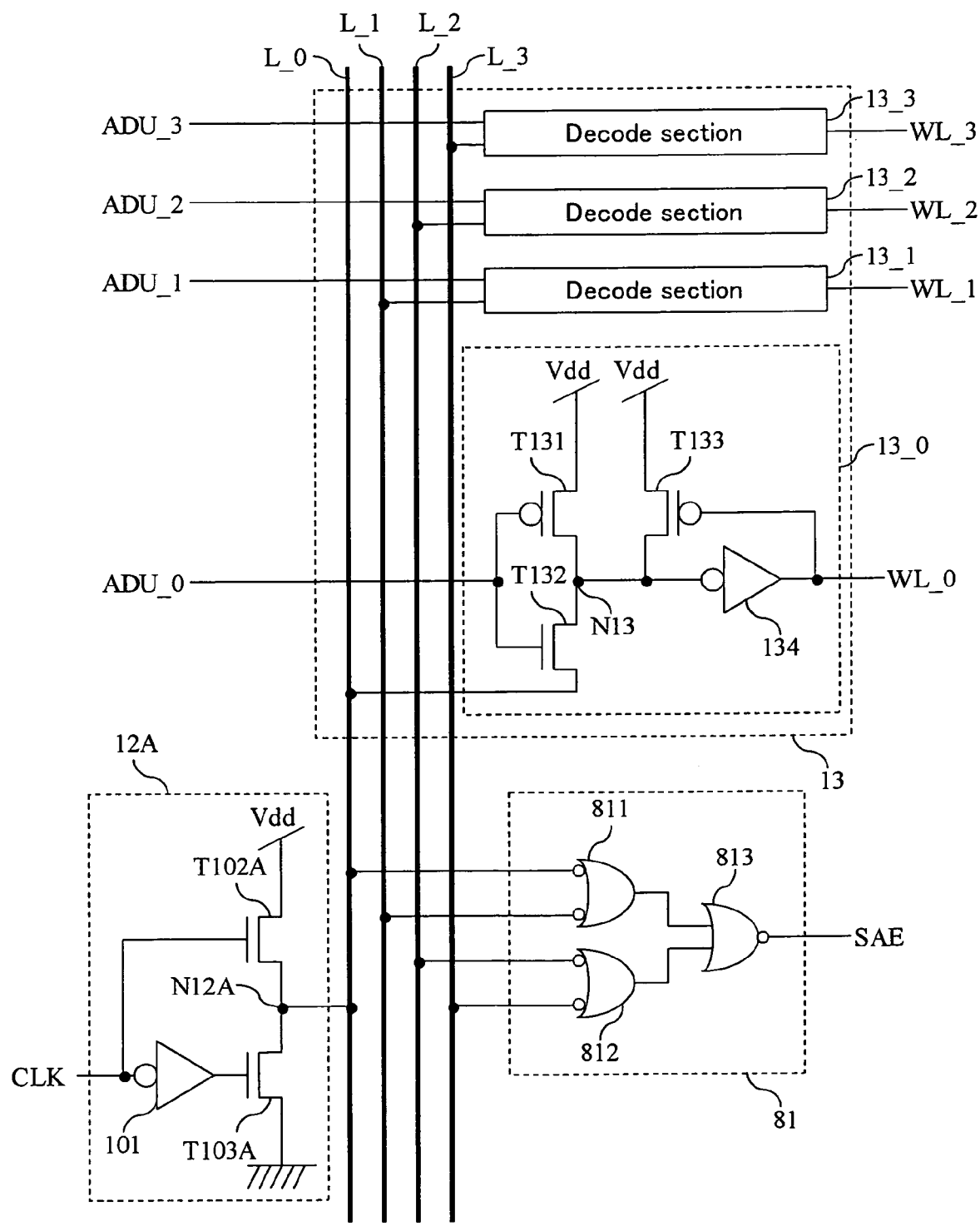
FIG. 36 is a circuit diagram showing a configuration of a decoder circuit of Embodiment 13 of the present invention.

FIG. 36 shows a configuration of a decoder circuit of Embodiment 13 of the present invention. This circuit includes a sense amp timing generation circuit 81 in addition to the components of the decoder circuit of FIG. 1. The sense amp timing generation circuit 81 includes NAND circuits 811 and 812 and a NOR circuit 813, and shifts the level of a timing signal SAE to "H" according to the potentials of the lines L_0, L_1, L_2 and L_3. The timing signal SAE is used for driving a sense amplifier (not shown).

<Operation>

Figure 37:
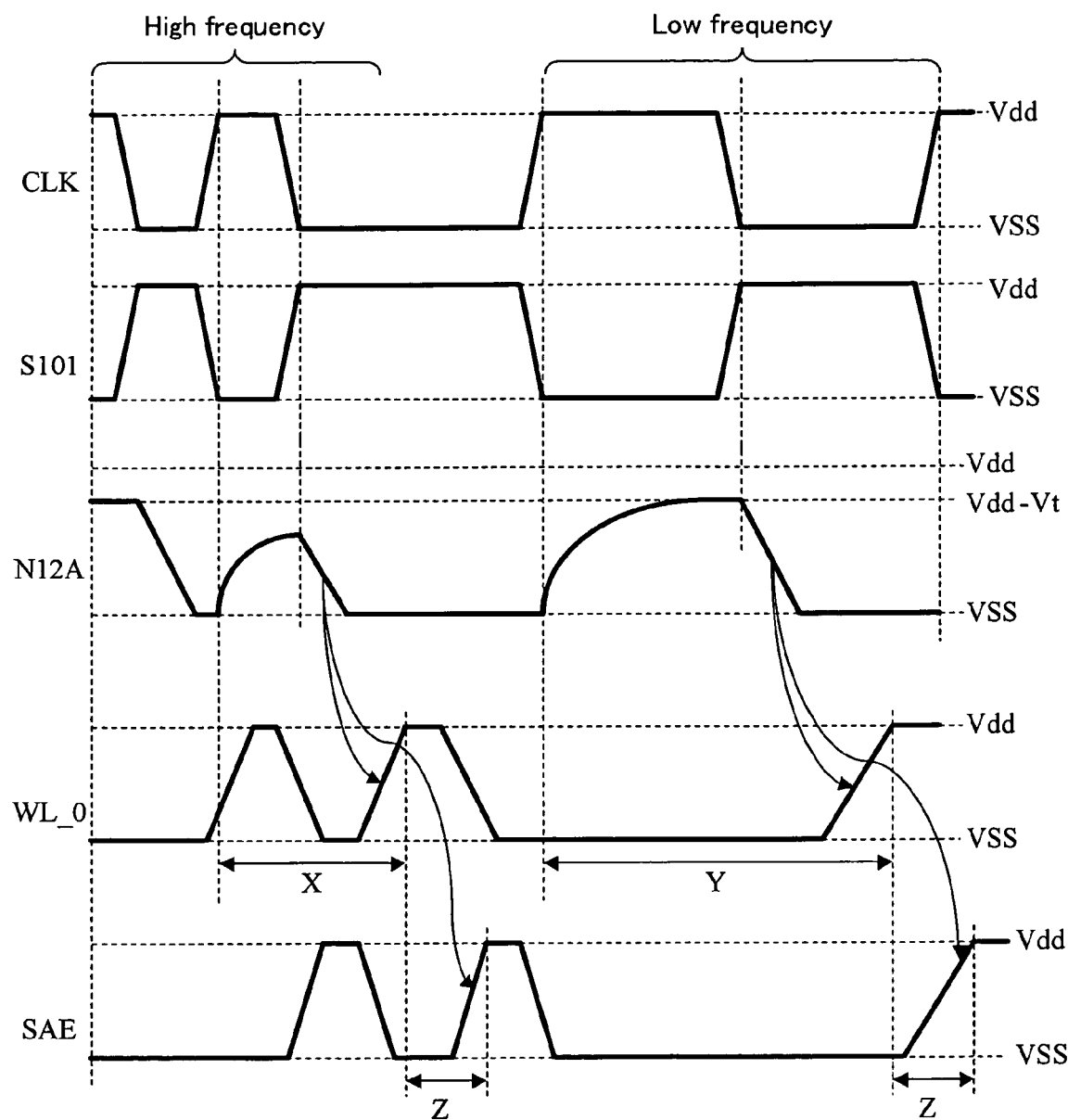
FIG. 37 is a timing chart for illustrating the operation of the decoder circuit of FIG. 36.

The operation of the decoder circuit of FIG. 36 will be described with reference to FIG. 37.

When the clock CLK is of high frequency, the charge amount stored in the connection node N12A is small, compared with the case when it is of low frequency. In high frequency, the time length from the time at which the clock CLK becomes "H" level until the time at which the drive voltage WL_0 becomes "H" level is short. On the contrary, when the clock CLK is of low frequency, the charge amount stored in the connection node N12A is large, compared with the case when it is of high frequency. In low frequency, the time length from the time at which the clock CLK becomes "H" level until the time at which the drive voltage WL_0 becomes "H" level is long.

Assuming that the time length from the time at which the clock CLK becomes "H" level until the time at which the drive voltage WL_0 becomes "H" level in the case of high-frequency clock and that in the case of low-frequency clock are denoted by "X" and "Y", respectively, the time Y is longer than the time X. In order for a sense amplifier to detect the drive voltage WL_0 normally, the sense amplifier must be driving at the time of rising of the drive voltage WL_0. However, since a general sense amplifier operates according to the clock CLK as the source signal, if the time length from the time at which the clock CLK becomes "H" level until the time at which the drive signal WL_0 becomes "H" level varies, the sense amplifier may fail to operate stably.

The sense amp timing generation circuit 81 shifts the timing signal SAE to "H" level once all of the lines L_0 to L_3 are in "H" level. The sense amplifier (not shown) starts driving once the timing signal SAE from the sense amp timing generation circuit 81 becomes "H" level. As shown in FIG. 37, the timing signal SAE becomes "H" level at fixed timing (time Z). Therefore, the sense amplifier (not shown) can detect the drive voltage WL_0 outputted from the row decoder 13 normally.

<Effect>

As described above, by generating the timing signal, the sense amplifier can be driven independent of the frequency, and thus stable operation can be ensured.

Although the sense amp timing generation circuit 81 was added to the decoder circuit of FIG. 1 in this embodiment, it is also applicable to the other embodiments.

Embodiment 14

<Configuration>

Figure 38:
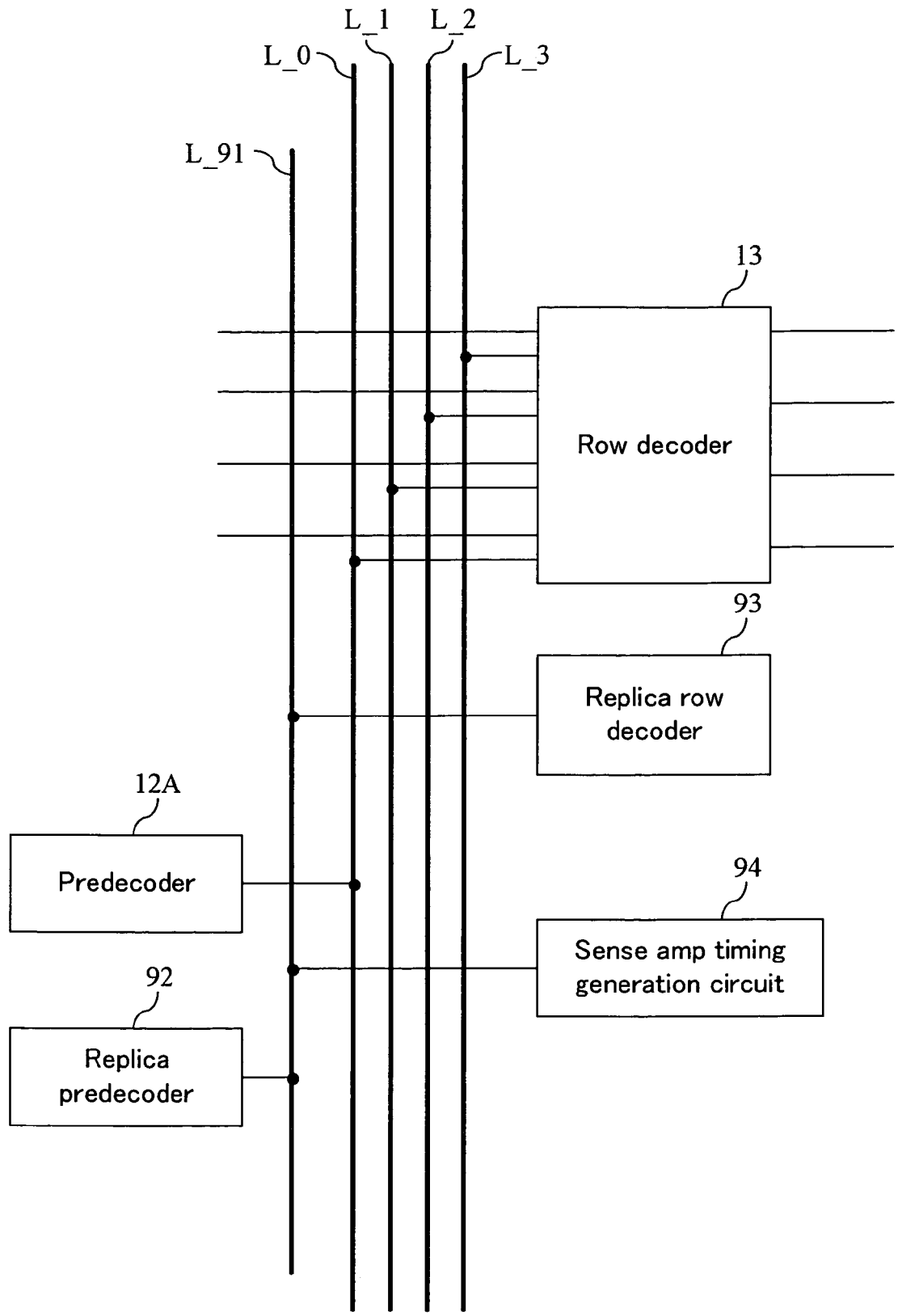
FIG. 38 is a circuit diagram of a decoder circuit of Embodiment 14 of the present invention.

FIG. 38 shows a configuration of a decoder circuit of Embodiment 14 of the present invention. This circuit includes a line L_91, a replica predecoder 92, a replica row decoder 93 and a sense amp timing generation circuit 94 in addition to the components of the decoder circuit of FIG. 1.

The replica predecoder 92 is the same in configuration as the predecoder 12A, and the replica row decoder 93 is the same in configuration as one decode section included in the row decoder 13 (the decoder section 13_0 in the illustrated example). The replica predecoder 92, the replica row decoder 93 and the sense amp timing generation circuit 94 are connected to the line L_91.

Figure 39:
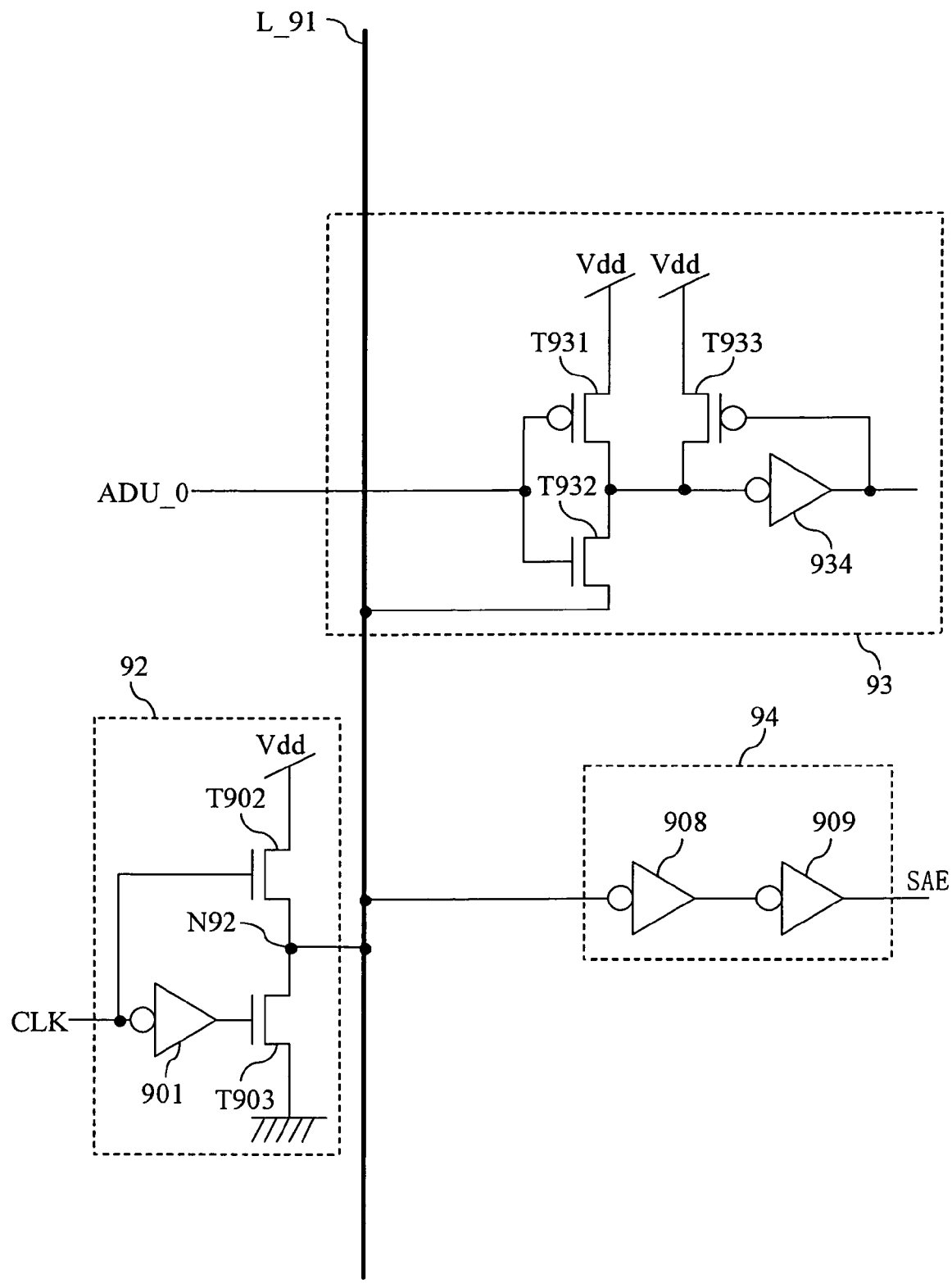
FIG. 39 is a circuit diagram showing configurations of a replica row decoder, a replica predecoder and a sense amp timing control circuit shown in FIG. 38.

FIG. 39 shows internal configurations of the replica predecoder 92, the replica row decoder 93 and the sense amp timing generation circuit 94 shown in FIG. 38.

The replica predecoder 92 includes an inverter 901 and transistors T902 and T903. The inverter 901 corresponds to the inverter 101 in FIG. 1. The transistor T902 corresponds to the transistor T102A in FIG. 1 and has substantially the same characteristics (threshold voltage, W/L ratio, current capability and the like, for example) as the transistor T102A. The transistor T903 corresponds to the transistor T103A in FIG. 1 and has substantially the same characteristics as the transistor T103A.

The replica row decoder 93 includes transistors T931, T932 and T933 and an inverter 934. The transistor T931 corresponds to the transistor T131 in FIG. 1 and has substantially the same characteristics as the transistor T131. The transistor T932 corresponds to the transistor T132 in FIG. 1 and has substantially the same characteristics as the transistor T132. The transistor T933 and the inverter 934 respectively correspond to the transistor T133 and the inverter 134 in FIG. 1 and have substantially the same characteristics as the transistor T133 and the inverter 134.

The sense amp timing generation circuit 94 includes delay circuits 908 and 909, and outputs the timing signal SAE according to a variation of the potential of a connection node N92.

<Effect>

As described above, by separately providing a configuration for generating timing for driving a sense amplifier, occurrence of signal delay with a logic element can be prevented, and thus the sense amplifier can be operated swiftly.

To provide a replica predecoder for any other embodiment (for example, for Embodiment 2 (FIG. 3)), the replica predecoder 92 may be made to have substantially the same internal configuration as the predecoder in the embodiment (for example, the predecoder 22A in FIG. 3). To apply the replica row decoder 93 to Embodiments 7 to 11, the replica row decoder 93 may be made to have substantially the same internal configuration as the row decoder 13 shown in FIG. 19.

Figure 40:
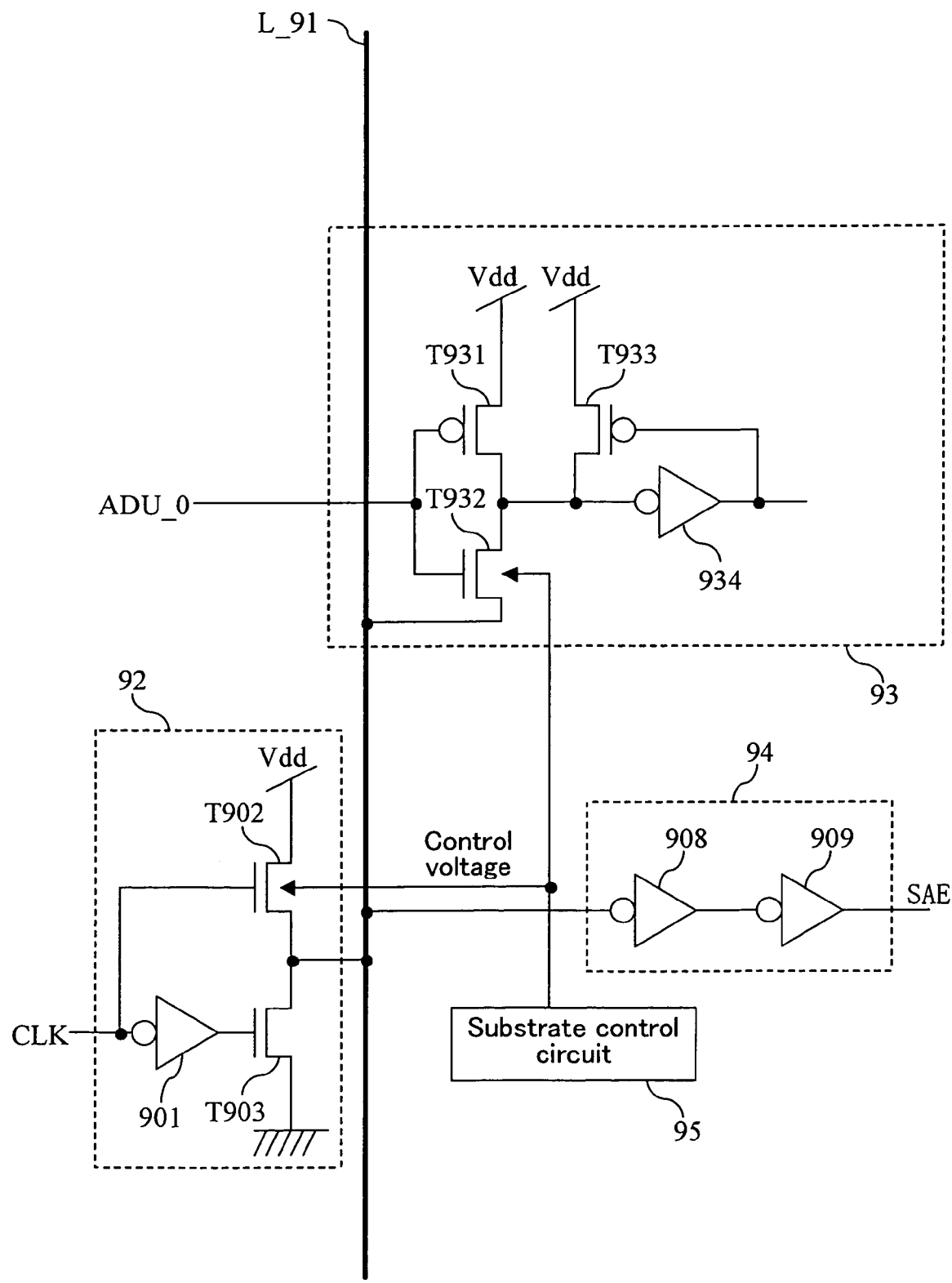
FIG. 40 is a circuit diagram showing an alteration to the decoder circuit of FIG. 38.

As shown in FIG. 40, the decoder circuit may further be provided with a substrate control circuit 95 that outputs a substrate voltage. The transistor T902 of the replica predecoder 92 and the transistor T932 of the replica row decoder 93 receive the control voltage from the substrate control circuit 95 at the substrate. If the substrate control circuit 95 outputs a control voltage having a value equal to the lower limit of a variation of the threshold voltages of the transistors T902 and T932, the threshold voltages of the transistors T902 and T932 can be reduced. It is therefore possible to replicate the high-speed charging with the predecoder and the increase of the charge amount to the line L_0 from the row decoder. Thus, stable operation against a variation in threshold voltage can be ensured.

(Structure of Transistor)

Figure 41:
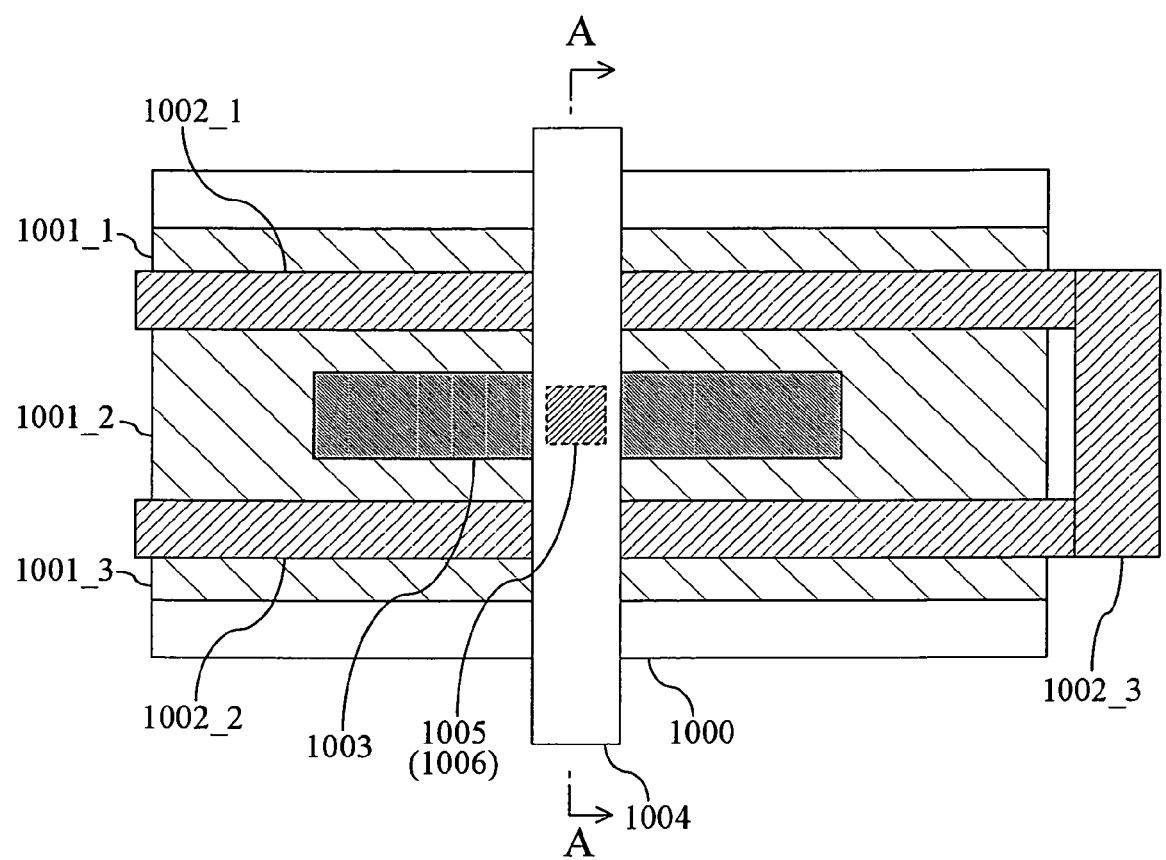
FIG. 41 is a top view of a transistor in the embodiments of the present invention.
Figure 42:
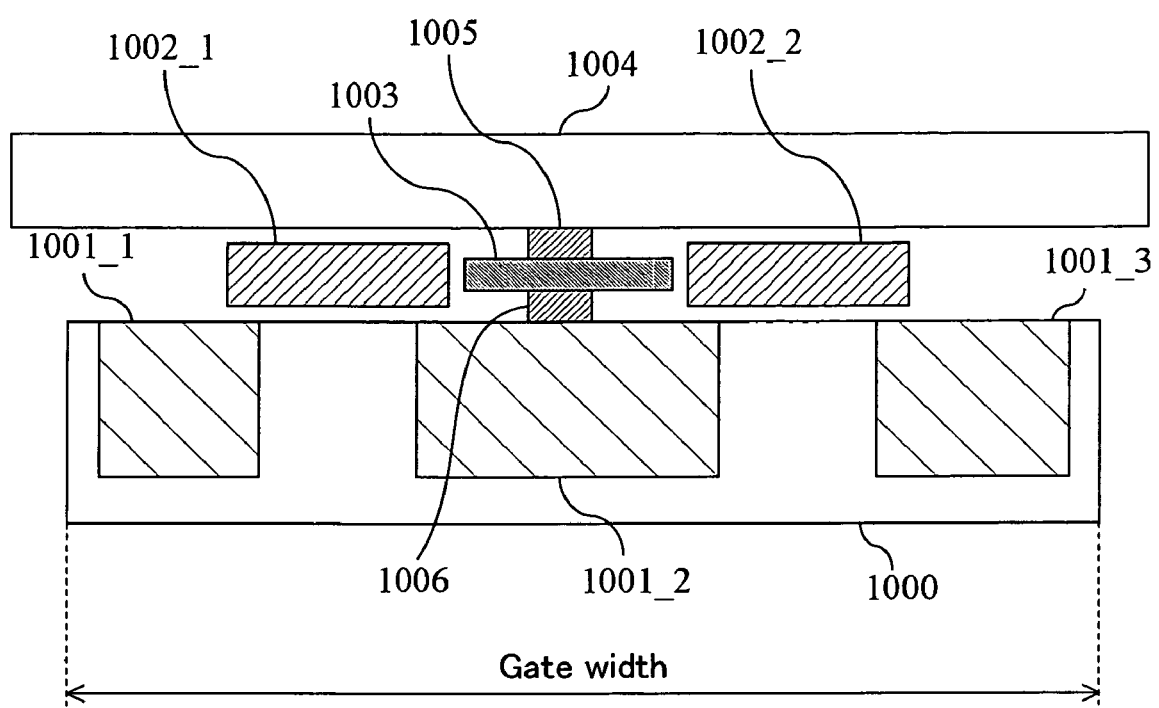
FIG. 42 is a cross-sectional view of the transistor in the embodiments of the present invention.

An exemplary structure of the transistor T132 in the embodiments described above will be described with reference to FIGS. 41 and 42. FIGS. 41 and 42 are respectively a top view and a cross-sectional view of the transistor T132. The transistor T132 includes a semiconductor substrate 1000, diffusion layers 10001_1, 1001_2 and 1001_3, gate electrodes 1002_1 and 1002_2, a first-layer line 1003, a second-layer line 1004, a first-second interlayer via 1005 and a CA 1006. The diffusion layers 10001_1, 1001_2 and 1001_3 are formed in the semiconductor substrate 1000. The gate electrode 1002_1 is formed above the semiconductor substrate 1000 so as to overlap the diffusion layers 1001_1 and 1001_2 at both ends in the width direction. The gate electrode 1002_2 is formed above the semiconductor substrate 1000 so as to overlap the diffusion layers 1001_2 and 1001_3 at both ends in the width direction. The first-layer line 1003 is formed above the diffusion layer 1001_2. The second-layer line 1004 is formed above the first-layer line 1003 and the gate electrodes 1002_1 and 1002_2. The first-second interlayer via 1005 electrically connects the first-layer line 1003 with the second-layer line 1004. The CA 1006 electrically connects the diffusion layer 1001_2 with the first-layer line 1003. The gate electrodes 1002_1 and 1002_2 are connected with each other via a gate electrode connector 1002_3. In FIG. 41, the gate electrodes 1002_1 and 1002_2 and the gate electrode connector 1002_3 are integrated to form a U-shaped gate electrode.

The diffusion layers 1001_1, 1001_2 and 1001_3 are formed in the semiconductor substrate 1000 so as to extend in parallel with one another. The gate electrode 1002_1 extends along the diffusion layers 1001_1 and 1001_2, and the gate electrode 1002_2 extends along the diffusion layers 1001_2 and 1001_3. The first-layer line 1003 is located between the gate electrodes 1002_1 and 1002_2.

The length of the first-layer line 1003 is somewhere between "(gate width×0.1)/number of gate electrodes divided" and "(gate width×1.0)/number of gate electrodes divided".

By adopting such a structure, the diffusion capacitance can be halved, and also the line capacitance can be reduced. This permits high-speed operation.

The structure described above can also be adopted for the transistors other than the transistor T132.

<Threshold Voltage of Transistor T132>

The threshold voltage of the transistor T132 in the embodiments described above will be discussed. For example, in FIG. 1 (Embodiment 1), if the threshold voltage of the transistor T132 is extremely small compared with the threshold voltage of the transistor T102A, the connection node N12A will be easily charged via the transistor T102A. However, a glitch may easily occur in the transistor T132. This may possibly cause erroneous operation such as multiple selections in a circuit receiving the drive voltage WL_0. To avoid such a problem, the threshold voltage of the transistor T132 may be made higher than the threshold voltage of the transistor T102A, to suppress occurrence of a glitch in the transistor T132. In the other embodiments, also, substantially the same effect can be obtained by setting a high threshold voltage for the transistor T132.

Although the predecoder was connected to the line L_0 in the embodiments described above, one predecoder may also be connected to each of the other lines L_1, L_2 and L_3. In this case, also, substantially the same effect can be obtained for each line. Also, two or more row decoders may be provided. In this case, also, substantially the same effect can be obtained as long as each decode section is connected to its corresponding line in each of the row decoders.

As described above, the decoder circuit of the present invention can ensure stable operation while securing high-speed operation and low power consumption, and thus is useful as a decoder circuit for driving word lines, a decoder circuit having an enable function, and the like.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A decoder circuit comprising:
   first and second transistors connected in series between a first reference node and a second reference node; and
   third and fourth transistors connected in series between a connection node between the first and second transistors and the second reference node,
   wherein the first transistor is connected between the second reference node and the second transistor and receives a first signal at its gate,
   the second transistor is connected between the first transistor and the first reference node and receives a second signal corresponding to the first signal at its gate,
   the third transistor is connected between the second reference node and the fourth transistor and receives a third signal at its gate,
   the fourth transistor is connected between the third transistor and the connection node and receives a fourth signal corresponding to the third signal at its gate, and
   the first, second and fourth transistors are of the same conductivity type, and
   wherein the first transistor is composed of a plurality of transistors connected in series between the second reference node and the second transistor, and
   the plurality of transistors receive the first signal at their gates.

2. A decoder circuit comprising:
   first and second transistors connected in series between a first reference node and a second reference node;
   third and fourth transistors connected in series between a connection node between the first and second transistors and the second reference node; and
   a substrate control circuit for outputting a reverse bias voltage,
   wherein the first transistor is connected between the second reference node and the second transistor and receives a first signal at its gate,
   the second transistor is connected between the first transistor and the first reference node and receives a second signal corresponding to the first signal at its gate,
   the third transistor is connected between the second reference node and the fourth transistor and receives a third signal at its gate,
   the fourth transistor is connected between the third transistor and the connection node and receives a fourth signal corresponding to the third signal at its gate, and
   the first, second and fourth transistors are of the same conductivity type, and
   wherein the first transistor receives the reverse bias voltage from the substrate control circuit at the substrate.

3. The decoder circuit of claim 2, wherein the substrate control circuit outputs either one of a forward bias voltage and a reverse bias voltage according to the signal level of the first signal, and
   the first and fourth transistors receive the output of the substrate control circuit at the substrate.

4. A decoder circuit comprising:
   first and second transistors connected in series between a first reference node and a second reference node; and
   third and fourth transistors connected between a connection node between the first and second transistors and the second reference node,
   wherein the first transistor is connected between the second reference node and the second transistor and receives a first signal at its gate,
   the second transistor is connected between the first transistor and the first reference node and receives a second signal corresponding to the first signal at its gate,
   the third transistor is connected between the second reference node and the fourth transistor and receives a third signal at its gate,
   the fourth transistor is connected between the third transistor and the connection node and receives a fourth signal corresponding to the third signal at its gate, and
   after being turned ON, the first transistor is turned OFF before the potential of the connection node reaches the potential of the second reference node, and
   wherein the fourth transistor comprises:
   first, second and third diffusion layers formed in a semiconductor substrate and extending in parallel with one another with a predetermined space therebetween;
   a first gate electrode formed above the semiconductor substrate and extending along the first and second diffusion layers;
   a second gate electrode formed above the semiconductor substrate and extending along the second and third diffusion layers;
   a first-layer line formed above the second diffusion layer, located between the first and second gate electrodes, and extending along the second diffusion layer; and
   a second-layer line formed above the first and second gate electrodes and the first-layer line, electrically connected with the first-layer line, and not electrically connected with the first and second gate electrodes.

5. A decoder circuit comprising:
   first and second transistors connected in series between a first reference node and a second reference node; and
   third and fourth transistors connected in series between a connection node between the first and second transistors and the second reference node,
   wherein the first transistor is connected between the second reference node and the second transistor and receives a first signal at its gate,
   the second transistor is connected between the first transistor and the first reference node and receives a second signal corresponding to the first signal at its gate,
   the third transistor is connected between the second reference node and the fourth transistor and receives a third signal at its gate,
   the fourth transistor is connected between the third transistor and the connection node and receives a fourth signal corresponding to the third signal at its gate,
   the first, second, and fourth transistors are of the same conductivity type, and
   the first and second transistors are directly connected to each other.

* * * * *